US010175578B2

(12) United States Patent
Inoue et al.

(10) Patent No.: US 10,175,578 B2
(45) Date of Patent: Jan. 8, 2019

(54) PATTERN FORMING METHOD, COMPOSITION FOR FORMING PROTECTIVE FILM, METHOD FOR MANUFACTURING ELECTRONIC DEVICE, AND ELECTRONIC DEVICE

(71) Applicant: FUJIFILM Corporation, Tokyo (JP)

(72) Inventors: Naoki Inoue, Haibara-gun (JP); Naohiro Tango, Haibara-gun (JP); Kei Yamamoto, Haibara-gun (JP); Michihiro Shirakawa, Haibara-gun (JP); Akiyoshi Goto, Haibara-gun (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/446,695

(22) Filed: Mar. 1, 2017

(65) Prior Publication Data
US 2017/0176862 A1 Jun. 22, 2017

Related U.S. Application Data

(63) Continuation of application No. PCT/JP2015/076189, filed on Sep. 15, 2015.

(30) Foreign Application Priority Data

Sep. 30, 2014 (JP) .................. 2014-202362

(51) Int. Cl.
G03F 7/11 (2006.01)
G03F 7/038 (2006.01)
G03F 7/039 (2006.01)
C09D 133/08 (2006.01)
G03F 7/09 (2006.01)
G03F 7/16 (2006.01)
G03F 7/20 (2006.01)
G03F 7/32 (2006.01)
G03F 7/38 (2006.01)
G03F 7/40 (2006.01)
C08F 2/48 (2006.01)
C08F 220/18 (2006.01)
C09D 133/10 (2006.01)

(52) U.S. Cl.
CPC .................. G03F 7/11 (2013.01); C08F 2/48 (2013.01); C08F 220/18 (2013.01); C09D 133/08 (2013.01); C09D 133/10 (2013.01); G03F 7/038 (2013.01); G03F 7/039 (2013.01); G03F 7/0397 (2013.01); G03F 7/091 (2013.01); G03F 7/16 (2013.01); G03F 7/168 (2013.01); G03F 7/2041 (2013.01); G03F 7/325 (2013.01); G03F 7/327 (2013.01); G03F 7/38 (2013.01); G03F 7/40 (2013.01)

(58) Field of Classification Search
CPC ... G03F 7/004; G03F 7/11; G03F 7/26; G03F 7/38; G03F 7/40; H01L 21/0274; H01L 21/3114; H01L 21/02112
USPC .... 430/271.1, 434, 435, 322, 325, 329, 330, 430/331; 438/699
See application file for complete search history.

(56) References Cited

U.S. PATENT DOCUMENTS

| 2009/0042147 A1 | 2/2009 | Tsubaki | |
| 2013/0089820 A1* | 4/2013 | Hatakeyama | G03F 7/0045 430/296 |
| 2013/0189620 A1 | 7/2013 | Suka et al. | |
| 2014/0080064 A1* | 3/2014 | Hatakeyama | G03F 7/11 430/296 |
| 2014/0113223 A1 | 4/2014 | Kato et al. | |
| 2014/0227637 A1 | 8/2014 | Kato et al. | |
| 2014/0234761 A1 | 8/2014 | Shirakawa et al. | |
| 2015/0030983 A1* | 1/2015 | Hatakeyama | C08F 212/14 430/287.1 |
| 2015/0338943 A1* | 11/2015 | Donnelly | G06F 3/041 345/173 |
| 2016/0349619 A1 | 12/2016 | Tsubaki | |

FOREIGN PATENT DOCUMENTS

| JP | 2005-109146 A | | 4/2005 |
| JP | 2008111102 A | * | 5/2008 |
| JP | 2008-292975 A | | 12/2008 |
| JP | 2008-309878 A | | 12/2008 |
| JP | 2011-141494 A | | 7/2011 |
| JP | 2013-033227 A | | 2/2013 |

(Continued)

OTHER PUBLICATIONS

Machine translation of JP 2014-056194 (no date).*
Machine translation of JP 2008-111102 (no date).*
International Search Report for PCT/JP2015/076189 dated Dec. 22, 2015.
Foreign Written Opinion for PCT/JP2015/076189 dated Dec. 22, 2015.
Communication dated Jan. 9, 2018 from the Korean Intellectual Property Office in counterpart Application No. 10-2017-7005993.

(Continued)

Primary Examiner — Amanda C. Walke
(74) Attorney, Agent, or Firm — Sughrue Mion, PLLC

(57) ABSTRACT

A pattern forming method includes coating an actinic ray-sensitive or radiation-sensitive resin composition onto a substrate to form an actinic ray-sensitive or radiation-sensitive film, coating a composition for forming a protective film onto the actinic ray-sensitive or radiation-sensitive film to form a protective film, exposing the actinic ray-sensitive or radiation-sensitive film covered with the protective film, and developing the exposed actinic ray-sensitive or radiation-sensitive film using a developer containing an organic solvent, in which the protective film contains a compound (A) including at least one group or bond selected from the group consisting of an ether bond, a thioether bond, a hydroxyl group, a thiol group, a carbonyl bond, and an ester bond, and a resin (X).

15 Claims, No Drawings

(56) References Cited

FOREIGN PATENT DOCUMENTS

| | | |
|---|---|---|
| JP | 2013-061647 A | 4/2013 |
| JP | 2013-061648 A | 4/2013 |
| JP | 2013-073124 A | 4/2013 |
| JP | 2013-097002 A | 5/2013 |
| JP | 2013-097003 A | 5/2013 |
| JP | 2013-151592 A | 8/2013 |
| JP | 2014-056194 A | 3/2014 |
| JP | 2014-167614 A | 9/2014 |
| KR | 10-2014-0096039 A | 8/2014 |
| WO | 2004/068242 A1 | 8/2004 |
| WO | 2004/074937 A1 | 9/2004 |
| WO | 2005/019937 A1 | 3/2005 |

OTHER PUBLICATIONS

International Preliminary Report on Patentability and Written Opinion, dated Apr. 4, 2017, in corresponding International Application No. PCT/JP2015/076189, 17 pages in English and Japanese.
Office Action dated Jun. 26, 2018, issued by the Japan Patent Office in corresponding Japanese Application No. 2016-551900.
Office Action dated Jul. 18, 2018 from the Korean Intellectual Property Office in counterpart Korean Application No. 10-2017-7005993.
Communication dated Feb. 20, 2018 from the Japanese Patent Office in counterpart Application No. 2016-551900.

* cited by examiner

PATTERN FORMING METHOD, COMPOSITION FOR FORMING PROTECTIVE FILM, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/76189, filed on Sep. 15, 2015, which claims priority under 35 U.S.C. § 119(a) to Japanese Patent Application No. 2014-202362, filed on Sep. 30, 2014. Each of the above application(s) is hereby expressly incorporated by reference, in its entirety, into the present application.

BACKGROUND OF THE INVENTION

1. Field of the Invention

The present invention relates to a pattern forming method which is used for a process for manufacturing a semiconductor such as an integrated circuit (IC), the manufacture of a circuit board for a liquid crystal, a thermal head, or the like, and other lithographic processes for photofabrication, as well as a composition for forming a protective film which is suitably used in the pattern forming method, a method for manufacturing an electronic device, and an electronic device. The present invention relates to a pattern forming method which is suitable for, in particular, performing exposure with a liquid immersion type projection exposure device, as well as a composition for forming a protective film which is used for the pattern forming method, a method for manufacturing an electronic device, and an electronic device.

2. Description of the Related Art

Since a resist for a KrF excimer laser (248 nm) was developed, an image forming referred to as chemical amplification as an image forming method of a resist has been used in order to compensate for desensitization caused by light absorption. By using an example of an image forming method with positive type chemical amplification, the method is an image forming method in which an acid generator included in an exposed area decomposes upon exposure to generate an acid; in a post exposure bake (PEB), an alkali-insoluble group is changed into an alkali-soluble group by using the generated acid as a reaction catalyst; and the exposed area is removed by alkali development.

On the other hand, not only a positive tone has been developed, but also a negative tone image forming method (hereinafter also referred to as a "NTI process" (also referred to as a negative tone imaging: NTI)) using a developer including an organic solvent (hereinafter also referred to as a "organic solvent developer") has recently been developed (see, for example, JP2008-292975A and JP2011-141494A). For example, in JP2011-141494A, taking into consideration a demand for further improvement of line width roughness (LWR), depth of focus (DOF), and other various types of performance, each of which is presumed to be mainly caused by swelling during development, in pattern formation by alkali development using a negative type resist composition in the related art, a chemical amplification type resist composition, to which a specific compound including at least one of a fluorine atom or a silicon atom has been added, in a negative tone pattern forming method using a developer including an organic solvent.

Moreover, in order to make semiconductor elements finer, the wavelength of an exposure light source has been shortened and a projection lens with a high numerical aperture (high NA) has been advanced. Thus, an exposure machine using an ArF excimer laser having a wavelength of 193 nm as a light source has been currently developed. In addition, as a technique for further improving resolving power, a so-called liquid immersion method in which a liquid having a high refractive index (hereinafter also referred to as an "immersion liquid") is filled between a projection lens and a sample has been proposed from the related art.

It is pointed out that in a case where a chemical amplification resist is applied to liquid immersion exposure, a resist layer is brought into contact with an immersion liquid during exposure, and therefore, the resist layer is modified or components adversely affecting the immersion liquid are exudated from the resist layer. In WO04-068242A, an example in which resist performance changes by immersing a resist for ArF exposure in water before and after the exposure is described, and points out the example as a problem in liquid immersion exposure.

As a solution for avoiding such a problem, a method in which a protective film (hereinafter also referred to as a "topcoat") is provided between a resist and a lens to prevent the resist and water from being into direct contact with each other (see, for example, WO04-074937A, WO05-019937A, and JP2005-109146A).

In an NTI process in which excessive generation of an acid in the resist surface layer by the decomposition of an acid generator upon exposure causes an excessive deprotection reaction of an acid-decomposable group in the surface layer occurs, and thus, an exposed area remains as a pattern after development, the pattern is easily in a T-top shape. In a case where the pattern is in the T-top shape, for example, then performance such as depth of focus (DOF) and exposure latitude (EL) is deteriorated. As a result, for example, JP2013-61647A and JP2013-61648A disclose a technique in which a basic quencher is added to a topcoat layer that covers a resist film for the purpose of neutralizing an excessive acid generated in the resist surface.

SUMMARY OF THE INVENTION

As a result of extensive studies conducted by the present inventors, in a case of adding a basic quencher to a topcoat layer, an acid that is excessively generated is transported from the resist surface layer to the topcoat layer, while the basic quencher is transported from the topcoat layer to the resist layer. As a result, it could be seen that a film of the pattern is reduced, and thus, line edge roughness (LER) is deteriorated in some cases. This is a serious problem in an NTI process in which an exposed area remains as a pattern after development.

The present invention has an object to provide a pattern forming method capable of forming a pattern having excellent depth of focus (DOF) and exposure latitude (EL), and suppressed line width roughness (LWR) in an NTI process, that is, a negative type image forming process using an organic solvent developer, and a composition for forming a protective film, which is suitably used in the pattern forming method. The present invention has another object to provide a method for manufacturing an electronic device, including the pattern forming method, and an electronic device manufactured by the method for manufacturing an electronic device.

In one embodiment, the present invention is as follows.

[1] A pattern forming method comprising:
(a) coating an actinic ray-sensitive or radiation-sensitive resin composition onto a substrate to form an actinic ray-sensitive or radiation-sensitive film;
(b) coating a composition for forming a protective film onto the actinic ray-sensitive or radiation-sensitive film to form a protective film;
(c) exposing the actinic ray-sensitive or radiation-sensitive film covered with the protective film; and
(d) developing the exposed actinic ray-sensitive or radiation-sensitive film using a developer containing an organic solvent,
in which the protective film contains a compound (A) including at least one group or bond selected from the group consisting of an ether bond, a thioether bond, a hydroxyl group, a thiol group, a carbonyl bond, and an ester bond, and a resin (X), provided that the compound (A) is not any one of a chained amide, a cyclic amide, an aromatic amine, a chained aliphatic amine, and a cyclic aliphatic amine.

[2] The pattern forming method as described in [1], in which the molecular weight of the compound (A) is 3,000 or less.

[3] The pattern forming method as described in [1] or [2], in which the compound (A) contains 8 or more carbon atoms.

[4] The pattern forming method as described in any one of [1] to [3], in which the content of the compound (A) with respect to the total solid content in the protective film is 0.1% to 30% by mass.

[5] The pattern forming method as described in any one of [1] to [4], in which the film thickness of the protective film is 10 to 300 nm.

[6] The pattern forming method as described in any one of [1] to [5], in which the compound (A) is a compound having at least one ether bond.

[7] The pattern forming method as described in [6], in which the compound (A) is a compound having a structure represented by the following General Formula (1),

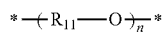

(1)

in the formula
$R_{11}$ represents an alkylene group which may have a substituent,
n represents an integer of 2 or more, and
* represents a direct bond.

[8] The pattern forming method as described in any one of [1] to [7], in which the resin (X) has a content of fluorine atoms of 20% by mass or less.

[9] The pattern forming method as described in any one of [1] to [8], further comprising heating the substrate covered with the actinic ray-sensitive or radiation-sensitive film and the protective film at 100° C. or higher after (b) forming a protective film and before (c) exposing the film.

[10] A composition for forming a protective film, used for forming a protective film that covers an actinic ray-sensitive or radiation-sensitive film, which comprises a compound (A) having a structure represented by the following General Formula (1), and a resin (X), provided that the compound (A) is not any one of a chained amide, a cyclic amide, an aromatic amine, a chained aliphatic amine, and a cyclic aliphatic amine,

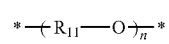

(1)

in the formula,
$R_{11}$ represents an alkylene group which may have a substituent,
n represents an integer of 2 or more, and
* represents a direct bond.

[11] A method for manufacturing an electronic device, comprising the pattern forming method as described in any one of [1] to [9].

[12] An electronic device manufactured by the method for manufacturing an electronic device as described in [11].

According to the present invention, it is possible to provide a pattern forming method capable of forming a pattern having excellent depth of focus (DOF) and exposure latitude (EL), and suppressed line edge roughness (LER), and a composition for forming a protective film, which is suitably used in the pattern forming method. Further, according to the present invention, it is possible to provide a method for manufacturing an electronic device, including the pattern forming method, and an electronic device manufactured by the method for manufacturing an electronic device.

DESCRIPTION OF THE PREFERRED EMBODIMENTS

Hereinafter, specific embodiments of the present invention will be described.

In citations for a group (atomic group) in the present specification, a citation of the group (atomic group) that is denoted without specifying whether it is substituted or unsubstituted means that the group (atomic group) includes both a group (atomic group) not having a substituent and a group (atomic group) having a substituent. For example, an "alkyl group" includes not only an alkyl group not having a substituent (unsubstituted alkyl group), but also an alkyl group having a substituent (substituted alkyl group).

"Actinic ray" or "radiation" in the present specification means, for example, a bright line spectrum of a mercury lamp, far ultraviolet rays represented by an excimer laser, extreme ultraviolet rays (EUV light), X-rays, electron beams (EB), or the like. In addition, in the present invention, light means actinic ray or radiation.

Furthermore, unless otherwise specified, "exposure" in the present specification includes not only exposure by a mercury lamp, far ultraviolet rays represented by an excimer laser, extreme ultraviolet rays (EUV light), X-rays, or the like, but also writing by particle rays such as electron beams and ion beams.

Hereinafter, the pattern forming method of the present invention, as well as a composition for forming a protective film which is suitably used in the pattern forming method, and an actinic ray-sensitive or radiation-sensitive resin composition will be described in detail.

<Composition for Forming Protective Film>

The pattern forming method of the present invention includes a protective film forming step in which a protective film is formed as in covering the actinic ray-sensitive or radiation-sensitive film in an NTI process that forms a negative tone image using an organic solvent developer. The composition for forming a protective film, used for formation of the protective film, contains a compound (A) and a resin (X) which will be described later. Further, it is preferable that this composition for forming a protective film contains a solvent in order to form a film uniformly on the actinic ray-sensitive or radiation-sensitive film. In addition, the composition for forming a protective film may further contain a surfactant.

[Compound (A)]

The compound (A) is a compound including at least one group or bond selected from the group consisting of an ether bond, a thioether bond, a hydroxyl group, a thiol group, a carbonyl bond, and an ester bond, provided that the compound (A) is not any one of a chained amide, a cyclic amide, an aromatic amine, a chained aliphatic amine, and a cyclic aliphatic amine.

As described above, a technique in which a pattern shape is suppressed from becoming a T-top and DOF or EL performance is suppressed from being deteriorated by neutralizing an acid excessively generated in a resist surface layer upon exposure with a basic quencher which has been added to a topcoat layer (see JP2013-61647A and JP2013-61648A).

However, as a result of extensive studies conducted by the present inventors, the following problems have been found. That is, an acid transported from the resist surface layer to the topcoat layer is neutralized by quenching, while the basic quencher is transported from the topcoat layer to the resist layer, and the acid in the resist exposed area is also quenched and neutralized. As a result, it was found that the film amount of the pattern is reduced, and thus, the LER is deteriorated.

As a result of further extensive studies conducted by the present inventors, it was found that it is possible to form a pattern with reduced LER while suppressing the pattern shape from becoming a T-top shape, improving DOF and EL performance, and suppressing the film amount by changing the basic quencher and adding a compound (A) including at least one group or bond selected from an ether bond, a thioether bond, a hydroxyl group, a thiol group, a carbonyl bond, and an ester bond to a topcoat layer.

Since the compound (A) is not any one of a chained amide, a cyclic amide, an aromatic amine, a chained aliphatic amine, and a cyclic aliphatic amine, and is not basic, it is not true that the acid excessively generated is suppressed by quenching the acid for neutralization as done by a basic quencher. The reason why the DOF and EL performance is improved by the addition of the compound (A), while occurrence of film reduction is suppressed and the LER is reduced is not necessarily clear, but is presumed to be as follows. That is, the ether bond, the thioether bond, the hydroxyl group, the thiol group, or the ketone bond contained in the compound (A) can trap an acid by the interaction with the acid while not causing neutralization, and can suppress the movement of the acid. As a result, the compound (A) traps the excessive acid transported from the resist surface layer to the topcoat layer in the topcoat layer. On the other hand the compound (A) transported from the topcoat layer to the resist layer does not quench the acid present in the exposed area, and therefore, it is possible for the acid generated in the exposed area to maintain the pattern formation-related functions as the acid itself. As a result, it is presumed that the pattern is suppressed from becoming a T-top shape, the DOF and EL performance is improved, and further, film reduction is suppressed, and thus, LER can be reduced.

The compound (A) will be described in more detail.

As described above, the compound (A) is a compound including at least one group or bond selected from the group consisting of an ether bond, a thioether bond, a hydroxyl group, a thiol group, a carbonyl bond, and an ester bond. Since the oxygen atom or sulfur atom contained in these groups or bonds has an unshared electron pair, it can trap the acid by the interaction with the acid diffused from the actinic ray-sensitive or radiation-sensitive film.

The compound (A) is a compound not having basicity. The pKa of the conjugated acid of the compound (A) is preferably 0 or less, more preferably −1 or less, still more preferably −2 or less, and particularly preferably −3 or less. The lower limit of the pKa is not particularly limited, and is, for example, −15 or more. In the present invention, the pKa value represents a value obtained by calculation using ACD/Chem Sketch (ACD/Labs 8.00 Release Product Version: 8.08). The compound (A) is preferably a neutral compound. The pH is preferably 6.0 to 8.0, more preferably 6.5 to 7.5, still more preferably 6.8 to 7.2, and particularly preferably 6.9 to 7.1.

It is preferable that the compound (A) does not have a functional group having a nitrogen atom having a lone electron pair which makes a less contribution to n-conjugation. Examples of the nitrogen atom having a lone electron pair which makes a less contribution to n-conjugation include a nitrogen atom having a partial structure represented by the following general formula. Examples of the structure (compound) having a functional group having a nitrogen atom having a lone electron pair which makes a less contribution to π-conjugation include a chained amide, a cyclic amide, an aromatic amine, a chained aliphatic amine, and a cyclic aliphatic amine.

 ⊖ Unshared Electron Pair

Here, specific examples of the chained and cyclic amide include N,N-bis(2-hydroxyethyl)pivalamide, N,N-diethylacetamide, N1,N1,N3,N3-tetrabutylmalonamide, 1-methylazepan-2-one, 1-allylazepan-2-one, and tert-butyl-1,3-dihydroxy-2-(hydroxymethyl)propan-2-ylcarbamate.

Specific examples of aromatic amine include pyridine and di-tert-butyl pyridine.

Specific examples of the chained aliphatic amine include triisopropanolamine, n-tert-butyldiethanolamine, tris(2-acetoxy-ethyl)amine, 2,2',2'',2'''-(ethane-1,2-diylbis(azanetriyl))tetraethanol, and 2-(dibutylamino)ethanol, 2,2',2''-nitrilotriethanol.

Specific examples of the cyclic aliphatic amine include 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N(2-acetoxy-ethyl) morpholine.

As mentioned above, the compound (A) includes at least one group or bond selected from the group consisting of an ether bond, a thioether bond, a hydroxyl group, a thiol group, a carbonyl bond, and an ester bond. The compound (A) preferably has 2 or more groups or bonds selected from the group, more preferably has 3 or more groups or bonds selected from the group, and still more preferably 4 or more groups or bonds selected from the group. In this case, the groups or the bonds selected from ether bonds, thioether bonds, hydroxyl groups, thiol groups, carbonyl bonds, and ester bonds included in plural numbers in the compound (A) may be the same as or different from each other.

In one embodiment of the present invention, the compound (A) preferably has a molecular weight of 3,000 or less, more preferably has a molecular weight of 2,500 or less, still more preferably has a molecular weight of 2,000 or less, and particularly preferably has a molecular weight of 1,500 or less. The molecular weight (weight-average molecular weight) of the compound (A) is a value in terms of standard polystyrene, determined by gel permeation chromatography (GPC) under the following conditions.

Type of columns: TSK gel Multipore HXL-M (manufactured by Tosoh Corporation, 7.8 mmID×30.0 mmID)
Developing solvent: tetrahydrofuran (THF)
Column temperature: 40° C.
Flow rate: 1 ml/min
Injection amount of sample: 10 μl
Name of device: HLC-8120 (manufactured by Tosoh Corporation)

Furthermore, in one embodiment of the present invention, the number of carbon atoms included in the compound (A) is preferably 8 or more, more preferably 9 or more, and still more preferably 10 or more.

Moreover, in one embodiment of the present invention, the number of carbon atoms included in the compound (A) is preferably 30 or less, more preferably 20 or less, and still more preferably 15 or less.

Furthermore, in one embodiment of the present invention, the compound (A) is preferably a compound having a boiling point of 200° C. or higher, more preferably a compound having a boiling point of 220° C. or higher, and still more preferably a compound having a boiling point of 240 C or higher.

Moreover, in one embodiment of the present invention, the compound (A) is preferably a compound having an ether bond, more preferably a compound having 2 or more ether bonds, still more preferably a compound having 3 or more ether bonds, and even still more preferably a compound having 4 or more ether bonds.

In one embodiment of the present invention, the compound (A) still more preferably further contains a repeating unit containing an oxyalkylene structure represented by the following General Formula (1).

(1)

In the formula,
$R_{11}$ represents an alkylene group which may have a substituent,
n represents an integer of 2 or more, and
* represents a direct bond.

The number of carbon atoms of the alkylene group represented by $R_{11}$ in General Formula (1) is not particularly limited, but is preferably 1 to 15, more preferably 1 to 5, still more preferably 2 or 3, and particularly preferably 2. In a case where this alkylene group has a substituent, the substituent is not particularly limited, but is preferably, for example, an alkyl group (preferably having 1 to 10 carbon atoms).

n is preferably an integer of 2 to 20, among which an integer of 10 or less is more preferable due to an increase in DOF.

The average value of n's is preferably 20 or less, more preferably 2 to 10, still more preferably 2 to 8, and particularly preferably 4 to 6 due to an increase in DOF. Here, "the average value of n's" means the value of n determined when the weight-average molecular weight of the compound (A) is measured by GPC, and the obtained weight-average molecular weight is allowed to match the general formula. In a case where 2/n is not an integer, it is a value rounded to the nearest integer thereof.

$R_{11}$ which are present in plural numbers may be the same as or different from each other.

Furthermore, the compound having a partial structure represented by General Formula (1) is preferably a compound represented by the following General Formula (1-1) for an increase in DOF

(1-1)

In the formula,
the definition, specific examples, and suitable embodiments of $R_{11}$ are the same as those of $R_{11}$ in General Formula (1) as described above, respectively.

$R_{12}$ and $R_{13}$ each independently represent a hydrogen atom or an alkyl group. The number of carbon atoms of the alkyl group is not particularly limited, but is preferably 1 to 15. $R_{12}$ and $R_{13}$ may be bonded to each other to form a ring.

m represents an integer of 1 or more, m is preferably an integer of 1 to 20, and above all, is more preferably an integer of 10 or less due to an increase in DOF.

The average value of m's is preferably 20 or less, more preferably 1 to 10, still more preferably 1 to 8, and particularly preferably 4 to 6 due to an increase in DOF Here, "the average value of m's" has the same definition as the "average value of n's" as described above.

In a case where m is 2 or more, $R_{11}$'s present in plural numbers may be the same as or different from each other.

In one embodiment of the present invention, the compound having a partial structure represented by General Formula (1) is preferably alkylene glycol including at least two ether bonds.

The compound (A) may be used as a commercially available product or may be synthesized according to a known method.

Specific examples of the compound (A) are shown below, but the present invention is not limited thereto.

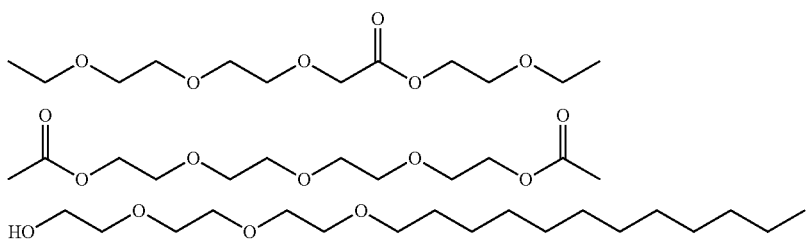

-continued
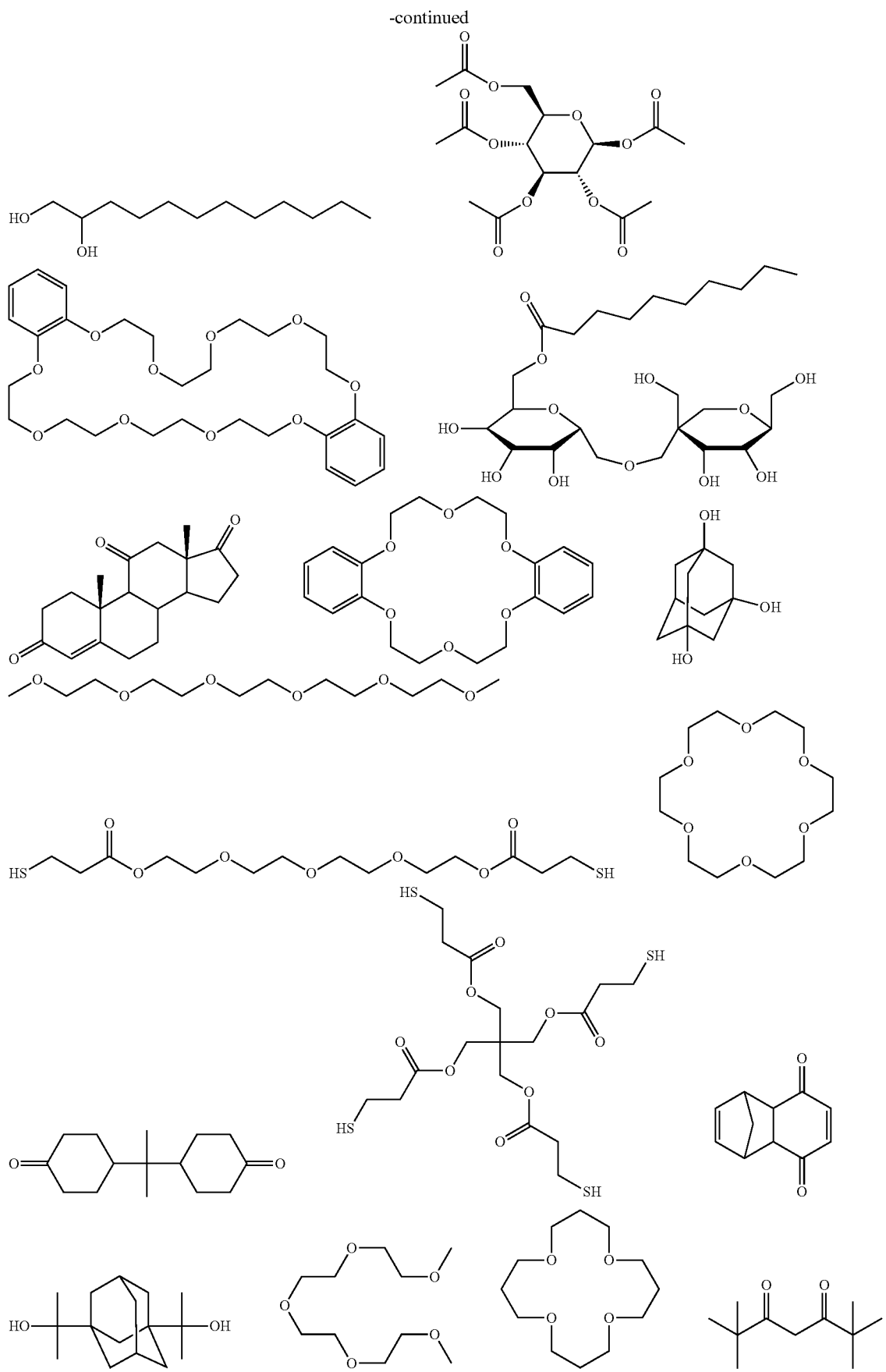

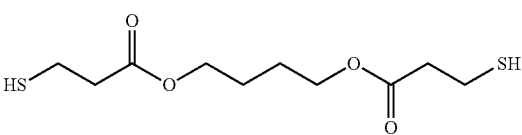

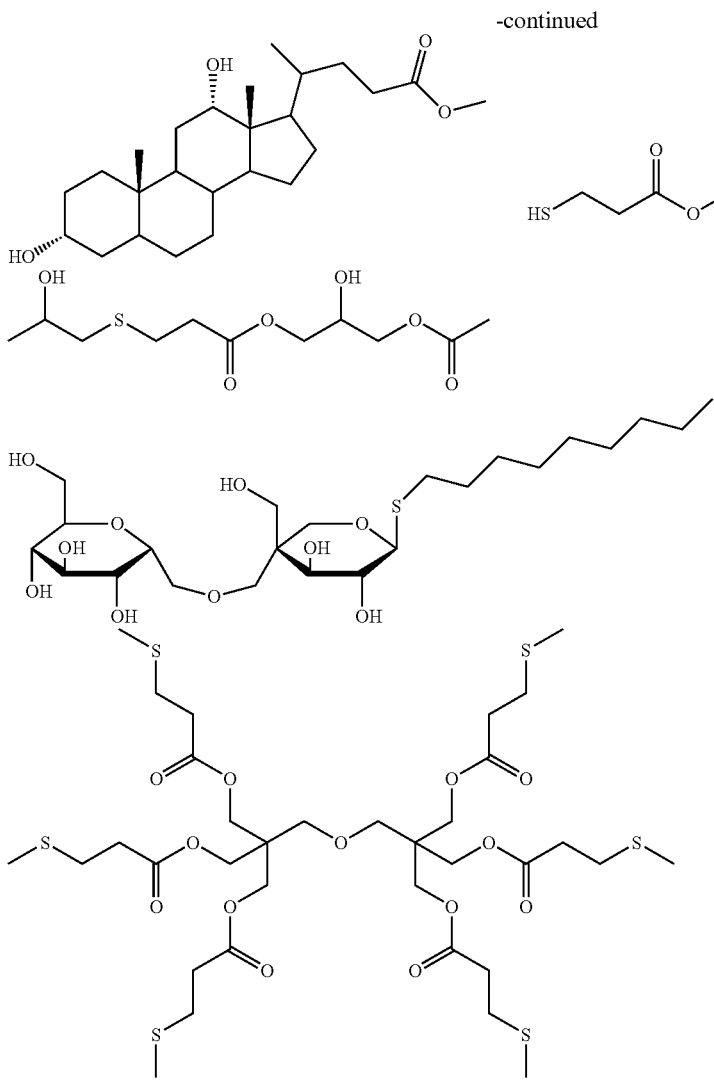

The content of the compound (A) is preferably 0.1% to 30% by mass, more preferably 1% to 25% by mass, still more preferably 2% to 20% by mass, particularly preferably 3% to 18% by mass, and the most preferably 5% to 15% by mass, with respect to the total solid content in the protective film.

<Resin (X)>

The resin (X) which can be directly used in a composition for forming a protective film is preferably transparent for the exposure light source to be used since the light reaches the actinic ray-sensitive or radiation-sensitive film through the protective film upon exposure. In a case where the resin (X) is used for ArF liquid immersion exposure, it is preferable that the resin substantially does not have an aromatic group in view of transparency to ArF light.

In one embodiment of the present invention, the resin (X) preferably has a content of fluorine atoms of 20% by mass or less. Specifically, the content of fluorine atoms in the resin (X) is preferably 20% by mass or less, more preferably 10% by mass or less, and ideally substantially 0% by mass, with respect to the weight-average molecular weight of the resin (X).

Furthermore, in another embodiment of the present invention, it is preferable that the resin (X) includes a $CH_3$ partial structure in the side chain moiety.

Here, the $CH_3$ partial structure (hereinafter also simply referred to as a "side chain $CH_3$ partial structure") contained in the side chain moiety in the resin (X) includes a $CH_3$ partial structure contained in an ethyl group, a propyl group, or the like.

On the other hand, a methyl group bonded directly to the main chain of the resin (X) (for example, an α-methyl group in the repeating unit having a methacrylic acid structure) is not included in the $CH_3$ partial structure in the present invention.

More specifically, in a case where the resin (X) contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves," such the $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the resin (X) has "one" $CH_3$ partial structure in the present invention.

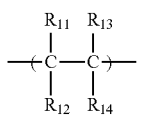

(M)

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The resin (X) is preferably a resin including a repeating unit having a $CH_3$ partial structure in the side chain moiety, and more preferably has, as such a repeating unit, at least one repeating unit (x) of a repeating unit represented by the following General Formula (II) or a repeating unit represented by the following General Formula (III). In particular, in a case where KrF, EUV, or electron beams (EB) are used as an exposure light source, the resin (X) can suitably include the repeating unit represented by the following General Formula (111).

Hereinafter, the repeating unit represented by General Formula (II) will be described in detail.

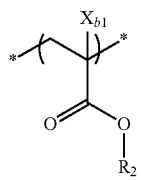

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group not having a "group that decomposes by the action of an acid to generate an alkali-soluble group" described in the acid-decomposable resin contained in the actinic ray-sensitive or radiation-sensitive resin composition which will be described later.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 3 to 8.

The alkyl group having one or more $CH_3$ partial structures in $R_2$ is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group, and the alkyl group is more preferably an isobutyl group, a t-butyl group, a 2-methyl-3-butyl group, a 2-methyl-3-pentyl group, a 3-methyl-4-hexyl group, 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more $CH_3$ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a group, cedrol group, a cyclopentyl group, a cyclohexyl group, a cycloheptyl group, a cyclooctyl group, a cyclodecanyl group, and a cyclododecanyl group, and the cycloalkyl group is more preferably an adamantyl group, a norbornyl group, a cyclohexyl group, a cyclopentyl group, a tetracyclododecanyl group, or a tricyclodecanyl group, and even more preferably a norbornyl group, a cyclopentyl group, or a cyclohexyl group. As $R_2$, a cycloalkyl group having one or more $CH_3$ partial structures is preferable, a polycyclic cycloalkyl group having one or more $CH_3$ partial structures is more preferable, a polycyclic cycloalkyl group having two or more $CH_3$ partial structures is still more preferable, and a polycyclic cycloalkyl group having three or more $CH_3$ partial structures is particularly preferable. Among those, a polycyclic cycloalkyl group substituted with three or more alkyl groups is preferable.

The alkenyl group having one or more $CH_3$ partial structures in $R_2$ is preferably a linear or branched alkenyl group having 1 to 20 carbon atoms, and more preferably a branched alkenyl group.

The aryl group having one or more $CH_3$ partial structures in $R_2$ is preferably an aryl group having 6 to 20 carbon atoms, and examples thereof include a phenyl group and a naphthyl group, and the aryl group is preferably a phenyl group.

The aralkyl group having one or more $CH_3$ partial structures in $R_2$ is preferably an aralkyl group having 7 to 12 carbon atoms, and examples thereof include a benzyl group, a phenethyl group, and a naphthylmethyl group.

Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-tbutylcyclohexyl group, and an isobornyl group. The hydrocarbon structure is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-tbutylcyclohexyl group, or an isobornyl group.

Specific preferred examples of the repeating unit represented by General Formula (II) are shown below, but the present invention is not limited thereto.

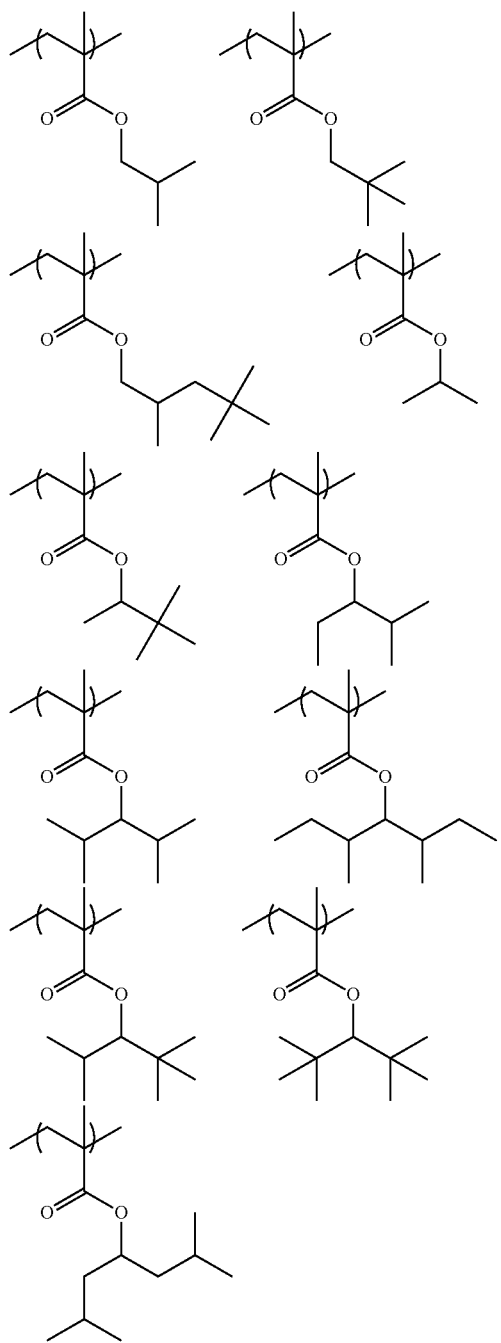

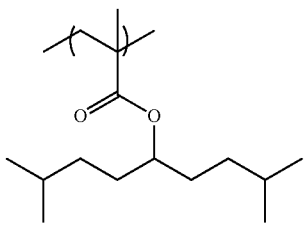

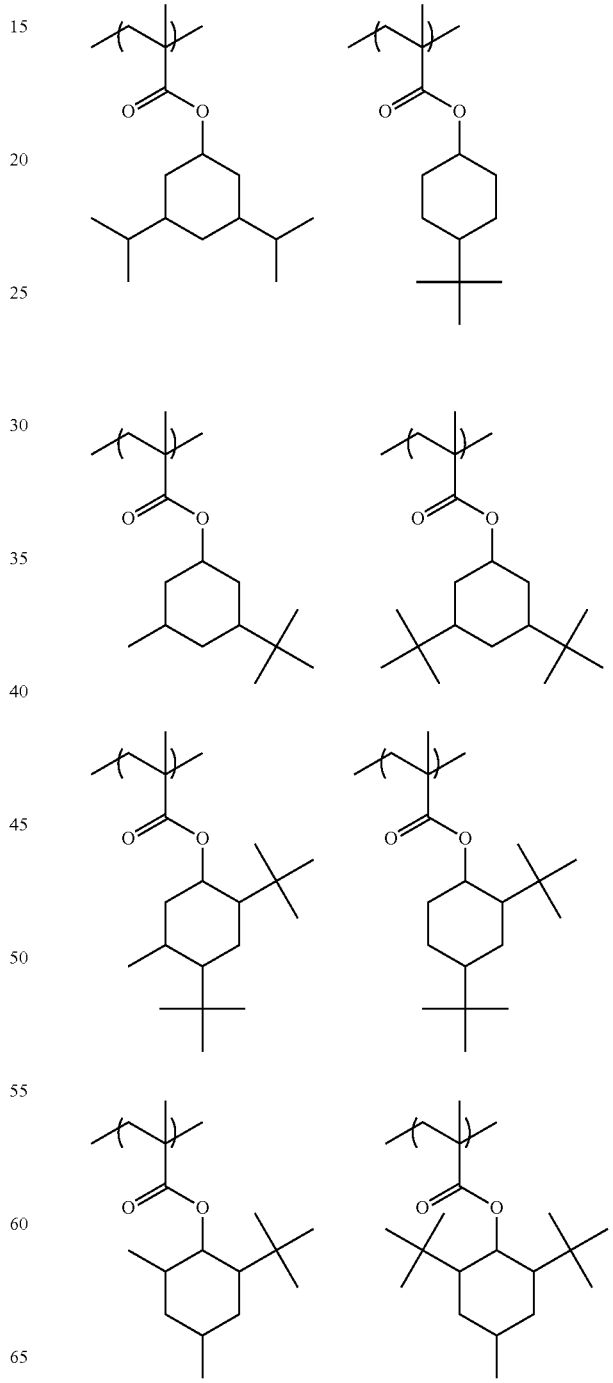

-continued

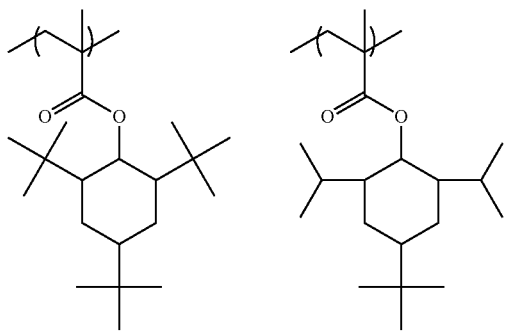

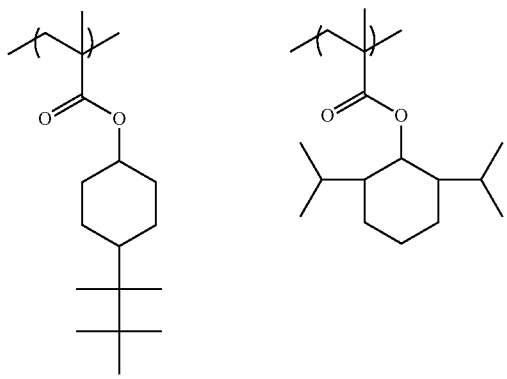

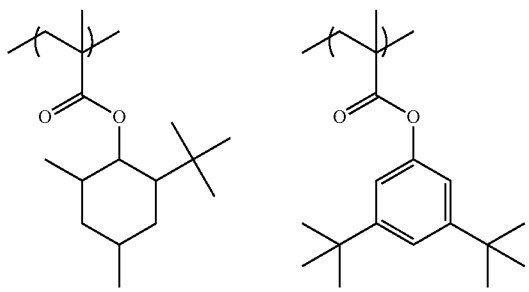

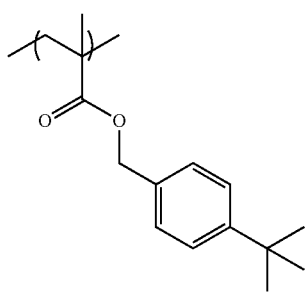

The repeating unit represented by General Formula (II) is preferably a repeating unit which is stable against an acid (non-acid-decomposable), and specifically, it is preferably a repeating unit not having a group that decomposes by the action of an acid to generate a polar group.

Hereinafter, the repeating unit represented by General Formula (III) will be described in detail.

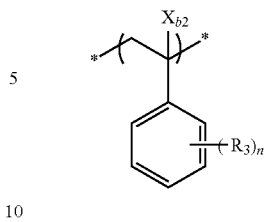

(III)

In General Formula (III), $X_{b2}$ represents a hydrogen atom, an alkyl group, a cyano group, or a halogen atom, $R_3$ represents an organic group having one or more $CH_3$ partial structures, which is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group which is stable against an acid, more specifically, $R_3$ is preferably an organic group which does not have the "group that decomposes by the action of an acid to generate an alkali-soluble group" described above in the acid-decomposable resin which will be described later.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

The alkyl group having one or more $CH_3$ partial structures in $R_3$ is preferably a branched alkyl group having 3 to 20 carbon atoms. Preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably one having 5 to 20 carbon atoms, and is more preferably an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylpentyl group, a 2-ethylhexyl group, a 2,6- dimethylheptyl group, a 1,5-dimethyl-3-heptyl group, a 2,3,5,7-tetramethyl-4-heptyl group, or a 2,6-dimethylheptyl group.

n represents an integer of 1 to 5, preferably represents an integer of 1 to 3, and more preferably represents 1 or 2.

Specific preferred examples of the repeating unit represented by General Formula (III) are shown below, but the present invention is not limited thereto.

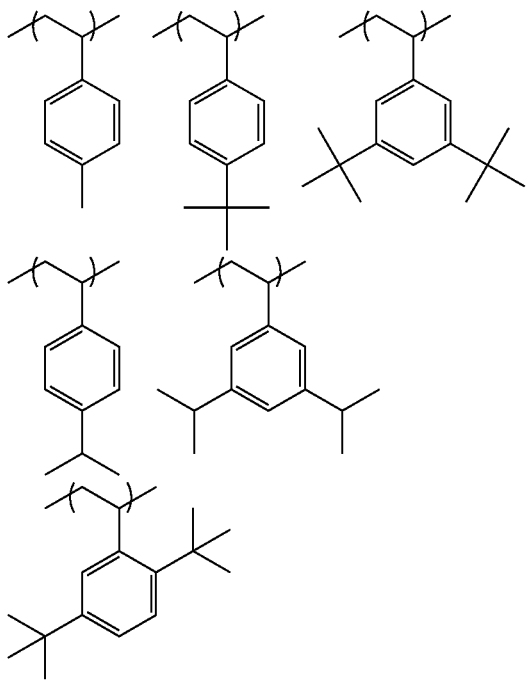

The repeating unit represented by General Formula (111) is preferably a repeating unit which is stable against an acid (non-acid-decomposable), and specifically, it is preferably a repeating unit which does not have a group that decomposes by the action of an acid to generate a polar group.

In a case where the resin (X) contains a $CH_3$ partial structure in the side chain moiety thereof, and in particular, it further has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the resin (X). The content is usually 100% by mole or less with respect to all the repeating units of the resin (X).

By incorporating at least one repeating unit (x) of the repeating unit represented by General Formula (II) or the repeating unit represented by General Formula (III) in the proportion of 90% by mole or more with respect to all the repeating units of the resin (X) into the resin (X), the surface free energy of the resin (X) increases. As a result, it is difficult that the resin (X) is distributed unevenly on the surface of the actinic ray-sensitive or radiation-sensitive composition film, and thus, it is possible to reliably improve the static/dynamic contact angle of the actinic ray-sensitive or radiation-sensitive film with respect to water, and improve the immersion liquid tracking properties.

Furthermore, in another embodiment of the present invention, the resin (X) is preferably a resin containing a repeating unit derived from a monomer containing at least one fluorine atom and/or at least one silicon atom, and more preferably a water-insoluble resin containing a repeating unit derived from a monomer containing at least one fluorine atom and/or at least one silicon atom. By incorporation of the repeating unit derived from a monomer containing at least one fluorine atom and/or at least one silicon atom, good solubility in an organic solvent developer is obtained and the effects of the present invention are sufficiently obtained.

The fluorine atom or the silicon atom in the resin (X) may be contained in the main chain of the resin or may be substituted in the side chain.

The resin (X) is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and they may further have another substituent.

The aryl group having a fluorine atom is an aryl group in which at least one hydrogen atom is substituted with a fluorine atom, such as a phenyl group and a naphthyl group, and they may further have another substituent.

Specific examples of the alkyl group having a fluorine atom, the cycloalkyl group having a fluorine atom, and the aryl group having a fluorine atom are shown below, but the present invention is not limited thereto.

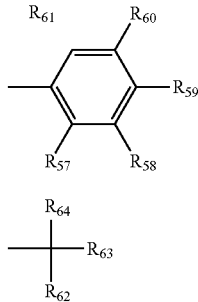

In General Formulae (F2) to (F3), $R_{57}$ to $R_{64}$ each independently represent a hydrogen atom, a fluorine atom, or an alkyl group, provided that at least one of $R_{57}, \ldots,$ or $R_{61}$ or of $R_{62}, \ldots,$ or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. Each of $R_{62}$ and $R_{63}$ is preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl) hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, or a perfluoroisopentyl group is preferable, and a hexafluoroisopropyl group or a heptafluoroisopropyl group is more preferable.

The resin (X) is preferably a resin having an alkylsilyl structure (preferably a trialkylsilyl group) or a cyclic siloxane structure as a partial structure having a silicon atom.

Examples of the resin (X) include a resin having at least one repeating unit selected from the group consisting of the repeating units represented by the following General Formulae (C-I) to (C-V).

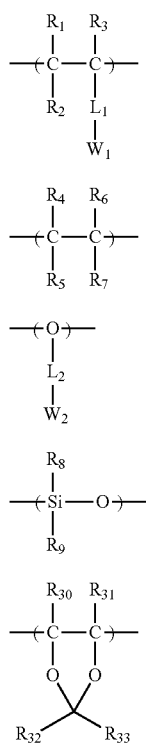

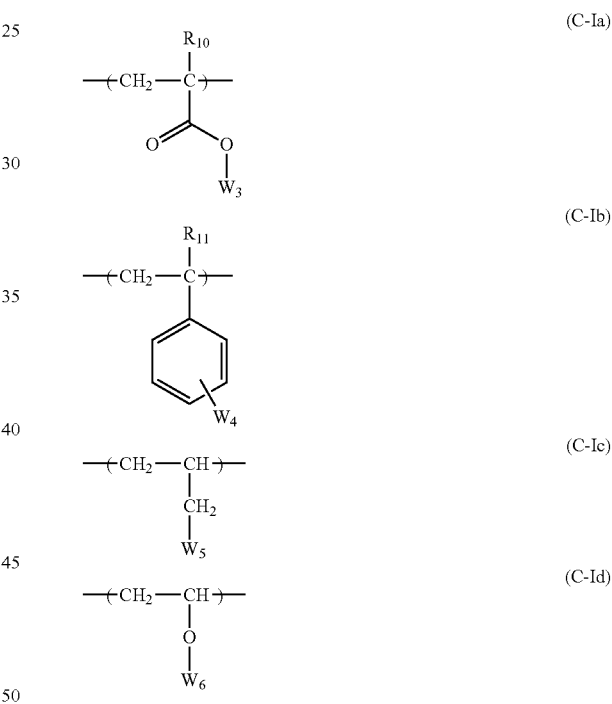

In General Formulae (C-I) to (C-V).

$R_1$ to $R_3$ each represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each independently represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4$, . . . , or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each independently represent a single bond or a divalent linking group, which are the same as $L_3$ to Ls.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (X) preferably has a repeating unit represented by General Formula (C-I), and more preferably a repeating unit represented by any of the following General Formulae (C-Ia) to (C-Id).

In General Formulae (C-Ia) to (C-Id), $R_{10}$ and $R_{11}$ each represents a hydrogen atom, a fluorine atom, a linear or branched alkyl group having 1 to 4 carbon atoms, or a linear or branched fluorinated alkyl group having 1 to 4 carbon atoms.

$W_3$ to $W_6$ are each an organic group having one or more groups of at least one of a fluorine atom or a silicon atom.

When $W_1$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by each of $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

When $W_1$ to $W_6$ are each an organic group having a silicon atom, an alkylsilyl structure or a cyclic siloxane structure is preferable. Specific examples thereof include groups represented by General Formulae (CS-1) to (CS-3).

Specific examples of the repeating unit represented by General Formula (C-I) are shown below. X represents a hydrogen atom, —$CH_3$, —F, or —$CF_3$.

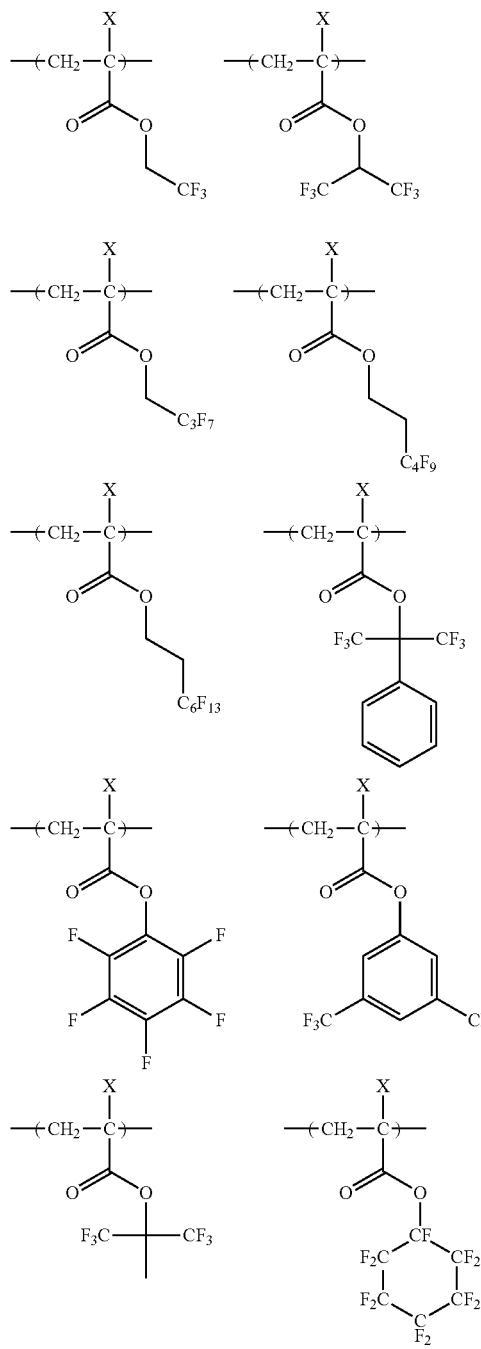

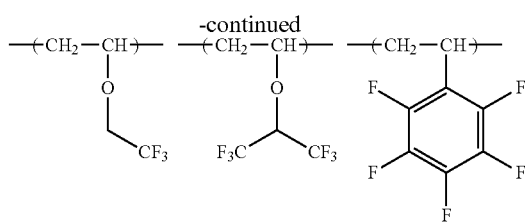

In order to adjust the solubility in an organic solvent developer, the resin (X) may have a repeating unit represented by the following General Formula (Ia).

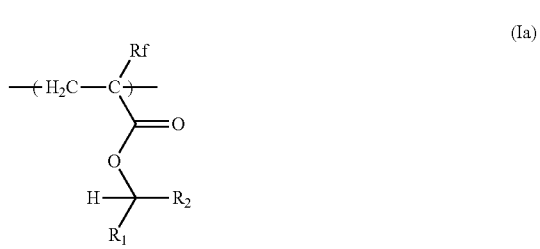

(Ia)

In General Formula (Ia),

Rf represents a fluorine atom or an alkyl group in which at least one hydrogen atom is substituted with a fluorine atom.

$R_1$ represents an alkyl group.

$R_2$ represents a hydrogen atom or an alkyl group.

In General Formula (Ia), the alkyl group in which at least one hydrogen atom is substituted with a fluorine atom among Rf's is preferably one having 1 to 3 carbon atoms, and more preferably a trifluoromethyl group.

The alkyl group of $R_1$ is preferably a linear or branched alkyl group having 3 to 10 carbon atoms, and more preferably a branched alkyl group having 3 to 10 carbon atoms.

$R_2$ is preferably a linear or branched alkyl group having 1 to 10 carbon atoms, and more preferably a linear or branched alkyl group having 3 to 10 carbon atoms.

Specific examples of the repeating unit represented by General Formula (Ia) are shown below, but the present invention is not limited thereto.

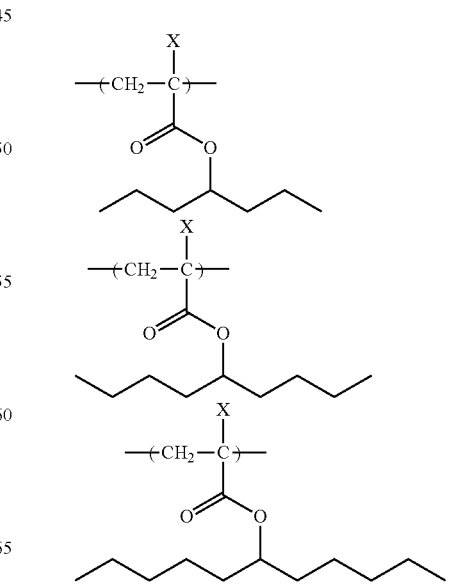

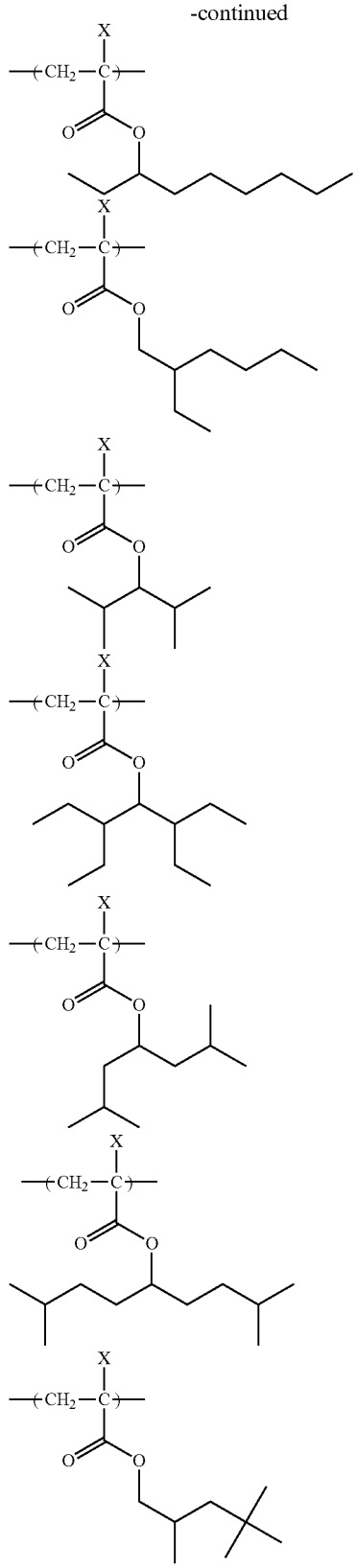

X = F or CF₃

The resin (X) may further have a repeating unit represented by the following General Formula (III).

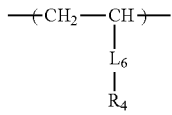

(III)

In General Formula (III), $R_4$ represents an alkyl group, a cycloalkyl group, an alkenyl group, a cycloalkenyl group, a trialkylsilyl group, or a group having a cyclic siloxane structure.

$L_6$ represents a single bond or a divalent linking group.

In General Formula (III), the alkyl group of $R_4$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The trialkylsilyl group is preferably a trialkylsilyl group having 3 to 20 carbon atoms.

The group having a cyclic siloxane structure is preferably a group containing a cyclic siloxane structure having 3 to 20 carbon atoms.

The divalent linking group of $L_6$ is preferably an alkylene group (preferably having 1 to 5 carbon atoms) or an oxy group.

The resin (X) may have the same group as the acid-decomposable group in a lactone group, an ester group, an acid anhydride, or the acid-decomposable resin which will be described later. The resin (X) may further have a repeating unit represented by the following General Formula (VIII).

(VIII)

The resin (X) preferably contains a repeating unit (d) derived from a monomer having an alkali-soluble group. Thus, it is possible to control the solubility in an immersion liquid and the solubility in a coating solvent. Examples of the alkali-soluble group include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a group having a tris(alkylsulfonyl)methylene group.

As the monomer having an alkali-soluble group, a monomer having an acid dissociation constant pKa of 4 or more is preferable, a monomer having a pKa of 4 to 13 is more preferable, and a monomer having a pKa of 8 to 13 is the most preferable. By incorporation of a monomer having a pKa of 4 or more, swelling upon development of a negative tone and a positive tone is suppressed, and thus, not only good developability for an organic solvent developer but also good developability in a case of using a weakly basic alkali developer are obtained.

The acid dissociation constant pKa is described in Chemical Handbook (II) (Revised 4$^{th}$ Edition, 1993, compiled by the Chemical Society of Japan, Maruzen Co., Ltd.), and the value of pKa in of the monomer containing an alkali-soluble group can be measured by, for example, using an infinite-dilution solvent at 25° C.

The monomer having a pKa of 4 or more is not particularly limited, and examples thereof include a monomer containing an acid group (an alkali-soluble group) such as a phenolic hydroxyl group, a sulfonamido group, —COCH$_2$CO—, a fluoroalcohol group, and a carboxylic acid group. A monomer containing a fluoroalcohol group is particularly preferable. The fluoroalcohol group is a fluoroalkyl group substituted with at least one hydroxyl group, preferably having 1 to 10 carbon atoms, and more preferably 1 to 5 carbon atoms. Specific examples of the fluoroalcohol group include —CF$_2$OH, —CH$_2$CF$_2$OH, —CH$_2$CF$_2$CF$_2$OH, —C(CF$_3$)OH, —CF$_2$CF(CF$_3$)OH, and —CH$_2$C(CF$_3$)$_2$OH. As a fluoroalcohol group, a hexafluoroisopropanol group is particularly preferable.

The total amount of the repeating unit derived from a monomer having an alkali-soluble group in the resin (X) is preferably 0% to 90% by mole, more preferably 0% to 80% by mole, and still more preferably 0% to 70% by mole, with respect to all the repeating units constituting the resin (X).

The monomer having an alkali-soluble group may contain only one or two or more acid groups. The repeating unit derived from the monomer preferably has 2 or more acid groups, more preferably 2 to 5 acid groups, and particularly preferably 2 or 3 acid groups, per one repeating unit.

Specific preferred examples of the repeating unit derived from a monomer having an alkali-soluble group are shown but are not limited thereto.

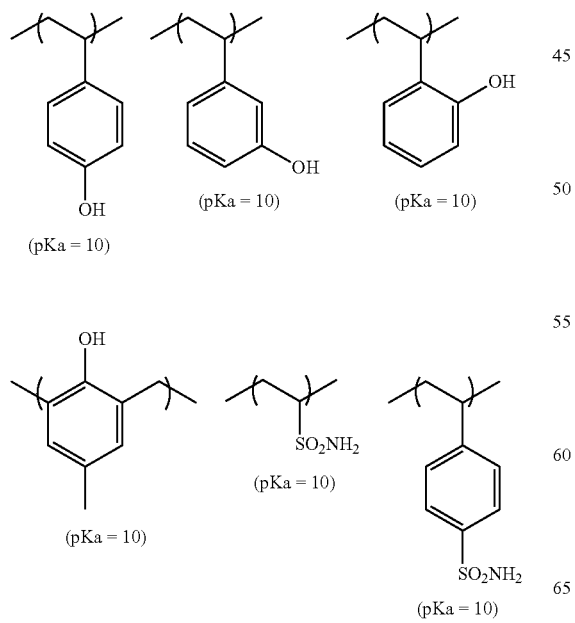

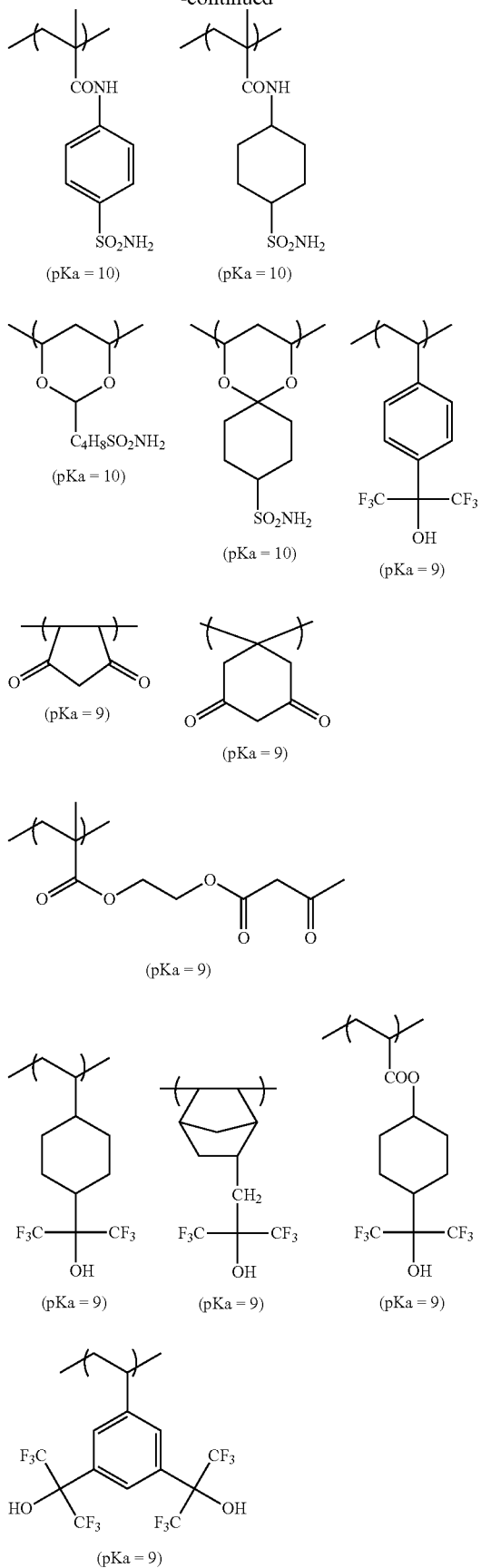

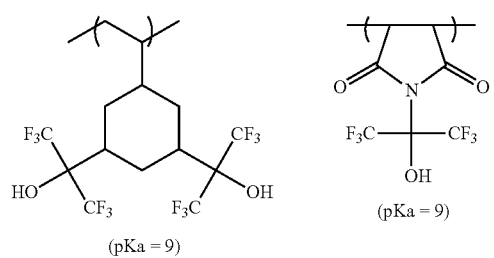
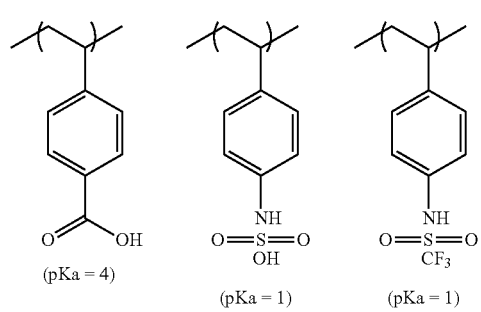
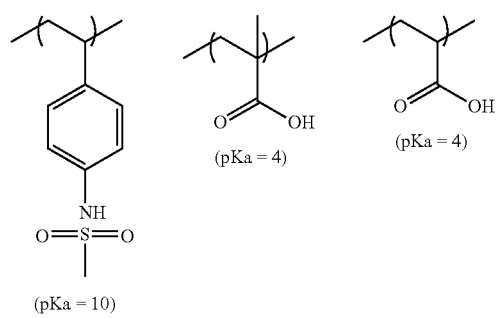
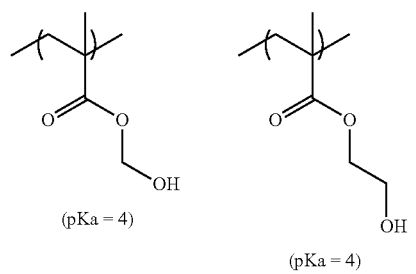
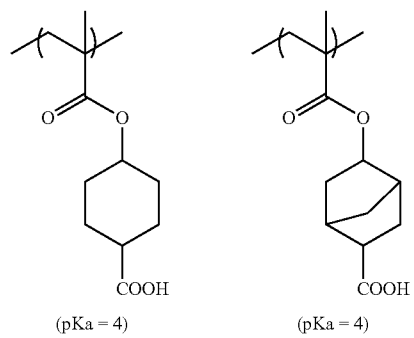
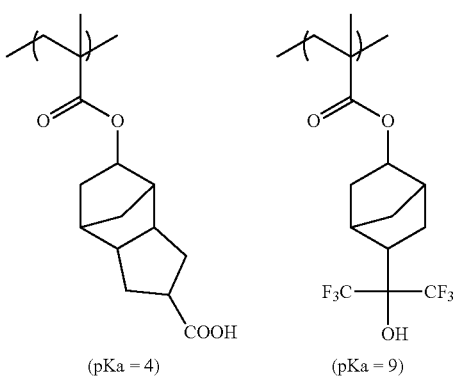
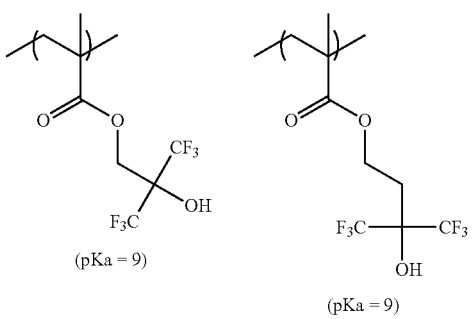
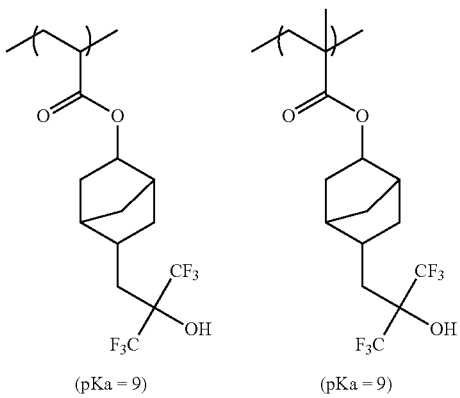
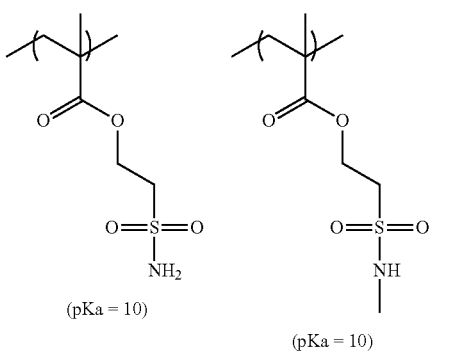

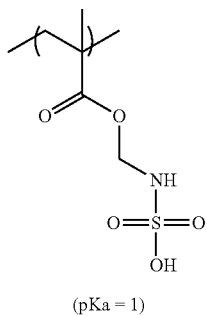 (pKa = 1)

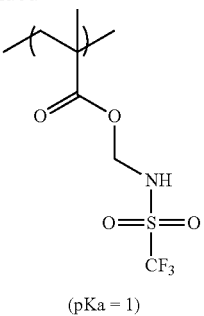 (pKa = 1)

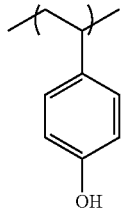 (A-1)

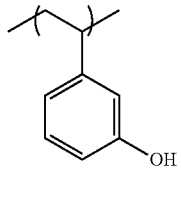 (A-2)

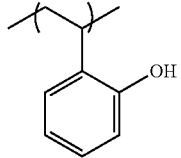 (A-3)

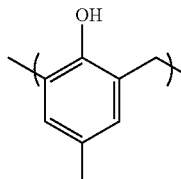 (A-4)

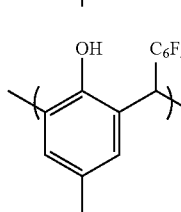 (A-5)

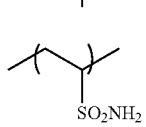 (A-6)

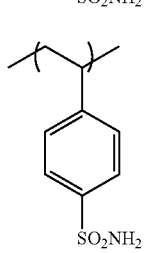 (A-7)

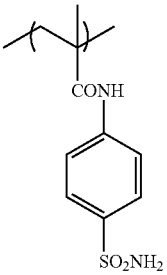 (A-8)

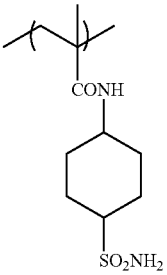 (A-9)

The resin (X) is preferably some resins selected from the following (X-1) to (X-8).

(X-1) Resin having a repeating unit (a) having a fluoroalkyl group (preferably having 1 to 4 carbon atoms), and more preferably a resin having only a repeating unit (a).

(X-2) Resin having a repeating unit (b) having a trialkylsilyl group or a cyclic siloxane structure, and more preferably a resin having only a repeating unit (b).

(X-3) Resin having a repeating unit (a) having a fluoroalkyl group (preferably having 1 to 4 carbon atoms), and a repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerized resin having a repeating unit (a) and a repeating unit (c).

(X-4) Resin having a repeating unit (b) having a trialkylsilyl group or a cyclic siloxane structure, and a repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerized resin having a repeating unit (b) and a repeating unit (c).

(X-5) Resin having a repeating unit (a) having a fluoroalkyl group (preferably having 1 to 4 carbon atoms), and a repeating unit (b) having a trialkylsilyl group or a cyclic siloxane structure, and more preferably a copolymerized resin of a repeating unit (a) and a repeating unit (b).

(X-6) Resin having a repeating unit (a) having a fluoroalkyl group (preferably having 1 to 4 carbon atoms), a repeating unit (b) having a trialkylsilyl group or a cyclic siloxane structure, and a repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerized resin of a repeating unit (a), a repeating unit (b), and a repeating unit (c).

In the resin (X-3), (X-4), or (X-6), a suitable functional group can be introduced into a repeating unit (c) having a branched alkyl group, a cycloalkyl group, a branched alkenyl group, a cycloalkenyl group, or an aryl group, taking into consideration hydrophilicity/hydrophobicity, interaction, or the like.

(X-7) Resin having a repeating unit (preferably a repeating unit having a repeating unit having an alkali-soluble group having a pKa of 4 or more) which further has an alkali-soluble group (d) in the repeating unit each constituting (X-1) to (X-6).

(X-8) Resin having only a repeating unit having an alkali-soluble group (d) having a fluoroalcohol group.

In the resins (X-3), (X-4), (X-6), and (X-7), the proportion of the repeating unit (a) having a fluoroalkyl group and/or the repeating unit (b) having a trialkylsilyl group or a cyclic siloxane structure is preferably 10% to 99% by mole, and more preferably 20% to 80% by mole.

Furthermore, by incorporating the alkali-soluble group (d) into the resin (X-7), the release easiness at a time of using the organic solvent developer as well as the release easiness at a time of using other release liquids, for example, the release easiness in a case of using an alkaline aqueous solution as a release liquid are improved.

The resin (X) is preferably solid at normal temperature (25° C.). Further, the glass transition temperature (Tg) is preferably 50° C. to 200° C., and more preferably 80° C. to 160° C.

Being solid at 25° C. means that the melting point is 25° C. or higher.

The glass transition temperature (Tg) can be measured by a differential scanning calorimetry. For example, it can be determined by heating a sample once and cooling, and then analyzing the change in the specific volume when the sample is heated again at 5° C./min.

It is preferable that the resin (X) is insoluble in an immersion liquid (preferably water) and is soluble in an organic solvent developer, and preferably a developer including an ester-based solvent. In a case where the pattern forming method of the present invention further includes a step of carrying out development using an alkali developer, from the viewpoint of the possibility of release by development using an alkali developer, it is preferable that the resin (X) is also soluble in an alkali developer.

In a case where the resin (X) has silicon atoms, the content of the silicon atoms is preferably 2% to 50% by mass, and more preferably 2% to 30% by mass, with respect to the molecular weight of the resin (X). Further, the amount of the repeating units containing silicon atoms is preferably 10% to 100% by mass, and more preferably 20% to 100% by mass, in the resin (X).

By setting the content of silicon atoms and the content of the repeating units containing silicon atoms to the above range, any of the insolubility in an immersion liquid (preferably water), the release easiness of the protective film at a time of using an organic solvent developer, and incompatibility with an actinic ray-sensitive or radiation-sensitive film can be improved.

By setting the content of fluorine atoms and the content of the repeating units containing fluorine atoms to the above range, any of the insolubility in an immersion liquid (preferably water), the release easiness of the protective film at a time of using an organic solvent developer, and incompatibility with an actinic ray-sensitive or radiation-sensitive film can be improved.

The weight-average molecular weight of the resin (X) is preferably 1,000 to 100,000, more preferably 1,000 to 50,000, still more preferably 2,000 to 15,000, and particularly preferably 3,000 to 15,000, in terms of standard polystyrene.

In the resin (X), it is certain that the content of impurities such as a metal is small, but the content of residual monomers is also preferably 0% to 10% by mass, more preferably 0% to 5% by mass, and still more preferably 0% to 1% by mass, from the viewpoint of reduction in elution from the protective film to the immersion liquid. Further, the molecular weight distribution (weight-average molecular weight (Mw)/number-average molecular weight (Mn), also referred to as dispersity) is preferably 1 to 5, more preferably in a range of 1 to 3, and still more preferably in a range of 1 to 1.5.

As the resin (X), various commercially products may be used, or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). If necessary, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C. and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a reprecipitation method in which a residual monomer or the like is removed by adding a resin solution dropwise to a poor solvent to coagulate the resin in the poor solvent, or a purification method in a solid state in which filtered resin slurry is cleaned with a poor solvent can be applied to the purification. For example, by bringing into contact with a solvent (poor solvent), which does poorly dissolve or does not dissolve the resin, corresponding to 10 times or less the volume amount of the reaction solution, or preferably 5 times to 10 times the volume amount of the reaction solution, the resin is solidified and precipitated.

The solvent to be used in the precipitation or reprecipitation from the polymer solution (precipitation or reprecipitation solvent) may be an arbitrary one so long as it is a poor solvent to the polymer. It may be appropriately selected from, for example, a hydrocarbon (an aliphatic hydrocarbon such as pentane, hexane, heptane, and octane; an alicyclic hydrocarbon such as cyclohexane and methylcyclohexane: an aromatic hydrocarbon such as benzene, toluene, and xylene; or the like), a halogenated hydrocarbon (a halogenated aliphatic hydrocarbon such as methylene chloride, chloroform, and carbon tetrachloride; or the like: a halogenated aromatic hydrocarbon such as chlorobenzene and dichlorobenzene), a nitro compound (nitromethane, nitroethane, or the like), a nitrile (acetonitrile, benzonitrile, or the like), an ether (a chain ether such as diethyl ether, diisopropyl ether, and dimethoxyethane; a cyclic ether such as tetrahydrofuran and dioxane: or the like), a ketone (acetone, methyl ethyl ketone, diisobutyl ketone, or the like), an ester (ethyl acetate, butyl acetate, or the like), a carbonate (dimethyl carbonate, diethyl carbonate, ethylene carbonate, propylene carbonate, or the like), an alcohol (methanol, ethanol, propanol, isopropyl alcohol, butanol, or the like), a carboxylic acid (acetic acid or the like), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is approximately, for example, the former/the latter (volume ratio: 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent to be used may be appropriately selected by taking into consideration efficiency, yield, or the like. In general, it is used in an amount of from 100 to 10,000 parts by mass, preferably from 200 to 2,000 parts by mass and more preferably from 300 to 1,000 parts by mass, with respect to 100 parts by mass of the polymer solution.

In the step of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, 0.1 to 10 m/sec, and preferably approximately 0.3 to 5 m sec.

The precipitation or reprecipitation procedure is preferably carried out under stirring. As the stirring blade which can be used for the stirring, a disc turbine, a fan turbine (including a paddle), a curved vane turbine, an arrow feather turbine, a Pfaudler type, a bull margin type, an angled vane fan turbine, a propeller, a multistage type, an anchor type (or a horseshoe type), a gate type, a double ribbon type, and a screw type, or the like can be used. It is preferable that the stirring is further carried out for 10 minutes or more, in particular, 20 minutes or more, after the completion of feeding of the polymer solution. In a case where the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature at the precipitation or reprecipitation may be appropriately selected by taking into consideration efficiency or performance, the temperature is usually approximately 0° C. to 50° C. preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under atmospheric pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may include, after the completion of a radical polymerization reaction, precipitating a resin by bringing the polymer into contact with a solvent in which the polymer is sparingly soluble or insoluble (step a), separating the resin from the solution (step b), dissolving the resin in a solvent again to prepare a resin solution A (step c), then precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As the solvent used for the preparation of the resin solution A, the same solvent as the solvent for dissolving the monomer at the polymerization reaction may be used, and the solvent may be the same as or different from each other from the solvent used for the polymerization reaction.

The resin (X) may be used singly or in combination of a plurality thereof.

In a case where the topcoat composition includes a plurality of the resins (X), it is preferable that the topcoat composition includes at least one of a resin (XA) having fluorine atoms and/or silicon atoms. It is more preferable that the topcoat composition includes at least one resin (XA) having fluorine atoms and/or silicon atoms, and a resin (XB) having a lower content of fluorine atoms and/or silicon atoms than that of the resin (XA). Thus, when a topcoat film is formed, the resin (XA) is unevenly distributed on the surface of the topcoat film, and therefore, performance such as development characteristics and immersion liquid tracking properties can be improved.

The content of the resin (XA) is preferably 0.01% to 30% by mass, more preferably 0.1% to 10% by mass, still more preferably 0.1% to 8% by mass, and particularly preferably 0.1% to 5% by mass, with respect to the total solid content included in the topcoat composition. The content of the resin (XB) is preferably 50.0% to 99.9% by mass, more preferably 60% to 99.9% by mass, still more preferably 70% to 99.9% by mass, and particularly preferably 80% to 99.9% by mass, with respect to the total solid content included in the topcoat composition.

The preferred examples of the content of fluorine atoms and silicon atoms contained in the resin (XA) is the same as the preferred range in a case where the resin (X) has fluorine atoms and a case where the resin (X) has silicon atoms.

An embodiment in which the resin (XB) substantially does not contain fluorine atoms and silicon atoms is preferable, and in this case, specifically, the total content of the repeating unit having fluorine atoms and repeating unit having silicon atoms is preferably 0% to 20% by mole, more preferably 0% to 10% by mole, still more preferably 0% to 5% by mole, particularly preferably 0% to 3% by mole, and ideally 0% by mole, with respect to all the repeating units in the resin (XB), and that is, the repeating unit substantially does not contain a fluorine atom and a silicon atom.

The blend amount of the resin (X) in the entire topcoat composition is preferably 50% to 99.9% by mass, and more preferably 60% to 99.0% by mass, with respect to the total solid content.

[Solvent]

It is preferable that the composition for forming a protective film used in the pattern forming method of the present invention is used after a resin is dissolved in a solvent in order to form the composition for forming a protective film uniformly on the actinic ray-sensitive or radiation-sensitive film.

In order to form a good pattern while not dissolving the actinic ray-sensitive or radiation-sensitive film, it is preferable that the composition for forming a protective film of the present invention contains a solvent in which the actinic ray-sensitive or radiation-sensitive film is not dissolved, and it is more preferable that a solvent with components different from a negative tone developer is used. Further, from the viewpoint of the prevention of elution into an immersion liquid, low solubility in an immersion liquid is preferred, and low solubility in water is more preferable. In the present specification, "having low solubility in an immersion liquid" means insolubility in an immersion liquid. Similarly, "having low solubility in water" means insolubility in water. Further, from the viewpoints of volatility and coatability, the boiling point of the solvent is preferably 90° C. to 200° C.

Having low solubility in an immersion liquid indicates that in an example of the solubility in water, when a composition for forming a protective film is coated on a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly coating the protective film, a solvent having a concentration of the solid content of 0.01% to 20% by mass, more preferably 0.1% to 15% by mass, and the most preferably 1% to 10% by mass is used.

The solvent that can be used is not particularly limited as long as it can dissolve the resin (X) which will be described later and does not dissolve the actinic ray-sensitive or radiation-sensitive film but an alcohol-based solvent, a fluorine-based solvent, a ketone-based solvent, a hydrocarbon-based solvent, an ether-based solvent, or an ester-based solvent is preferably used. Thus, the non-dissolving property for the actinic ray-sensitive or radiation-sensitive film is further enhanced and when the composition for forming a protective film is coated on the actinic ray-sensitive or radiation-sensitive film, a protective film can be more uniformly formed without dissolving the actinic ray-sensitive or radiation-sensitive film. The viscosity of the solvent is preferably 5 centipoises (cP) or less, more preferably 3 cP or less, still more preferably 2 cP or less, and particularly preferably cP or less. Further, centipoises can be converted into pascal seconds according to the following formula: 1,000 cP=1 Pa·s.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 4-methyl-1-pentanol, 4-methyl-2-pentanol, or the like can be used. Among those, 1-butanol, 1-hexanol, 1-pentanol, 3-methyl-1-butanol, or 4-methyl-2-pentanol is preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro 1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol or a fluorinated hydrocarbon-based solvent can be suitably used.

Examples of the ketone-based solvent include 4-methyl-2-pentanone, 2,4-dimethyl-2-pentanone, 3-penten-2-one, 2-nonanone, 3-heptanone, 3-methylcyclopentanone, or the like can be used.

Examples of the hydrocarbon-based solvent include aromatic hydrocarbon-based solvents such as toluene, xylene, and anisole, and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

Examples of the ether-based solvent include, in addition to the glycol ether-based solvents, dioxane, tetrahydrofuran, and isoamyl ether. Among the ether-based solvents, an ether-based solvent having a branched structure is preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, and isobutyl isobutyrate. Among the ester-based solvents, an ester-based solvent having a branched structure is preferable.

These solvents are used singly or as a mixture of a plurality thereof.

In a case of mixing a solvent other than those recited above, the mixing ratio thereof is usually 0% to 30% by mass, preferably 0% to 20%, by mass, and more preferably 0% to 10% by mass, with respect to the total amount of solvents in the composition for forming a protective film. By mixing a solvent other than those recited above, the solubility for the actinic ray-sensitive or radiation-sensitive film, the solubility of the resin in the composition for forming a protective film, the elution properties from the actinic ray-sensitive or radiation-sensitive film, or the like can be appropriately adjusted.

[Surfactant]

It is preferable that the composition for forming a protective film of the present invention further contains a surfactant.

The surfactant is not particularly limited, and any of an anionic surfactant, a cationic surfactant, and a nonionic surfactant can be used as long as it can form a composition for forming a protective film, and further, be dissolved in the solvent of the composition for forming a protective film.

The amount of the surfactant to be added is preferably 0.001% to 20% by mass, and more preferably 0.01% to 10% by mass.

The surfactant may be used singly or in combination of two or more kinds thereof As the surfactant, for example, one selected from an alkyl cation-based surfactant, an amide type quaternary cation-based surfactant, an ester type quaternary a cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine-based and/or silicon-based surfactant (a fluorine-based surfactant, a silicon-based surfactant, or a surfactant having both of a fluorine atom and a silicon atom) can be appropriately used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether: polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate: surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, or the like; and commercially available surfactants which will be exemplified later.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177. F120, and R08 (manufactured by DIC Corp.): SURFLON S-382, SC101, 102, 103, 104, 105, and 106 (manufactured by Asahi Glass Co., Ltd.): TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.): EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G 208G 218G 230G 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

[Other Additives]

It is preferable that the composition for forming a protective film of the present invention further contains at least one selected from the following (A1), (A2), and (A3) as an additive within a scope not impairing the effects of the present invention.

(A1) A basic compound or base generator
(A2) An ionic compound
(A3) A compound having a radical trapping group <(A1) Basic Compound or Base Generator>

It is preferable that the topcoat composition further contains at least one of a basic compound or a base generator (hereinafter also collectively referred to as an "additive" or a "compound (A1)" in some cases).

(Basic Compound)

As the basic compound which can be contained in the topcoat composition, an organic basic compound is preferable, and a nitrogen-containing basic compound is more preferable. For example, those described as a basic compound which may be contained in the actinic ray-sensitive or radiation-sensitive resin composition which will be described later can be used, and specific examples thereof include the compounds having the structures represented by Formulae (A) to (E) which will be described later.

In addition, for example, the compounds which are classified into the following (1) to (7) can be used.

(1) Compound Represented by General Formula (BS-1)

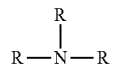

(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain. —$CH_2CH_2O$— is preferable. Specific examples thereof include tris(methoxyethoxyethyl)amine and a compound disclosed after line 60 of column 3 in the specification of U.S. Pat. No. 6,040,112.

Examples of the basic compound represented by General Formula (BS-1) include the following ones.

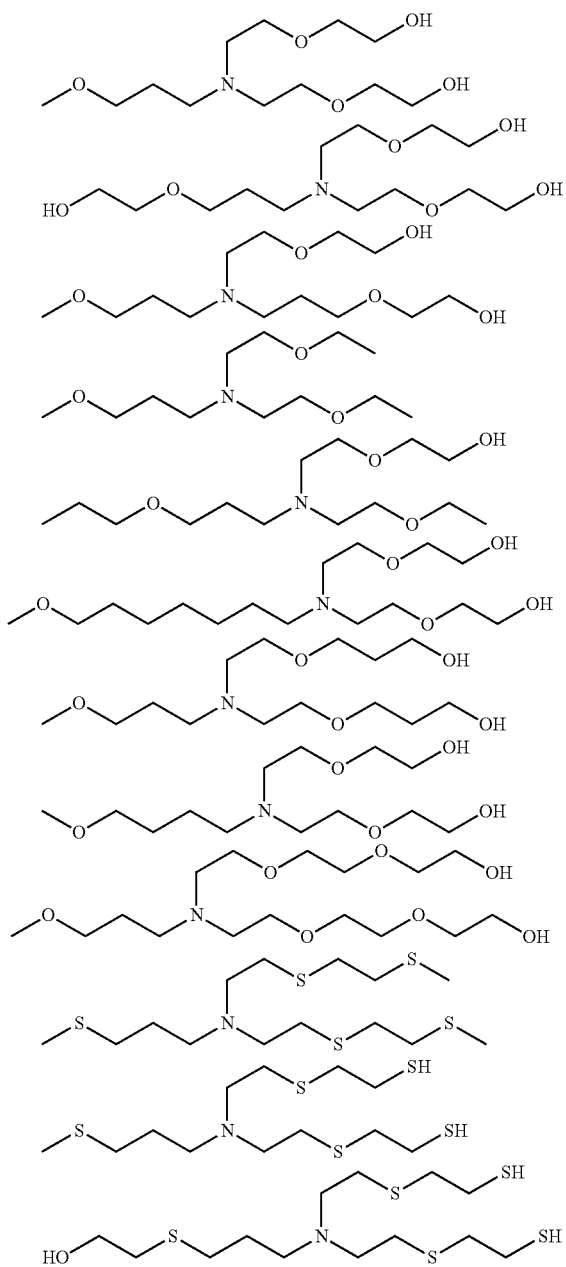

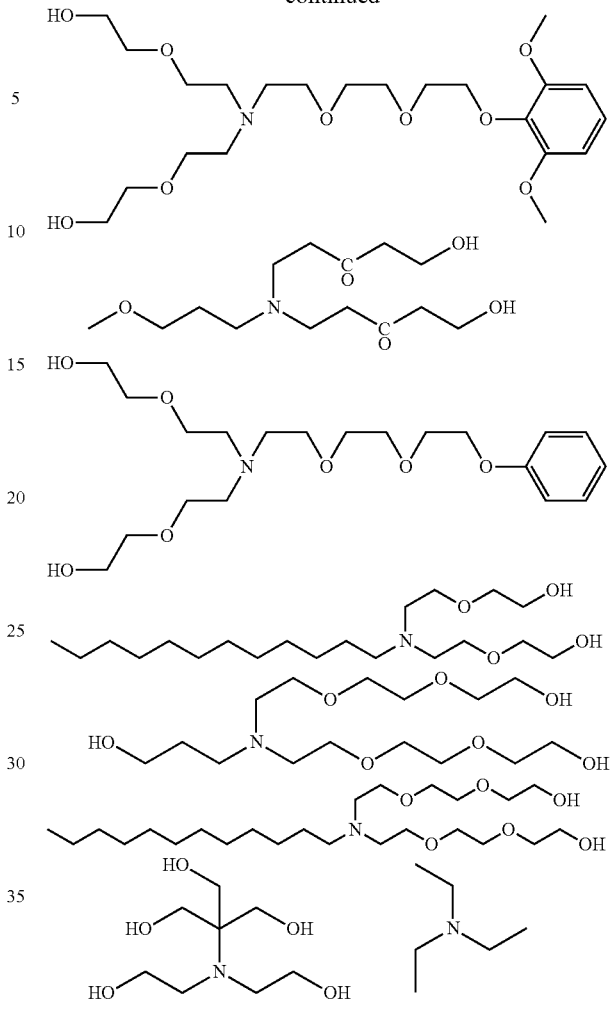

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undeca-7-ene.

(3) Ammonium Salt

An ammonium salt can also be appropriately used as the basic compound. Examples of the anion of the ammonium salt include halide, sulfonate, borate, and phosphate. Among these, halide and sulfonate are particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, and tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

(4) Compound (PA) that has Proton-Accepting Functional Group and Generates Compound in which Proton-Acceptability is Reduced or Lost, or which is Changed from being Proton-Accepting to be Acidic, by being Decomposed Upon Irradiation with Actinic Ray or Radiation The composition according to the present invention may further include a basic compound [hereinafter also referred to as a compound (PA)] that has a functional group with proton acceptor properties and generates a compound in which proton acceptor properties are reduced or lost, or which is changed from being proton-accepting to be acidic, by decomposing upon irradiation with actinic ray or radiation.

The functional group with proton acceptor properties refers to a functional group having a group or electron which is capable of electrostatically interacting with a proton, and for example, means a functional group with a macrocyclic structure, such as a cyclic polyether; or a functional group containing a nitrogen atom having an unshared electron pair not contributing to π-conjugation.

The nitrogen atom having an unshared electron pair not contributing to π-conjugation is, for example, a nitrogen atom having a partial structure represented by the following general formula.

 ⊖ Unshared Electron Pair

Preferred examples of the partial structure of the functional group with proton acceptor properties include crown ether, azacrown ether, primary to tertiary amines, pyridine, imidazole, and pyrazine structures.

The compound (PA) decomposes upon irradiation with actinic ray or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement. In the present invention, the acid dissociation constant pKa of the compound generated by the decomposition of the compound (PA) upon irradiation with actinic ray or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Co., Ltd.), and a lower value thereof indicates higher acid strength. Specifically, the acid dissociation constant pKa in an aqueous solution may be measured by using an infinite-dilution aqueous solution and measuring the acid dissociation constant at 25° C. or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by the following General Formula (PA-1), for example, as the proton adduct generated by decomposition upon irradiation with actinic ray or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

$$Q\text{-}A\text{-}(X)_n\text{—}B\text{—}R \qquad (PA\text{-}1)$$

In General Formula (PA-1),

Q represents —SO$_3$H, —CO$_2$H, or —X$_1$NHX$_2$Rf, in which Rf represents an alkyl group, a cycloalkyl group, or an aryl group, and X$_1$ and X$_2$ each independently represent —SO$_2$— or —CO—.

A represents a single bond or a divalent linking group.

X represents —SO$_2$— or —CO—.

n is 0 or 1.

B represents a single bond, an oxygen atom, or —N(Rx)Ry-, in which Rx represents a hydrogen atom or a monovalent organic group, and Ry represents a single bond or a divalent organic group, provided that Rx may be bonded to Ry to form a ring or may be bonded to R to form a ring.

R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in Rx is preferably an organic group having 1 to 30 carbon atoms, and examples thereof include an alkyl group, a cycloalkyl group, an aryl group, an aralkyl group, and an alkenyl group. These groups may further have a substituent.

The alkyl group in Rx may have a substituent, is preferably a linear and branched alkyl group having 1 to 20 carbon atoms, and may have an oxygen atom, a sulfur atom or a nitrogen atom in the alkyl chain.

Preferred examples of the divalent organic group in Ry include an alkylene group.

Other examples include a ring structure which may be formed by the mutual bonding of Rx and Ry include 5- to 10-membered rings, and particularly preferably 6-membered rings, each of which contains a nitrogen atom.

Furthermore, examples of the alkyl group having a substituent include a group formed by substituting a cycloalkyl group on a linear or branched alkyl group (for example, an adamantylmethyl group, an adamantylethyl group, a cyclohexylethyl group, and a camphor residue).

The cycloalkyl group in Rx may have a substituent, is preferably a cycloalkyl group having 3 to 20 carbon atoms, and may have an oxygen atom in the ring.

The aryl group in Rx may have a substituent, is preferably an aryl group having 6 to 14 carbon atoms.

The aralkyl group in Rx may have a substituent, is preferably an aralkyl group having 7 to 20 carbon atoms.

The alkenyl group in Rx may have a substituent and examples of the alkenyl group include a group having a double bond at an arbitrary position of the alkyl group mentioned as Rx.

The functional group with proton acceptor properties in R is the same as described above, and examples thereof include groups having nitrogen-containing heterocyclic aromatic structures or the like, such as azacrown ether, primary to tertiary amines, pyridine, and imidazole.

As the organic group having such a structure, ones having 4 to 30 carbon atoms are preferable, and examples thereof include an alkyl group, a cycloalkyl group, an aryl group, an aralkyl group, and an alkenyl group.

The alkyl group, the cycloalkyl group, the aryl group, the aralkyl group, and the alkenyl group in the alkyl group, the cycloalkyl group, the aryl group, the aralkyl group, and the alkenyl group, each including a functional group with proton acceptor properties or an ammonium group in R are the same as the alkyl group, the cycloalkyl group, the aryl group, the aralkyl group, and the alkenyl group, respectively, mentioned as Rx.

Examples of the substituent which may be contained in each of the groups include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). With regard to the cyclic structure and the aminoacyl group in the aryl group, the cycloalkyl group, or the like, examples of the substituent further include an alkyl group (preferably having 1 to 20 carbon atoms).

When B is —N(Rx)Ry-, it is preferable that R and Rx are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom, or the like. Examples of the polycyclic structure include structures formed by a combination of two or three, or more monocyclic structures. The monocyclic structure or the polycyclic structure may have a substituent, and as the substituent, for example, a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), an aminoacyl group (preferably having 2 to 20 carbon atoms), or the like is preferable. With regard to the cyclic structure in the aryl group, the cycloalkyl group, or the like, examples of the substituent include an alkyl group (preferably having 1 to 15 carbon atoms). With regard to the aminoacyl group, examples of the substituent further include an alkyl group (preferably having 1 to 15 carbon atoms).

$R_f$ in —$X_1NHX_2Rf$ represented by Q is preferably an alkyl group having 1 to 6 carbon atoms, which may have a fluorine atom, and more preferably a perfluoroalkyl group having 1 to 6 carbon atoms. Further, it is preferable that at least one of $X_1$ or $X_2$ is —$SO_2$—, with a case where both $X_1$ and $X_2$ are —$SO_2$— being more preferable.

The compound represented by General Formula (PA-1) in which the Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The functional group with proton acceptor properties may be contained in an anion moiety or a cation moiety, and it is preferable that the functional group is contained in an anion moiety.

(5) Low Molecular Compound Having Nitrogen Atom and Group Capable of Leaving by Action of Acid The topcoat composition can include a low molecular compound (hereinafter referred to as a "low molecular compound (D)" or a "compound (D)") which has a nitrogen atom and a group capable of leaving by the action of an acid. The low molecular compound (D) preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferable.

The compound (D) may have a carbamate group having a protecting group on a nitrogen atom. The protecting group constituting the carbamate group can be represented by the following General Formula (d-1).

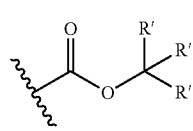
(d-1)

In General Formula (d-1),

R"s each independently represent a hydrogen atom, linear or branched alkyl group, a cycloalkyl group, an aryl group, an aralkyl group, or an alkoxyalkyl group. R"s may be bonded to each other to form a ring.

R' is preferably a linear or branched alkyl group, a cycloalkyl group, or an aryl group, and more preferably a linear or branched alkyl group or a cycloalkyl group.

Specific structures of such a group are shown below.

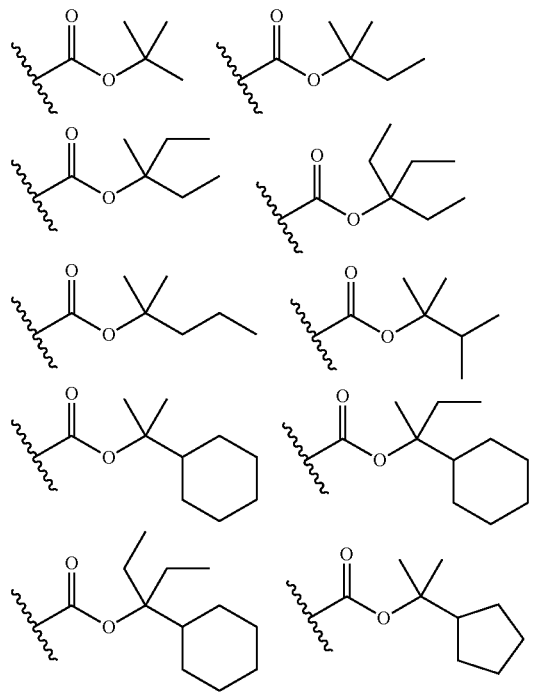

-continued

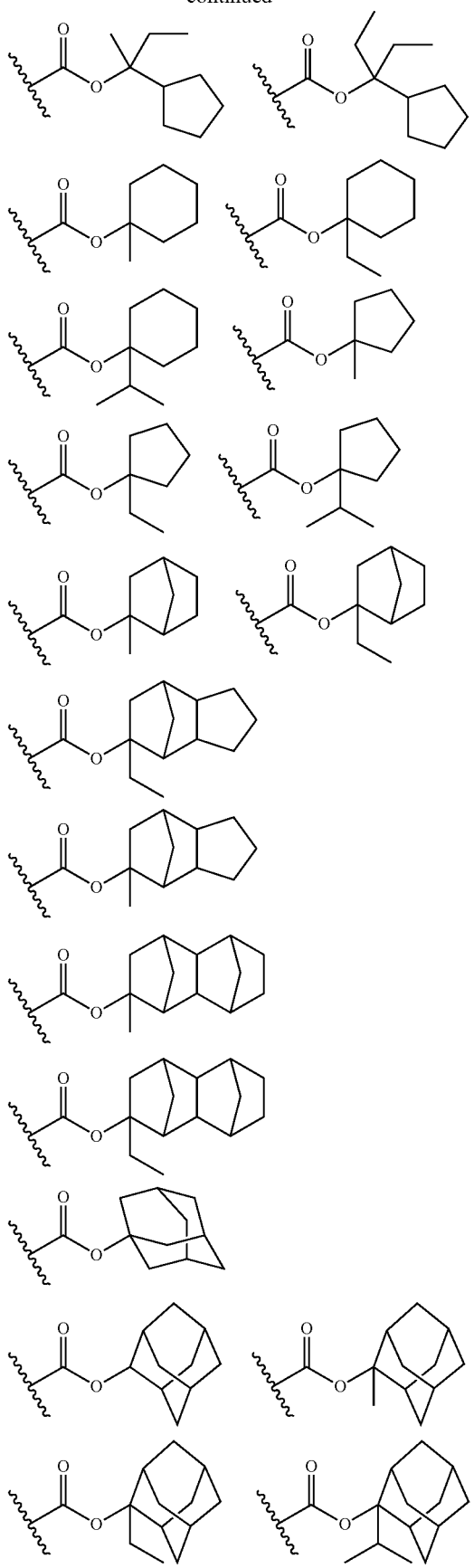

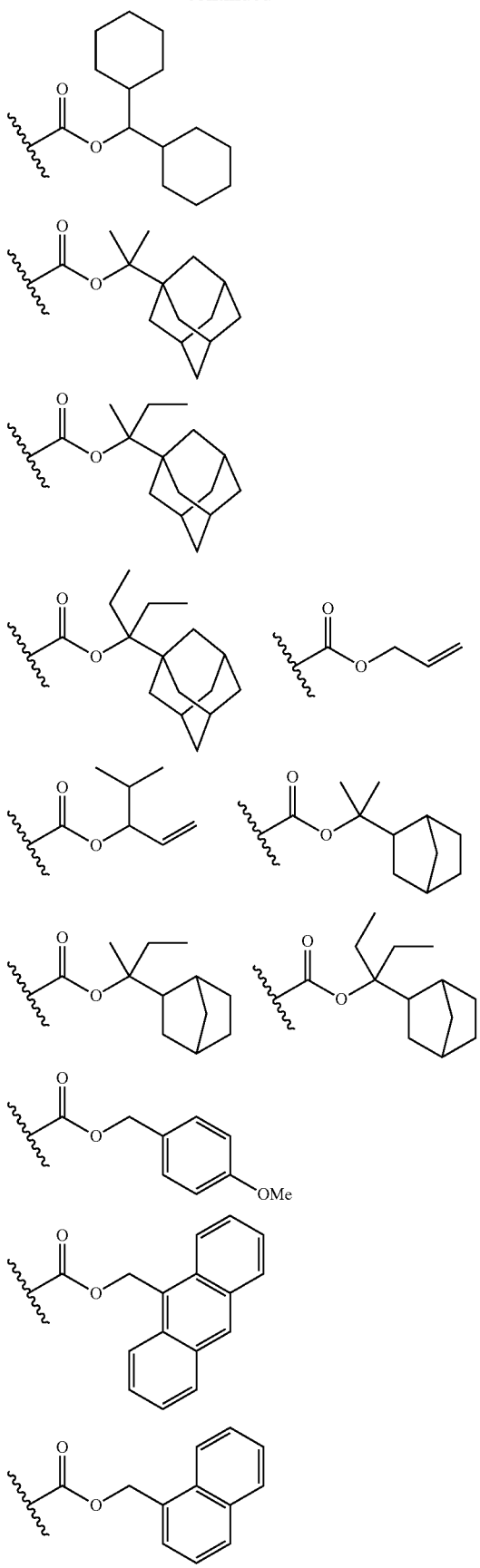

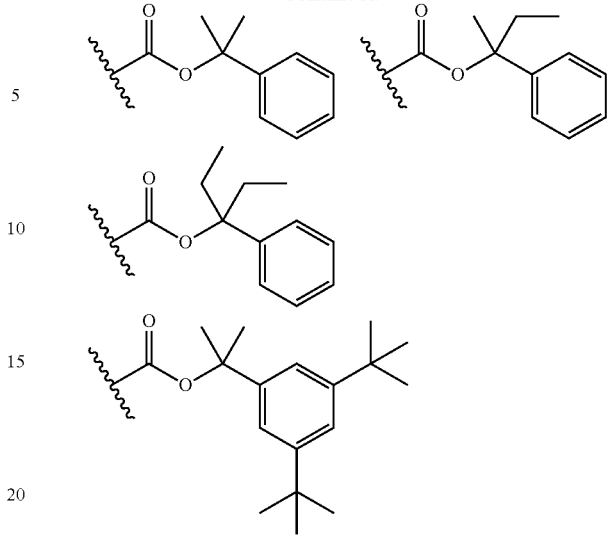

The compound (D) may also be constituted by arbitrarily combining a basic compound which will be described later with the structure represented by General Formula (d-1).

It is particularly preferable that the compound (D) has a structure represented by the following General Formula (J).

Incidentally, the compound (D) may correspond to the basic compound described above as long as it is a low molecular compound having a group capable of leaving by the action of an acid.

General Formula (J)

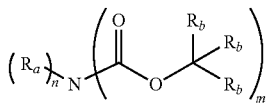

In General Formula (J), $R_a$ represents a hydrogen atom, an alkyl group, a cycloalkyl group, an aryl group, or an aralkyl group. Further, with n=2, two $R_a$'s may be the same as or different from each other, and two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group, provided that when one or more $R_b$ in —C($R_b$)($R_b$)($R_b$) are hydrogen atoms, at least one of the remaining $R_b$'s is a cyclopropyl group, a 1-alkoxyalkyl group, or an aryl group.

At least two $R_b$'s may be bonded to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In General Formula (J), the alkyl group, the cycloalkyl group, the aryl group, and the aralkyl group represented by $R_a$ and $R_b$ may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

Examples of the alkyl group, the cycloalkyl group, the aryl group, and the aralkyl group (each of the alkyl group, the cycloalkyl group, the aryl group, and the aralkyl group may be substituted with the functional group, an alkoxy group, or a halogen atom) of $R_a$ and/or $R_b$ include:

a group derived from a linear or branched alkane, such as methane, ethane, propane, butane, pentane, hexane, heptane, octane, nonane, decane, undecane, and dodecane, or a group in which the group derived from an alkane is substituted with one or more kinds of or one or more groups of cycloalkyl groups such as a cyclobutyl group, a cyclopentyl group, and a cyclohexyl group;

a group derived from a cycloalkane, such as cyclobutane, cyclopentane, cyclohexane, cycloheptane, cyclooctane, norbornane, adamantane, and noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group, a group derived from an aromatic compound, such as benzene, naphthalene, and anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group, a group derived from a heterocyclic compound, such as pyrrolidine, piperidine, morpholine, tetrahydrofuran, tetrahydropyran, indole, indoline, quinoline, perhydroquinoline, indazole, and benzimidazole, or a group in which the group derived from a heterocyclic compound is substituted with one or more kinds of or one or more groups of linear or branched alkyl groups or aromatic compound-derived groups, a group in which the group derived from a linear or branched alkane or the group derived from a cycloalkane is substituted with one or more kinds of or one or more groups of aromatic compound-derived groups such as a phenyl group, a naphthyl group, and an anthracenyl group; and a group in which the substituent above is substituted with a functional group such as a hydroxyl group, a cyano group, an amino group, a pyrrolidino group, a piperidino group, a morpholino group, and an oxo group.

Moreover, examples of the divalent heterocyclic hydrocarbon group (preferably having 1 to 20 carbon atoms) formed by the mutual bonding of $R_a$'s, or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group in which the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group, and an oxo group.

Specific examples of the particularly preferred compound (D) in the present invention include the compounds described in paragraphs [0786] to [0788] of JP2013-83966A, but the present invention is not limited thereto.

The compound represented by General Formula (J) can be synthesized in accordance with JP2007-298569A, JP2009-199021A, or the like.

In the present invention, the low molecular compound (D) may be used singly or as a mixture of two or more kinds thereof.

Other examples of the basic compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543-553 (1995), or the like can be used.

As the basic compound, a compound called a so-called photodisintegrating base may also be used. Examples of the photodisintegrating base include an onium salt of carboxylic acid, and an onium salt of sulfonium acid having the α-position which is not fluorinated. Specific examples of the photodisintegrating base include those in paragraph 0145 of WO2014/133048A1, JP2008-158339A, and JP399146B.

(Content of Basic Compound)

The content of the basic compound in the topcoat composition is preferably 0.01% to 5% by mass, more preferably 0.01% to 1% by mass, and still more preferably 0.01% to 0.5% by mass, with respect to the solid content of the topcoat composition.

(Base Generator)

Examples of the base generator (photobase generator) which can be added to the composition of the present invention include compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A can also be appropriately used.

Specific suitable examples of the photobase generator include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate, but are not limited thereto.

(Content of Base Generator)

The content of the base generator in the topcoat composition is preferably 0.01% to 20% by mass, more preferably 0.1% to 10% by mass, and still more preferably 1% to 5% by mass, with respect to the solid content of the topcoat composition.

<(A2) Ionic Compound>

The topcoat composition can contain an ionic compound which becomes a relatively weak acid with respect to the acid generator. As the ionic compound, an onium salt is preferable. When the acid generated from the acid generator upon irradiation with actinic ray or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by the following General Formulae (d1-1) to (d1-3) are preferable.

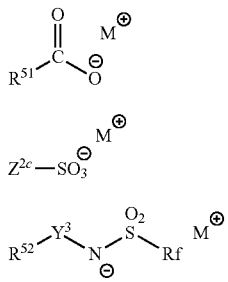

(d1-1)

(d1-2)

(d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group containing a fluorine atom, and $M^+$'s are each independently a sulfonium or iodonium cation.

Preferred examples of the sulfonium cation or the iodonium cation represented by $M^+$ include the sulfonium cations exemplified by an acid generator (ZI) and the iodonium cations exemplified by (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (CA)") having a cationic moiety and an anionic moiety in the same molecule in which the cationic moiety and the anionic moiety are linked to each other via a covalent bond.

As the compound (CA), a compound represented by any one of the following General Formulae (C-1) to (C-3) is preferable.

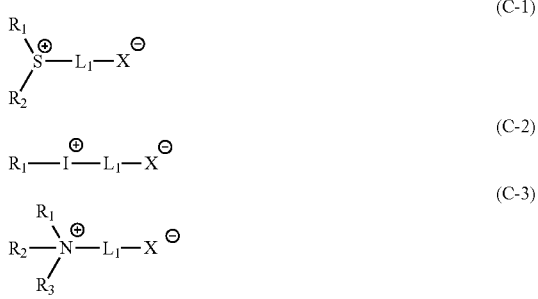

(C-1)

(C-2)

(C-3)

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. R$_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched chained alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably alkylene group, an arylene group, an ether bond, ester bond, and a group formed by a combination of two or more kinds of these groups.

Preferred examples thereof the compound represented by General Formula (C-1) include the compounds exemplified in paragraphs [0037] to [0039] of JP2013-6827A and paragraphs [0027] to [0029] of JP2013-8020A.

Preferred examples thereof the compound represented by General Formula (C-2) include the compounds exemplified in paragraphs [0012] to [0013] of JP2012-189977A.

Preferred examples thereof the compound represented by General Formula (C-3) include the compounds exemplified in paragraphs [0029] to [0031] of JP2012-252124A.

(Content of Onium Salt)

The content of the onium salt in the topcoat composition is preferably 0.5% by mass or more, more preferably 1% by mass or more, and still more preferably 2.5% by mass or more, with respect to the solid content of the topcoat composition.

On the other hand, the upper limit of content of the onium salt in the topcoat composition is preferably 25% by mass or less, more preferably 20% by mass or less, still more preferably 10% by mass or less, and particularly more preferably 8% by mass or less, with respect to the solid content of the topcoat composition.

<(A3) Compound Having Radical Trapping Group>

The compound (A3) having a radical trapping group is also referred to as a compound (A3).

The radical trapping group is a group that traps an active radical and stops a radical reactions. Examples of such a radical trapping group include a group that reacts with a radical and is converted to a stable free radical, and a group having a stable free radical.

Examples of such a compound having a radical trapping group include hydroquinone, catechol, benzoquinone, a nitroxyl radical compound, an aromatic nitro compound, an N-nitroso compound, benzothiazole, dimethylaniline, phenothiazine, vinylpyrene, and derivatives thereof.

Furthermore, specific suitable examples of the radical trapping group not having basicity include at least one group selected from the group consisting of a hindered phenol group, a hydroquinone group, an N-oxy-free radical group, a nitroso group, and a nitron group.

The number of the radical trapping groups contained in the compound (A3) is not particularly limited, but in a case where the compound (A3) is a compound other than a polymer compound, the number of radical trapping groups within one molecule is preferably 1 to 10, more preferably 1 to 5, and still more preferably 1 to 3.

On the other hand, in a case where the compound (A3) is a polymer compound having a repeating unit, it preferably has 1 to 5 repeating units having a radical trapping group, and more preferably has 1 to 3 repeating units having a radical trapping group. Further, the compositional ratio of the repeating units having a radical trapping group in the polymer compound is preferably 1% to 100% by mole, more preferably 10%6 to 100% by mole, and still more preferably 30% to 100% by mole.

As the compound (A3) having a radical trapping group, a compound having a nitrogen-oxygen bond is preferable, and a compound represented by any one of the following General Formulae (1) to (3) is more preferable.

Furthermore, a compound represented by the following General Formula (1) corresponds to a compound having an N-oxy-free radical group, a compound represented by the following General Formula (2) corresponds to a compound having a nitroso group, and a compound represented by the following General Formula (3) corresponds to a compound having a nitron group.

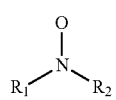

(1)

(2)

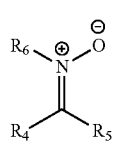

(3)

In General Formulae (1) to (3), $R_1$ to $R_6$ each independently represent an alkyl group, a cycloalkyl group, or an aryl group. In Formula (1), $R_1$ and $R_2$ may be bonded to each other to form a ring, and in Formula (3), at least two of $R_4$ to R may be bonded to each other to form a ring.

The alkyl group, the cycloalkyl group, and the aryl group, represented by each of $R_1$ to $R_6$, the ring formed by the mutual bonding of $R_1$ and $R_2$, and the ring formed by the mutual bonding of at least two of $R_4$ to $R_6$ may have a substituent.

Examples of the alkyl group represented by each of $R_1$ to $R_6$ include a linear or branched alkyl group having 1 to 10 carbon atoms, and specific examples thereof include a methyl group, an ethyl group, an n-propyl group, an i-propyl group, an n-butyl group, a 2-methylpropyl group, a 1-methylpropyl group, a t-butyl group, an n-pentyl group, neopentyl group, and an n-hexyl group, and among those, a methyl group, an ethyl group, an n-butyl group, or a t-butyl group is preferable.

Examples of the cycloalkyl group represented by each of $R_1$ to $R_6$ include cycloalkyl groups having 3 to 15 carbon atoms, and specific suitable examples thereof include a cyclopropyl group, a cyclobutyl group, a cyclopentyl group, a cyclohexyl group, a cycloheptyl group, a cyclooctyl group, a norbornyl group, and an adamantyl group.

Examples of the aryl group represented by each of $R_1$ to $R_6$ include aryl groups having 6 to 14 carbon atoms, and specific suitable examples thereof include a phenyl group, tolyl group, and a naphthyl group.

The ring which may be formed by $R_1$ and $R_2$, and the ring which may be formed by $R_4$ to $R_6$ are each preferably a 5- to 10-membered ring, and more preferably a 5- or 6-membered ring.

Examples of the substituent which can be contained in the alkyl group, the cycloalkyl group, and the aryl group represented by each of $R_1$ to $R_6$, the ring formed by the bonding of $R_1$ and $R_2$, and the ring which may be formed by the bonding of at least two of $R_4$ to $R_6$ include a halogen atom (for example, a fluorine atom), a hydroxyl group, a carboxyl group, a cyano group, a nitro group, an amino group, oxy group, an alkoxy group, an alkoxyalkyl group, an alkoxycarbonyl group, an alkoxycarbonyloxy group, an acylamide group (RCONH—: R is a substituted or unsubstituted alkyl group or phenyl group). —$SO_2Na$, and —$P(=O)(OC_2H_5)_2$.

Examples of the substituent which can be contained in the cycloalkyl group and the aryl group represented by each of $R_1$ to $R_6$ further include an alkyl group.

Furthermore, the compound represented by any one of General Formulae (1) to (3) may be in a form of a resin, and in this case, at least one of $R_1$ to $R_6$ may be bonded to the main chain or the side chain of the resin.

Specific examples of the compound (A3) having a radical trapping group are shown below, but the present invention is not limited thereto.

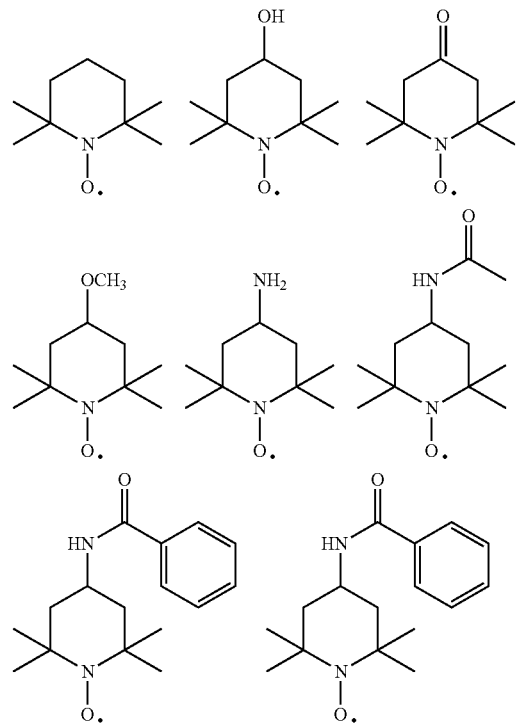

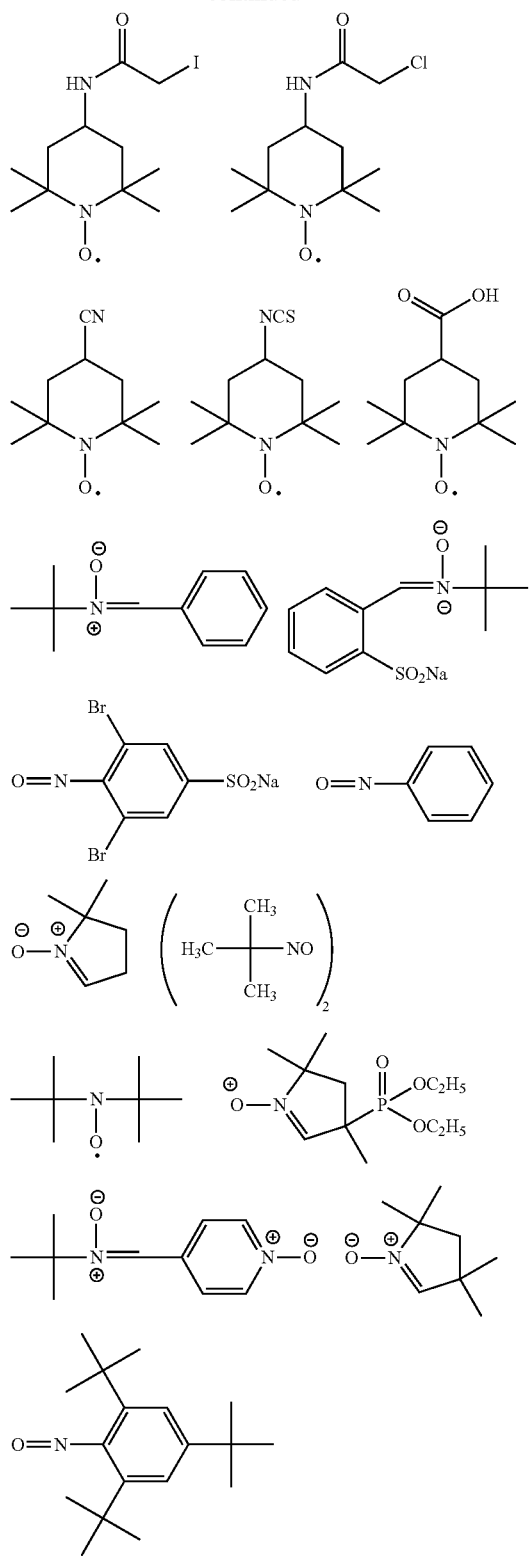

Furthermore, as described above, the compound (A3) may be a polymer compound having a repeating unit. Specific examples of the repeating unit contained in the compound (A3) which is a polymer compound are shown below, but the present invention is not limited thereto.

In a case where the compound (A3) having a radical trapping group is a low molecular compound, the molecular weight is not particularly limited, and the molecular weight is preferably 100 to 5,000, more preferably 100 to 2,000, and still more preferably 100 to 1,000.

Furthermore, in a case where the compound (A3) having a radical trapping group is a polymer compound having a repeating unit, the weight-average molecular weight is preferably 5,000 to 20,000, and more preferably 5,000 to 10,000.

As the compound (A3) having a radical trapping group, a compound that is a commercially available product may be used, and a compound synthesized by a known method may be used. Further, the compound (A3) may be synthesized by the reaction of a commercially available low molecular compound having a radical trapping group with a polymer compound having a reactive group such as an epoxy group, a halogenated alkyl group, an acid halide group, a carboxyl group, and an isocyanate group.

The content of the compound (A3) having a radical trapping group is usually 0.001% to 10% by mass, and preferably 0.01% to 5% by mass, with respect to the total solid content of the topcoat composition.

The topcoat composition may include a plurality of one kind of compound selected from the group consisting of (A1) to (A3). For example, the topcoat composition may also include two or more kinds of the distinctive compounds (A1).

In addition, the topcoat composition may contain two or more kinds of compounds selected from the group consisting of (A1) to (A3). For example, the topcoat composition may also contain both of the compound (A1) and the compound (A2).

In a case where the topcoat composition includes a plurality of compounds selected from the group consisting of (A1) to (A3), the total content of the compounds is usually 0.001% to 20% by mass, preferably 0.01% to 10% by mass, and more preferably 1% to 8% by mass, with respect to the total solid content of the topcoat composition.

The compound (A3) having a radical trapping group may be used singly or in combination of two or more kinds thereof.

[Method for Preparing Composition for Forming Protective Film]

It is preferable that the composition for forming a protective film of the present invention is used by dissolving the respective components described above in a solvent, and filtering the solution through a filter. The filter is preferably a polytetrafluoroethylene-, polyethylene-, or nylon-made filter having a pore size of 0.1 µm or less, more preferably 0.05 µm or less, and still more preferably 0.03 µm or less. Further, the filter may be used by connecting a plurality of kinds of filters in series or in parallel. In addition, the composition may be filtered a plurality of times, and the step of performing filtration a plurality of times may be a circular filtration step. Furthermore, the composition may be subjected to a deaeration treatment or the like before and after filtration through a filter. It is preferable that the topcoat composition of the present invention includes no impurities such as a metal. The content of the metal components included in the these materials is preferably 10 ppm or less, more preferably 5 ppm or less, still more preferably 1 ppm or less, and particularly preferably, metal components are not substantially contained (no higher than the detection limit of a measurement device).

<Pattern Forming Method>

As described above, the pattern forming method of the present invention includes:

a step of coating an actinic ray-sensitive or radiation-sensitive resin composition onto a substrate to form an actinic ray-sensitive or radiation-sensitive film, a step of coating a composition for forming a protective film on the actinic ray-sensitive or radiation-sensitive film to form a protective film (topcoat).

a step of exposing the actinic ray-sensitive or radiation-sensitive film covered with the protective film, and a step of developing the exposed actinic ray-sensitive or radiation-sensitive film using a developer containing an organic solvent.

In one embodiment, the pattern forming method of the present invention may include a heating step, and the heating step may be included plural times.

Furthermore, in one embodiment, the pattern forming method of the present invention may include an exposing step plural times.

In addition, in one embodiment, the pattern forming method of the present invention may include a developing step plural times, and for example, a developing step using a developer including an aqueous alkali solution may further be included.

Moreover, in one embodiment, the pattern forming method of the present invention may include a rinsing step plural times.

In addition, in one embodiment, the pattern forming method of the present invention may include a step in which in an organic solvent developing step, a protective film can be released at the same time as an organic solvent development by dissolving the protective film in an organic solvent developer, or besides the organic solvent developing step, a step of removing the protective film using a predetermined release agent may also be included.

The respective steps included in the pattern forming method of the present invention will be described in detail.

<Step of Forming Actinic Ray-Sensitive or Radiation-Sensitive Film>

The actinic ray-sensitive or radiation-sensitive resin composition can be coated on a substrate using any of methods by which the actinic ray-sensitive or radiation-sensitive composition can be coated on the substrate. A spin coating method, a spray method, a roll coating method, a dip method, or the like, known in the related art, can be used, and the resist composition being preferably coated by the spin coating method.

The substrate on which the film is formed is not particularly limited, and it is possible to use an inorganic substrate such as silicon, SiN, $SiO_2$, and TiN, and a coating-type inorganic substrate such as SOG, or a substrate generally used in a process for manufacturing a semiconductor such as an IC, a process for manufacturing a circuit board for a liquid crystal, a thermal head, or the like, and other lithographic processes for fabrication.

Before forming the actinic ray-sensitive or radiation-sensitive film, an antireflection film may be applied onto the substrate in advance.

As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV-30 series or DUV-40 series manufactured by Brewer Science, Inc., AR-2, AR-3, or AR-5 manufactured by Shipley Company, L.L.C., or ARC series such as ARC29A manufactured by Chemical Industries, Ltd. can also be used.

Furthermore, the actinic ray-sensitive or radiation-sensitive resin composition which can be used will be described in detail in the following descriptions.

<Step of Forming Protective Film>

The pattern forming method of the present invention includes a step of coating the above-mentioned composition for forming a protective film on the actinic ray-sensitive or radiation-sensitive film to forming a protective film (topcoat) before carrying out a step of exposing the actinic ray-sensitive or radiation-sensitive film using an organic solvent developer after the step of forming the actinic ray-sensitive or radiation-sensitive film. Functions required for the topcoat are coating suitability onto the actinic ray-sensitive or radiation-sensitive film, radiation, transparency, particularly to light at 193 nm, and poor solubility in an immersion liquid (preferably water). Further, it is preferable that the actinic ray-sensitive or radiation-sensitive resin composition is not mixed with the actinic ray-sensitive or radiation-sensitive film, and can be uniformly coated on the surface of the actinic ray-sensitive or radiation-sensitive film.

A method for coating the composition for forming a protective film is not particularly limited, for example, a spin coating method or the like can be applied.

The film thickness of the protective film (the film thickness after the "PB Process before Forming Protective Film" which will be described) is not particularly limited, but from the viewpoint of transparency to an exposure light source, the film is formed, which has a thickness of usually 1 nm to 300 nm, preferably 10 nm to 300 nm, more preferably 20 nm to 200 nm, and still more preferably 30 nm to 100 nm.

After forming the protective film, the substrate is heated, if desired.

From the viewpoint of resolution, it is preferable that the refractive index of the protective film is close to that of the actinic ray-sensitive or radiation-sensitive film.

The protective film is preferably insoluble in an immersion liquid, and more preferable insoluble in water.

From the viewpoint of immersion liquid tracking properties, with regard to the receding contact angle of the protective film, the receding contact angle (23° C.) of the immersion liquid with respect to the protective film is preferably 70 degrees to 100 degrees, and more preferably 80 to 100 degrees. The receding contact angle (23° C.) of water with respect to the protective film is preferably 70 degrees to 100 degrees, and the most preferably, the receding contact angle (23° C.) of water with respect to the protective film is 80 degrees to 100 degrees.

In a case where the exposing step in the pattern forming method of the present invention is a liquid immersion exposing step, since the immersion liquid needs to move on a wafer following the movement of an exposure head that is scanning the wafer at a high speed and forming an exposure pattern, the contact angle of the immersion liquid with respect to the actinic ray-sensitive or radiation-sensitive film in a dynamic state is important, and in order to obtain better resist performance, the immersion liquid preferably has a receding contact angle in the above range.

<Step of Peeling Protective Film>

As described above, when the protective film is released, an organic solvent developer may be used, and another release agent may also be used. In a case of carrying out the release separately from the developing step, the release time is preferably a period of time after exposure, and in a case of including a PEB step which will be described later, a period of time after PEB is more preferable. As the release agent, a solvent hardly permeating the actinic ray-sensitive or radiation-sensitive film is preferable. In a view that the release of the protective film can be carried out simultaneously with the development of the actinic ray-sensitive or radiation-sensitive film, the protective film is preferably releasable with an organic solvent developer. The organic solvent developer used for the release is not particularly limited as long as it makes it possible to dissolve and remove an unexposed area of the actinic ray-sensitive or radiation-sensitive film. The organic solvent developer can be selected from developers including a polar solvent such as a ketone-based solvent, an ester-based solvent, an alcohol-based solvent, an amide-based solvent, an ether-based solvent, and a hydrocarbon-based solvent, which will be described later. A developer including a ketone-based solvent, an ester-based solvent, an alcohol-based solvent, or an ether-based solvent is preferably used, a developer including an ester-based solvent is more preferably used, and a developer including butyl acetate is still more preferably used. From the viewpoint of release with an organic solvent developer, the dissolution rate of the topcoat in the organic solvent developer is preferably 1 nm/sec to 300 nm/sec, and more preferably 10 nm/sec to 100 nm/sec.

Here, the dissolution rate of the protective film in the organic solvent developer refers to a film thickness decreasing rate when the protective film is exposed to a developer after film formation, and is a rate at a time of dipping a butyl acetate solution at 23° C. in the present invention.

By setting the dissolution rate of the protective film in the organic solvent developer to 1 nm/sec or more, and preferably 10 nm/sec or more, an effect of reducing development defects after development is attained. Further, by setting the dissolution rate to 300 nm/sec or less, and preferably 100 nm/sec, as an effect of reducing the exposure unevenness during liquid immersion exposure, an effect that the line edge roughness of a pattern after the development of the film becomes better is attained.

The protective film may also be removed using other known developers, for example, an aqueous alkali solution. Specific examples of the usable aqueous alkali solution include an aqueous tetramethylammonium hydroxide solution.

<Exposing Step>

The exposure of the actinic ray-sensitive or radiation-sensitive film can be carried out by a generally known method. Preferably, the actinic ray-sensitive or radiation-sensitive film is irradiated with actinic ray or radiation through a predetermined mask. The exposure dose can be appropriately set, but is usually 1 to 100 mJ/cm$^2$.

The wavelength of the light source used in the exposure device in the present invention is not particularly limited, but light at a wavelength of 250 nm or less is preferably used, and examples of include KrF excimer laser light (248 nm). ArF excimer laser light (193 nm). $F_2$ excimer laser light (157 nm), EUV light (13.5 nm), and electron beams. Among these, ArF excimer laser light (193 nm) is preferably used.

In a case of carrying out the exposing step, (1) after forming a film on a substrate and before the exposing step, and/or (2) after the exposing step and before the step of heating the film, a step of cleaning the surface of the film with a water-based chemical may also be carried out.

In a case of carrying out the immersion liquid exposure, the immersion liquid is preferably a liquid which is transparent for exposure wavelength and has a minimum temperature coefficient of a refractive index so as to minimize the distortion of an optical image projected on the film. In particular, in a case where the exposure light source is an ArF excimer laser (wavelength; 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the actinic ray-sensitive or radiation-sensitive film on a substrate, and gives a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the resist film by the incorporation of impurities.

In addition, in a view of further improving the refractive index, a medium having a refractive index of 1.5 or more can also be used. This medium may be an aqueous solution or an organic solvent.

The pattern forming method of the present invention may also have the exposing step plural times. In the case, exposure to be carried out plural times may also use the same light source or different light sources, but for the first exposure, ArF excimer laser light (wavelength; 193 nm) is preferably used.

<Organic Solvent Developing Step>

The pattern forming method of the present invention includes a step of carrying out development using an organic solvent developer.

As the organic solvent developer that can be used in the organic solvent development, a polar solvent such as a ketone-based solvent, an ester-based solvent, an alcohol-based solvent, an amide-based solvent, and an ether-based solvent, or a hydrocarbon-based solvent can be used. Further, a mixed solvent thereof may also be used. A ketone-based solvent such as 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, and propylene carbonate, or an ester-based solvent such as methyl acetate, butyl acetate, ethyl acetate, isopropyl acetate, isoamyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutylacetate, 3-methyl-3-methoxybutylacetate, methyl formate, ethyl formate, butyl formate, propyl formate, ethyl lactate, butyl lactate, propyl lactate, methyl 2-hydroxyisobutyrate, and butyl butanoate can be used.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether, ethylene glycol, propylene glycol, diethylene glycol monomethyl ether, triethylene glycol monoethyl ether, and methoxymethylbutanol.

Examples of the ether-based solvent includes dioxane and tetrahydrofuran, in addition to the glycol ether-based solvents.

Examples of the amide-based solvent include N-methyl-2-pirroridone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene, xylene, and anisole, and aliphatic hydrocarbon-based solvents such as pentane, hexane, octane, and decane.

The solvent is used by mixing two or more thereof or used by mixing the solvent with other solvents or water.

Examples of the developing method include a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate spun at a constant rate while scanning a developer discharging nozzle at a constant rate (a dynamic dispense method).

The vapor pressure of the negative tone developer is preferably 5 kPa or less, more preferably 3 kPa or less, and most preferably 2 kPa or less at 20° C. By setting the vapor pressure of the negative tone developer to 5 kPa or less, evaporation of the developer on the substrate or in a development cup is suppressed, the temperature evenness in the wafer surface is improved, and as a result, the dimensional evenness in the wafer surface is improved.

Specific examples of the developer having a vapor pressure of 2 kPa or less at 20° C. include ketone-based solvents such as 1-octanone, 2-octanone, 1-nonanone, 2-nonanone, 4-heptanone, 2-hexanone, diisobutyl ketone, cyclohexanone, methyl cyclohexanone, and phenyl acetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol: glycol ether-based solvents such as ethylene glycol monomethyl ether, propylene glycol monomethyl ether, ethylene glycol, propylene glycol, diethylene glycol monomethyl ether, triethylene glycol monoethyl ether, and methoxymethylbutanol: amide-based solvents such as N-methyl-2-pyrrolidone, N,N-dimethyl acetamide, and N,N-dimethyl formamide; aromatic hydrocarbon-based solvents such as xylene; and aliphatic hydrocarbon-based solvents such as octane and decane.

An appropriate amount of a surfactant can be added to the developer that can be used when negative tone development is carried out, if necessary.

The surfactant is not particularly limited, and for example, ionic or nonionic fluorine-based and/or silicon-based surfactants, or the like can be used. Examples of the fluorine-based and/or the silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720, 5,360,692, 5,529,881 , 5,296,330, 5,436,098, 5,576,143, 5,294,511 , and 5,824,451. The surfactant is preferably a nonionic surfactant. The nonionic surfactant is not particularly limited, but a fluorine-based surfactant or a silicon-based surfactant is more preferably used.

Furthermore, the amount of the surfactant to be used is usually 0.001% to 5% by mass, preferably 0.005% to 2% by mass, and more preferably 0.01% to 0.5% by mass, with respect to the total amount of the developer.

The organic solvent developer may include a basic compound. Specific examples and preferred examples of the basic compound that can be included in the organic solvent developer used in the present invention are the same as those which will be described later as the basic compound that can be included in the actinic ray-sensitive or radiation-sensitive resin composition.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate spun at a constant rate while scanning a developer discharging nozzle at a constant rate (a dynamic dispense method).

<Rinsing Step>

In addition, after the step of carrying out the organic solvent development, a rinsing step of stopping the development while replacing the solvent with another solvent may also be included.

The rinsing liquid that is used in the rinsing step after carrying out organic solvent development is not particularly limited as long as it does not dissolve the resist pattern, and a solution including a general organic solvent can be used. As the rinsing liquid, for example, a rinsing liquid containing at least one organic solvent selected from a hydrocarbon-based solvent, a ketone-based solvent, an ester-based solvent, an alcohol-based solvent, an amide-based solvent, or an ether-based solvent, described above as the organic solvent included in the organic solvent developer is preferably used. More preferably, a step of carrying out cleaning using a rinsing liquid containing at least one kind of organic solvent selected from a hydrocarbon-based solvent, a ketone-based solvent, an ester-based solvent, an alcohol-based solvent, and an amide-based solvent is carried out after the negative tone development. Still more preferably, a step of carrying out cleaning using a rinsing liquid containing a hydrocarbon-based solvent, an alcohol-based solvent, or an ester-based solvent is carried out after the negative tone development. Particularly preferably, a step of carrying out cleaning using a rinsing liquid containing a monohydric alcohol is carried out after the negative tone development. Here, examples of the monohydric alcohol used in the rinsing step after the negative tone development include linear, branched, or cyclic monohydric alcohols, and specifically, 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, or the like can be used, with 1-hexanol, 2-hexanol, 1-pentanol, or 3-methyl-1-butanol being preferable.

The respective components in plural numbers may be mixed, or the components may be mixed with an organic solvents other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid which is used after the organic solvent development is preferably from 0.05 kPa to 5 kPa, more preferably from 0.1 kPa to 5 kPa, and the most preferably from 0.12 kPa to 3 kPa, at 20° C. By setting the vapor pressure of the rinsing liquid to a range from 0.05 kPa to 5 kPa, the temperature evenness within a wafer plane is improved, and further, the dimensional evenness within a wafer plane is enhanced by inhibition of swelling due to the penetration of the rinsing liquid.

The rinsing liquid can also be used after adding an appropriate amount of a surfactant thereto.

In the rinsing step, the wafer which has been subjected to organic solvent development is subjected to a cleaning treatment using the rinsing liquid including an organic solvent. A method for the cleaning treatment is not particularly limited, and for example, a method in which a rinsing liquid is continuously discharged on a substrate rotated at a constant rate (a spin coating method), a method in which a substrate is immersed in a bath filled with a rinsing liquid for a certain period of time (a dip method), a method in which a rinsing liquid is sprayed onto a substrate surface (a spray method), or the like, can be applied. Among these, a method in which a cleaning treatment is carried out using the spin coating method, and a substrate is rotated at a rotation speed of 2,000 rpm to 4,000 rpm after cleaning, and then the rinsing liquid is removed from the substrate, is preferable.

<Alkali Developing Step>

The pattern forming method of the present invention may further include a step of carrying out development using an alkali developer.

As the alkali developer, for example, alkali aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethyl ethanolamine and triethanolamine, quaternary ammonium salts such as tetramethylammonium hydroxide and tetraethylammonium hydroxide, cyclic amines such as pyrrole and piperidine, or the like can be used. Among these, an aqueous tetraethylammonium hydroxide solution is preferably used.

Moreover, the alkali aqueous solution can also be used after adding an appropriate amount of alcohols or a surfactant thereto.

The alkali concentration of the alkali developer is usually 0.01% to 20% by mass.

The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

As the rinsing liquid in the rinsing step which is carried out after the alkali developing step, pure water is used, or can also be used after adding an appropriate amount of a surfactant thereto.

Furthermore, after the developing treatment or the rinsing treatment, a treatment for removing the developer or rinsing liquid adhering on the pattern by a supercritical fluid may be carried out.

In addition, a heating treatment can be carried out in order to remove moisture content remaining in the pattern after the rinsing treatment or the treatment using a supercritical fluid.

[Heating Step]

The pattern forming method of the present invention may further include a heating step, and may also include the heating step plural times.

In one embodiment, the pattern forming method of the present invention preferably includes a preheating step (hereinafter also referred to as a "PB" (Prebake; PB) or "prebake")) after forming the actinic ray-sensitive or radiation-sensitive film and/or after forming the protective film.

That is, the pattern forming method of the present invention may also include a prebake step between the step of forming an actinic ray-sensitive or radiation-sensitive film and the step of forming a protective film, or between the step of forming a protective film and the exposing step, both of which the prebake step may be included. By the prebake, insoluble remaining solvents are removed, whereby a uniform film can be formed. Hereinafter, the prebake step that is carried out between the step of forming an actinic ray-sensitive or radiation-sensitive film and the step of forming a protective film is referred to as a "PB step before forming a protective film", and the prebake step that is carried out between the step of forming a protective film and the exposing step is referred to as a "PB step after forming the protective film" or the like.

The heating temperature in the PB step before forming the protective film is, for example, preferably 50° C. to 160° C., and more preferably 60° C. to 140° C.

The heating temperature in the PB step after forming the protective film is, for example, preferably 80° C. to 160° C., more preferably 100° C. to 150° C., still more preferably 110° C. to 145° C. and particularly preferably 120° C. to 140° C. By setting a higher prebake temperature after forming the protective film, the low molecular components easily gather on the side of the resist film of the topcoat, and thus, an effect of improving DOF becomes higher.

The compound (A) is preferably a compound that is not removed is preferably a compound that is not removed from the protective film by the PB step after forming the protective film, compound (A) is preferably different from, for example, a compound which will be described later as a solvent of the actinic ray-sensitive or radiation-sensitive resin composition.

Furthermore, in another embodiment, the pattern forming method of the present invention preferably includes a post exposure bake (PEB) step after the exposing step and before the developing step. By the PEB, the reaction of the exposed area is promoted, and the sensitivity or the pattern profile is improved.

The heating temperature in the PEB step is preferably, for example, 40° C. to 160° C.

The heating time in any of the PB step and the PEB step is not particularly limited, and is preferably, for example, 30 to 300 seconds, more preferably 30 to 180 seconds, and still more preferably 30 to 90 seconds.

Heating may be carried out using an ordinary means installed in an exposure device or a development device, or may also be carried out using a hot plate, or the like.

<Actinic Ray-Sensitive or Radiation-Sensitive Resin Composition>

Next, the actinic ray-sensitive or radiation-sensitive resin composition which is suitably used in the pattern forming method of the present invention will be described.

<Actinic Ray-Sensitive or Radiation-Sensitive Resin Composition>

(A) Resin Whose Polarity Increases by Action of Acid

The resin whose polarity increases by the action of an acid, which is used in the actinic ray-sensitive or radiation-sensitive resin composition of the present invention is preferably a resin (also referred to as an "acid-decomposable resin," an "acid-decomposable resin (A)," or a "resin (A)") having a group (hereinafter also referred to as an "acid-decomposable group") that decomposes by the action of an acid to generate an alkali-soluble group in either the main chain or the side chain of the resin, or at both the main chain and the side chain, and is preferably a resin (hereinafter also referred to as an "alicyclic hydrocarbon-based acid-decomposable resin") which has a monocyclic or polycyclic alicyclic hydrocarbon structure, and has an increased polarity by the action of an acid polarity and an increased solubility in an alkali developer and a decreased solubility in an organic solvent. The reason therefor is not clear but is presumed to be as follows: a significant change in the polarity of a resin before and after the irradiation with actinic ray or radiation is due to an improved dissolution contrast in a case of development using a positive tone developer (preferably an alkali developer) and a negative tone developer (preferably an organic solvent). Further, it is thought that a resin having a monocyclic or polycyclic alicyclic hydrocarbon structure has high hydrophobicity, and has improved developability in a case of developing an area having a weak light irradiation intensity of the actinic ray-sensitive or radiation-sensitive film by a negative tone developer (preferably an organic solvent).

The actinic ray-sensitive or radiation-sensitive resin composition of the present invention, which contains the resin whose polarity increases by the action of an acid, can be suitably used in a case of irradiation with ArF excimer laser light.

Examples of the alkali-soluble group included in the alicyclic hydrocarbon-based acid-decomposable resin include a phenolic hydroxyl group, a carboxylic acid group, a fluorinated alcohol group, a sulfonic acid group, a sulfo-namido group, a sulfonylimido group, an (alkylsulfonylalkylcarbonyl)methylene group, an (alkylsulfonyl)alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a group having a tris(alkylsulfonyl)methylene group.

Preferred examples of the alkali-soluble group include a carboxylic acid group, a fluorinated alcohol group (preferably a hexafluoroisopropanol group), and a sulfonic acid group.

A preferred group as the acid-decomposable group is a group obtained by substituting a hydrogen atom of these alkali-soluble groups with a group capable of leaving with an acid.

Examples of the group that leaves include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The alicyclic hydrocarbon-based acid-decomposable resin of the present invention is preferably a resin containing at least one selected from repeating units having partial structures, including an alicyclic hydrocarbon, represented by the following General Formulae (pI) to (pV), or a repeating unit represented by the following General Formula (II-AB).

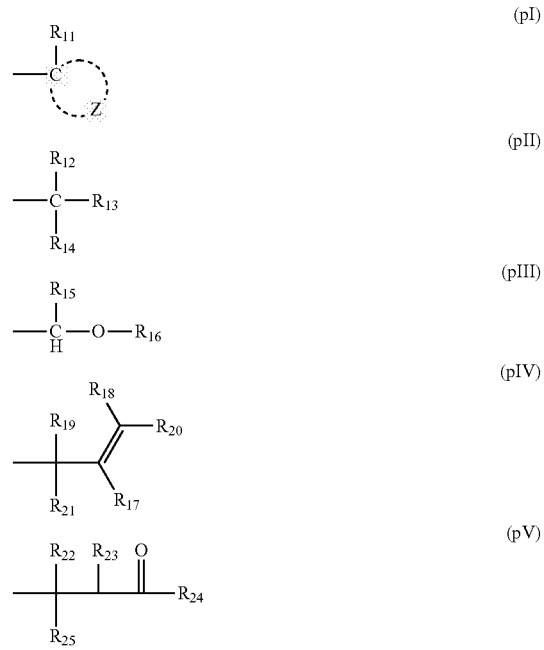

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

$R_{12}$ to $R_{16}$ each independently represent a linear or branched alkyl group or cycloalkyl group, having 1 to 4 carbon atoms, provided that at least one of $R_{12}, \ldots,$ or $R_{14}$, or any one of $R_{15}$ and $R_{16}$ is a cycloalkyl group.

$R_{11}$ to $R_{21}$ each independently represent a hydrogen atom, or a linear or branched alkyl group or cycloalkyl group, having 1 to 4 carbon atoms, provided that at least one of $R_{17}, \ldots,$ or $R_{21}$ is a cycloalkyl group. Further, any one of $R_{19}$ and $R_{21}$ is a linear or branched alkyl group or cycloalkyl group, having 1 to 4 carbon atoms.

$R_{22}$ to $R_{25}$ each independently represent a hydrogen atom, or a linear or branched alkyl group or cycloalkyl group, having 1 to 4 carbon atoms, provided that at least one of $R_{22}, \ldots,$ or $R_{25}$ is a cycloalkyl group. Further, $R_{23}$ and $R_{24}$ may be bonded to each other to form a ring.

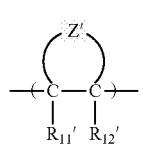

(II-AB)

In General Formula (II-AB), $R_{11}'$ and $R_{12}'$ each independently represent a hydrogen atom, cyano group, a halogen atom, or an alkyl group.

Z' represents an atomic group for forming an alicyclic structure, which contains two carbon atoms (C—C) bonded to each other.

Furthermore, it is more preferable that General Formula (II-AB) is the following General Formula (II-AB1) or (II-AB2).

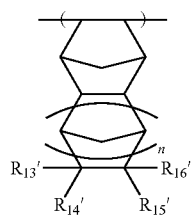

(II-AB1)

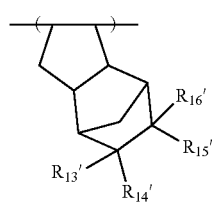

(II-AB2)

In Formulae (II-AB1) and (II-AB2), $R_{13}'$ to $R_{16}'$ each independently represent a hydrogen atom, a halogen atom, a cyano group, —COOH, —COOR$_5$, a group that decomposes by the action of an acid, —C(=O)—X-A'-R$_{17}'$, an alkyl group, or a cycloalkyl group, provided that at least two of $R_{13}', \ldots,$ or $R_{16}'$ may be bonded to each other to form a ring.

Here, $R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$, or a group having a lactone structure.

$R_6$ represents an alkyl group or a cycloalkyl group.

n represents 0 or 1.

In General Formulae (pI) to (pV), the alkyl group in each of $R_{12}$ to $R_{25}$ is a linear or branched alkyl group having 1 to 4 carbon atoms.

The cycloalkyl group in each of $R_{11}$ to $R_{25}$ or the cycloalkyl group formed by Z together with carbon atoms may be monocyclic or polycyclic. Specific examples thereof include a group having 5 or more carbon atoms and having a monocyclo, bicyclo, tricyclo or tetracyclo structure. These cycloalkyl groups preferably have 6 to 30 carbon atoms, and more preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples thereof include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by any one of General Formulae (pI) to (pV), a repeating unit represented by the following General Formula (pA) is preferable.

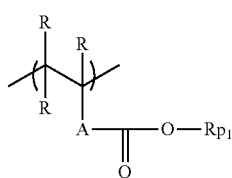

(pA)

Here, R represents a hydrogen atom, a halogen atom, or a substituted or unsubstituted, linear or branched alkyl group having 1 to 4 carbon atoms, and a plurality of R's may be the same as or different from each other.

A is preferably a single group or a combination of two or more groups, selected from the group consisting of a single bond, an alkylene group, an ether group, a thioether group, a carbonyl group, an ester group, an amido group, a sulfonamido group, a urethane group, or a urea group, with a single bond being preferable.

$Rp_1$ is a group of any one of Formulae (pI) to (pV).

The repeating unit represented by General Formula (pA) is particularly preferably a repeating unit derived from 2-alkyl-2-adamantyl (meth)acrylate or dialkyl(1-adamantyl) methyl (meth)acrylate.

Specific examples of the repeating unit represented by General Formula (pA) are shown below, but the present invention is not limited thereto.

(in the following formulae, Rx represents H, $CH_3$, or $CH_2OH$; and Rxa and Rxb each represent an alkyl group having from 1 to 4 carbon atoms)

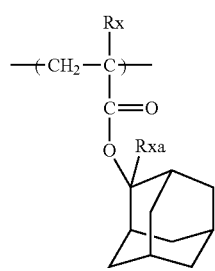
1

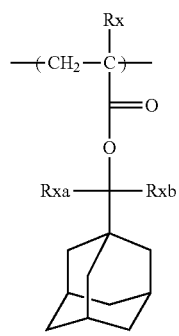
2

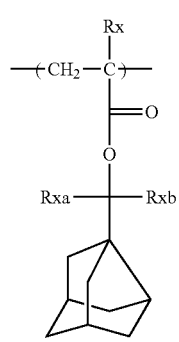
3

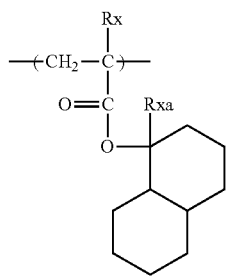
4

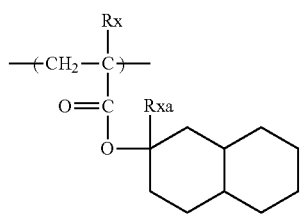
5

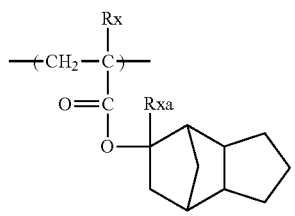
6

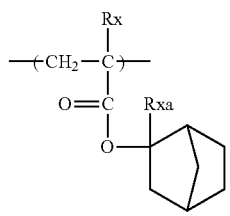
7

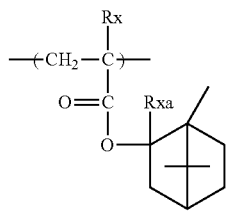
8

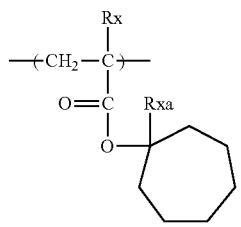
9

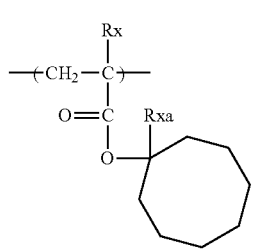
10

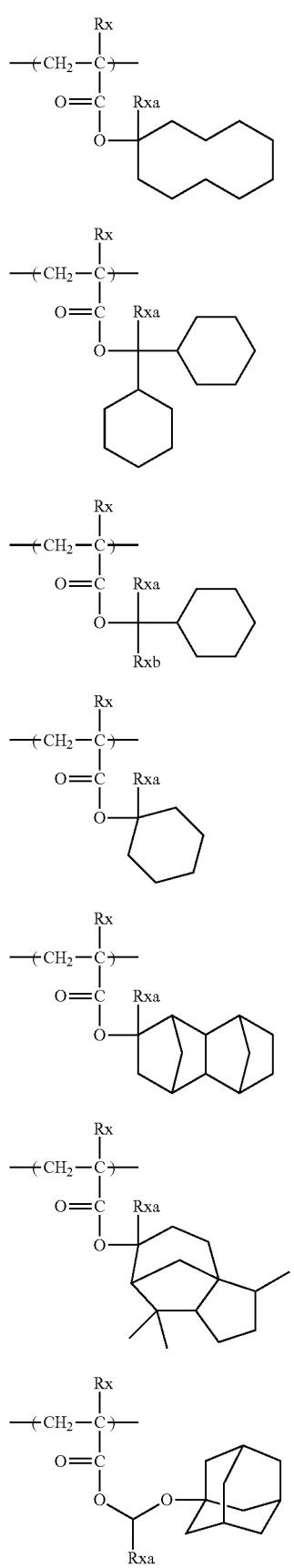
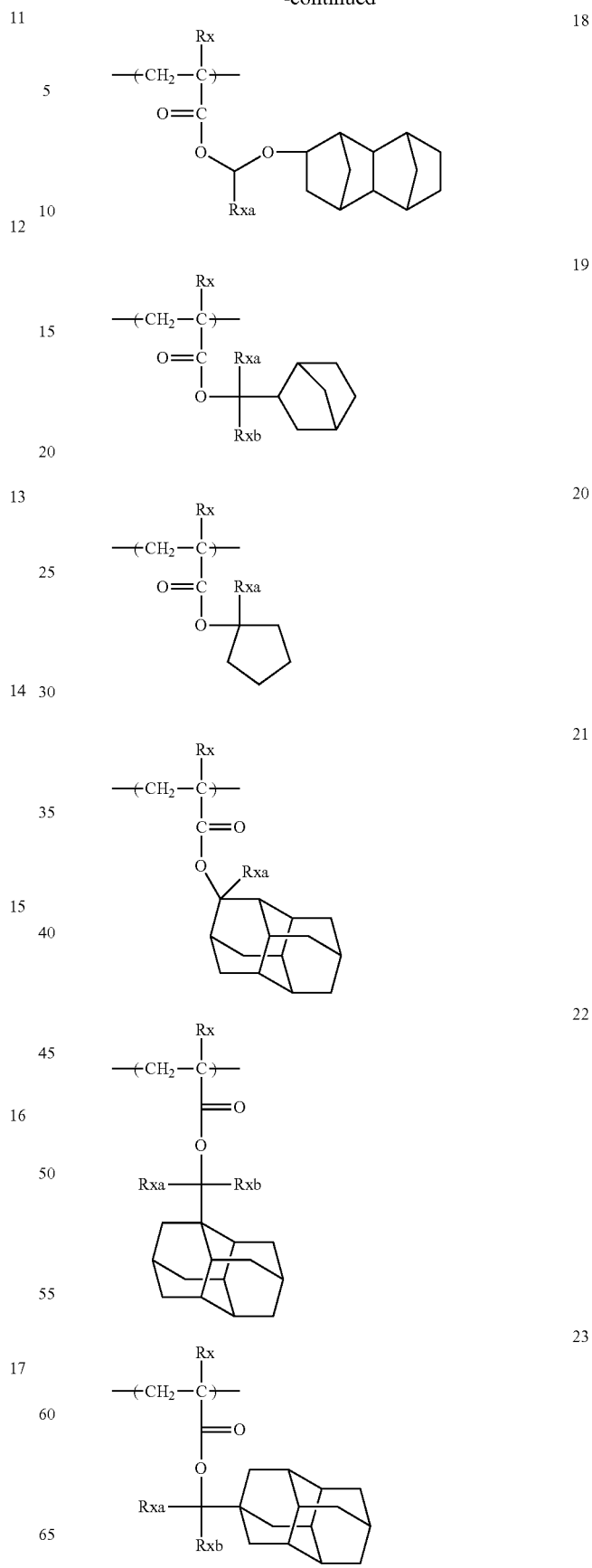

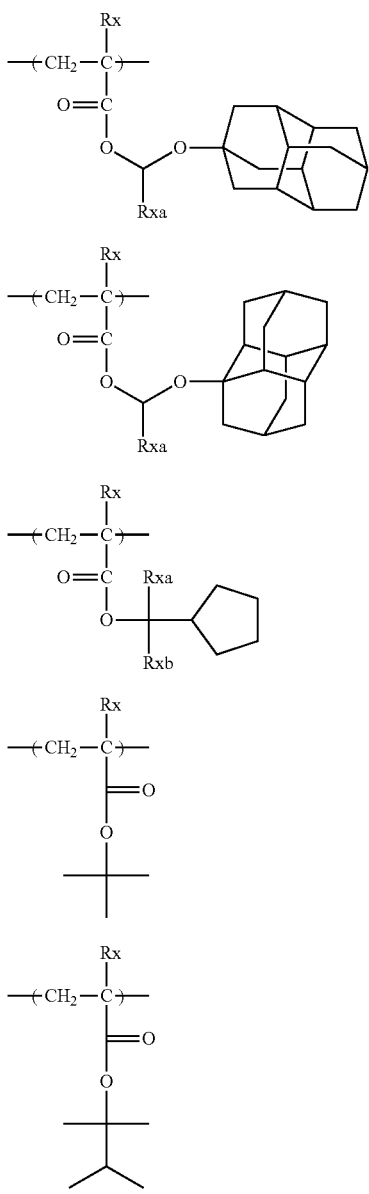

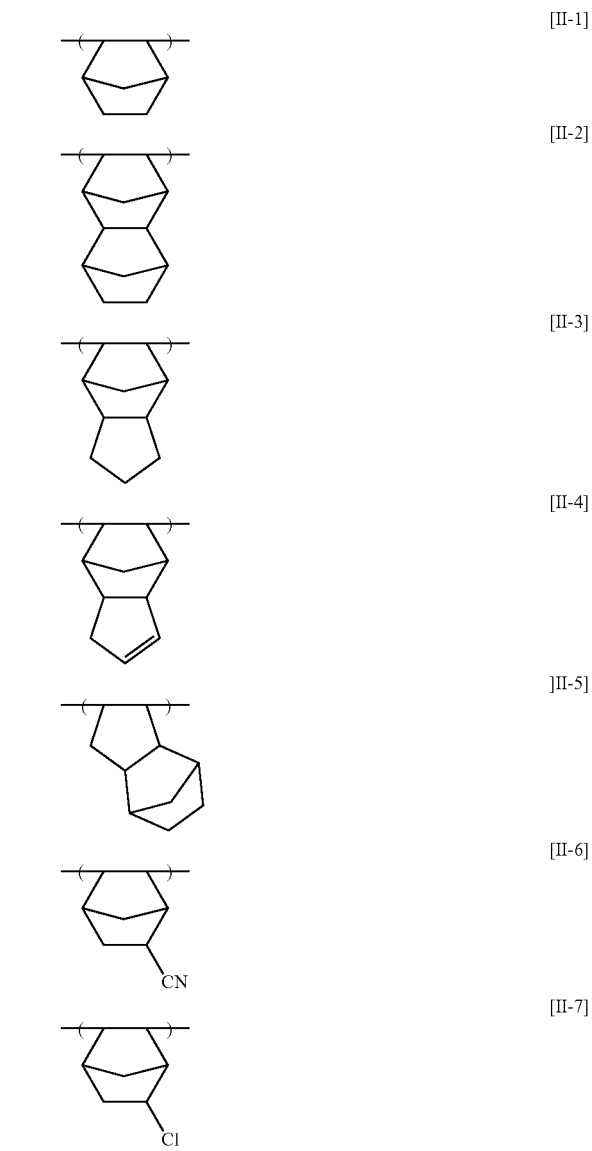

In General Formula (II-AB), examples of the halogen atoms in $R_{11}'$ and $R_{12}'$ include a chlorine atom, a bromine atom, a fluorine atom, and an iodine atom.

Examples of the alkyl group in each of $R_{11}'$ and $R_{12}'$ include a linear or branched alklyl group having 1 to 10 carbon atoms.

The atomic group for forming the alicyclic structure of $Z'$ is an atomic group that forms a repeating unit of an alicyclic hydrocarbon, which may have a substituent, in the resin. Above all, an atomic group for forming a crosslinked alicyclic structure that forms a crosslinked alicyclic hydrocarbon repeating unit is preferable.

Examples of the skeleton of the alicyclic hydrocarbon thus formed include the same ones as the alicyclic hydrocarbon groups represented by each of $R_{12}$ to $R_{25}$ in General Formulae (pI) to (pV).

The skeleton of the alicyclic hydrocarbon may have a substituent. Examples of the substituent include $R_{13}'$ to $R_{16}'$ in General Formula (II-AB1) or (II-AB2).

In the alicyclic hydrocarbon-based acid-decomposable resin according to the present invention, the group that decomposes by the action of an acid is included in at least one repeating unit of a repeating unit having a partial structure including an alicyclic hydrocarbon represented by any one of General Formulae (pI) to (pV), a repeating unit represented by General Formula (II-AB), or a repeating unit of a copolymerizable component which will be described later. It is preferable that the group that decomposes by the action of an acid is included in the repeating unit having a partial structure including an alicyclic hydrocarbon represented by any one of General Formulae (pI) to (pV).

Each of various substituents of $R_{13}'$ to $R_{16}'$ in General Formula (II-AB1) or (II-AB2) may be a substituent of the atomic group for forming an alicyclic structure or the atomic group Z for forming a crosslinked alicyclic structure in General Formula (II-AB).

Examples of the repeating unit represented by General Formula (II-AB1) or (II-AB2) include the following specific examples, but the present invention is not limited to these specific examples.

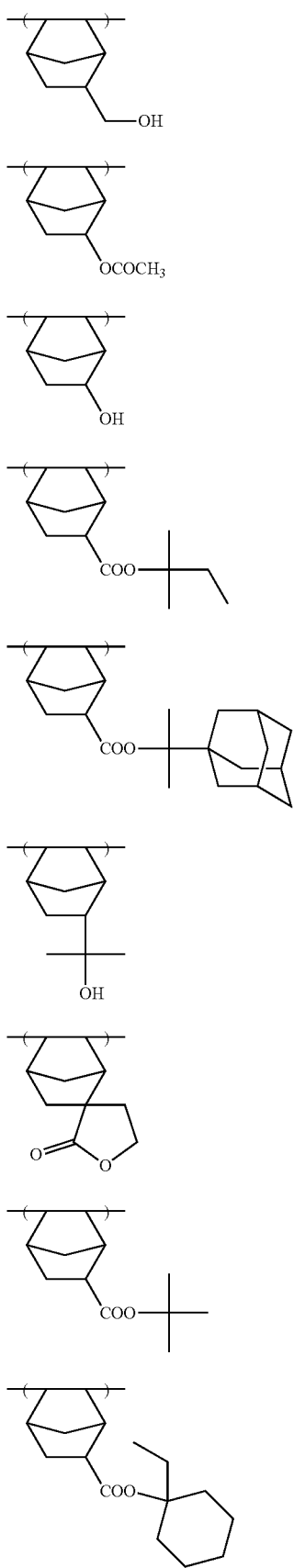
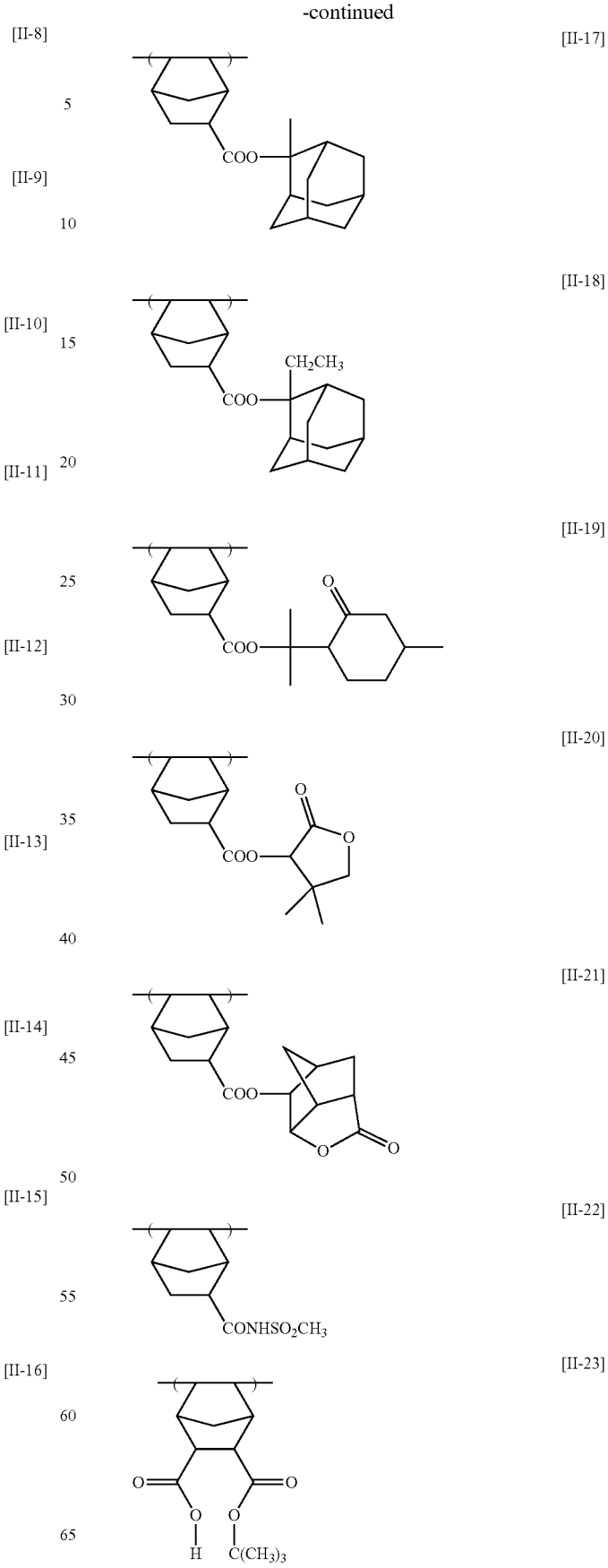

[II-24]

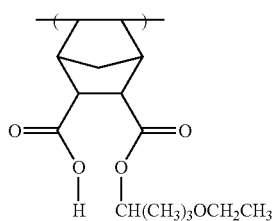

[II-25]

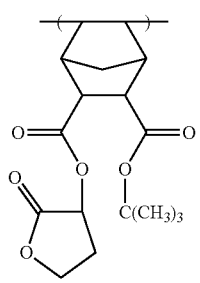

[II-26]

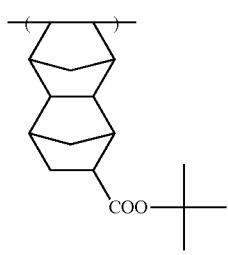

[II-27]

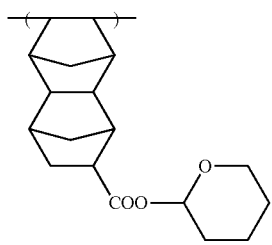

[II-28]

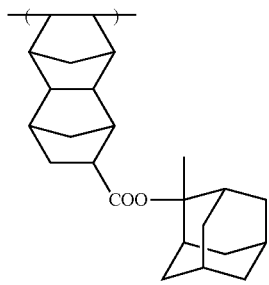

[II-29]

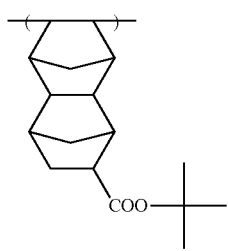

[II-30]

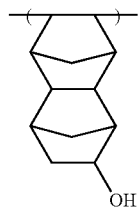

[II-31]

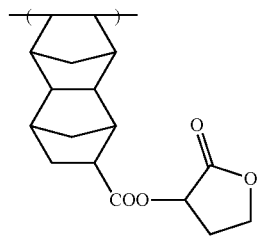

[II-32]

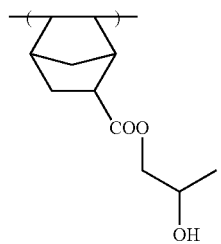

The alicyclic hydrocarbon-based acid-decomposable resin the present invention preferably has a lactone group. As the lactone group, any group may be used as long as it has a lactone structure, but the group is preferably a group containing a 5- to 7-membered ring lactone structure, and preferably, another ring structure is fused to the 5- to 7-membered ring lactone structure in the form capable of forming a bicyclo structure or a spiro structure. The resin more preferably has a repeating unit having a group having a lactone structure represented by any of the following General Formulae (LC1-1) to (LC1-16). Further, a group having the lactone structure may be bonded directly to the main chain. Preferred examples of the lactone structures include the groups represented by General Formulae (LC1-1), (LC1-4), (LC1-5), (LC1-6), (LC1-13), and (LC1-14), and by using the specific lactone structures, the line edge roughness is improved and the development defects are also relieved.

LC1-1

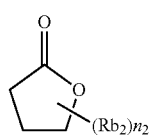

LC1-2

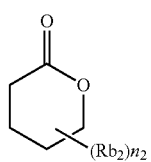

LC1-3 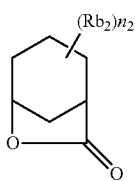

LC1-4 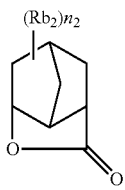

LC1-5 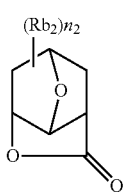

LC1-6 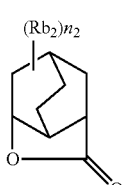

LC1-7 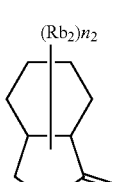

LC1-8 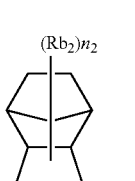

LC1-9 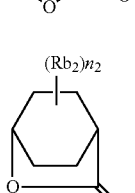

LC1-10 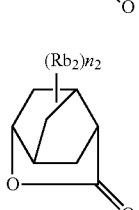

LC1-11 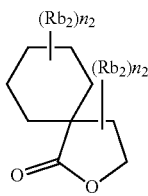

LC1-12 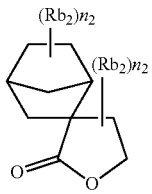

LC1-13 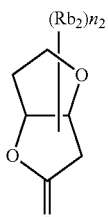

LC1-14 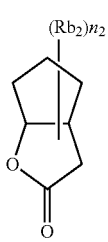

LC1-15 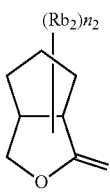

LC1-16 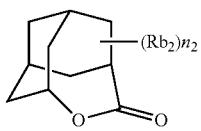

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group, $n_2$ represents an integer of 0 to 4. When $n_2$ is 2 or more, $Rb_2$'s which are present in plural numbers may be the same as or different from each other, and further, $Rb_2$'s which are present in plural numbers may be bonded to each other to form a ring.

Examples of the repeating unit having a lactone structure represented by any one of General Formulae (LC1-1) to (LC1-16) include a repeating unit in which at least one of $R_{13}'$, ..., or $R_{16}'$ in General Formula (II-AB1) or (II-AB2)

has a group represented by any one of General Formulae (LC1-1) to (LC1-16) (for example, one in which R$_5$ in —COOR$_5$ is a group represented by any one of General Formulae (LC1-1) to (LC1-16)), and a repeating unit represented by the following General Formula (AI).

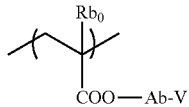

(AI)

In General Formula (AI),

R$_{b0}$ represents a hydrogen atom, a halogen atom, or an alkyl group having 1 to 4 carbon atoms.

Preferred examples of the substituent that the alkyl group of R$_{b0}$ may have include a hydroxyl group and a halogen atom.

Examples of the halogen atoms of R$_{b0}$ include a fluorine atom, a chlorine atom, a bromine atom and an iodine atom.

R$_{b0}$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group obtained by combination of these groups. Ab$_1$ is preferably a single bond or a linking group represented by -Ab$_1$-CO$_2$—. Ab$_1$ is a linear or branched alkylene group, or a monocyclic or polycyclic cycloalkylene group, and preferably a methylene group, an ethylene group, a cyclohexylene group, an adamantylene group, or a norbornylene group.

V represents a group represented by any one of General Formulae (LC1-1) to (LC1-16).

The repeating unit having a lactone structure is usually present in the form of an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90 or more, and more preferably 95 or more.

Specific examples of the repeating unit having a group with a lactone structure are shown below, but the present invention is not limited thereto.

(in the formulae, Rx represents H, CH$_3$, CH$_2$OH, or CF$_3$)

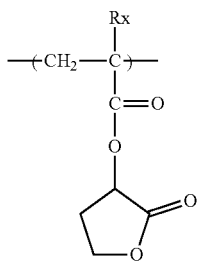 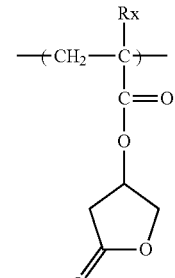

-continued

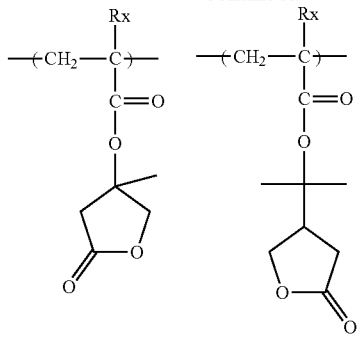

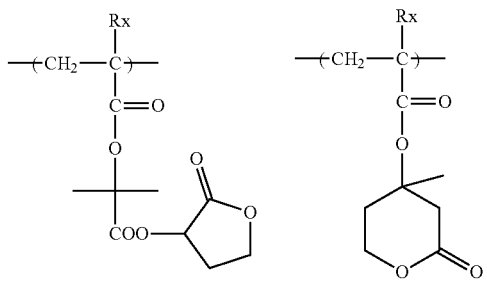

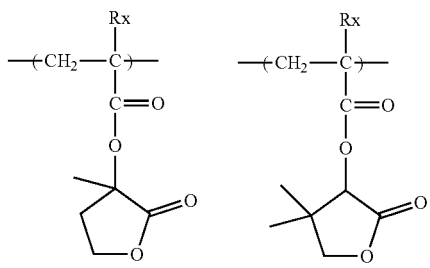

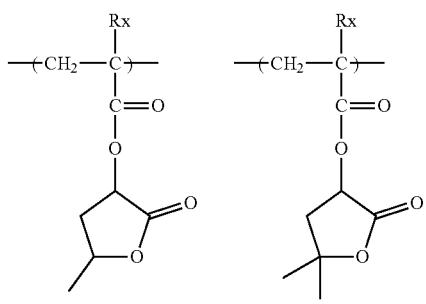

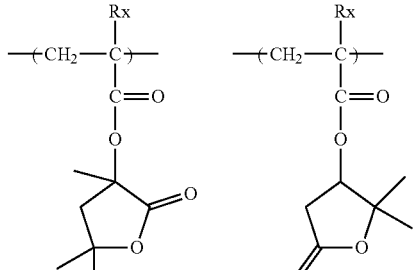

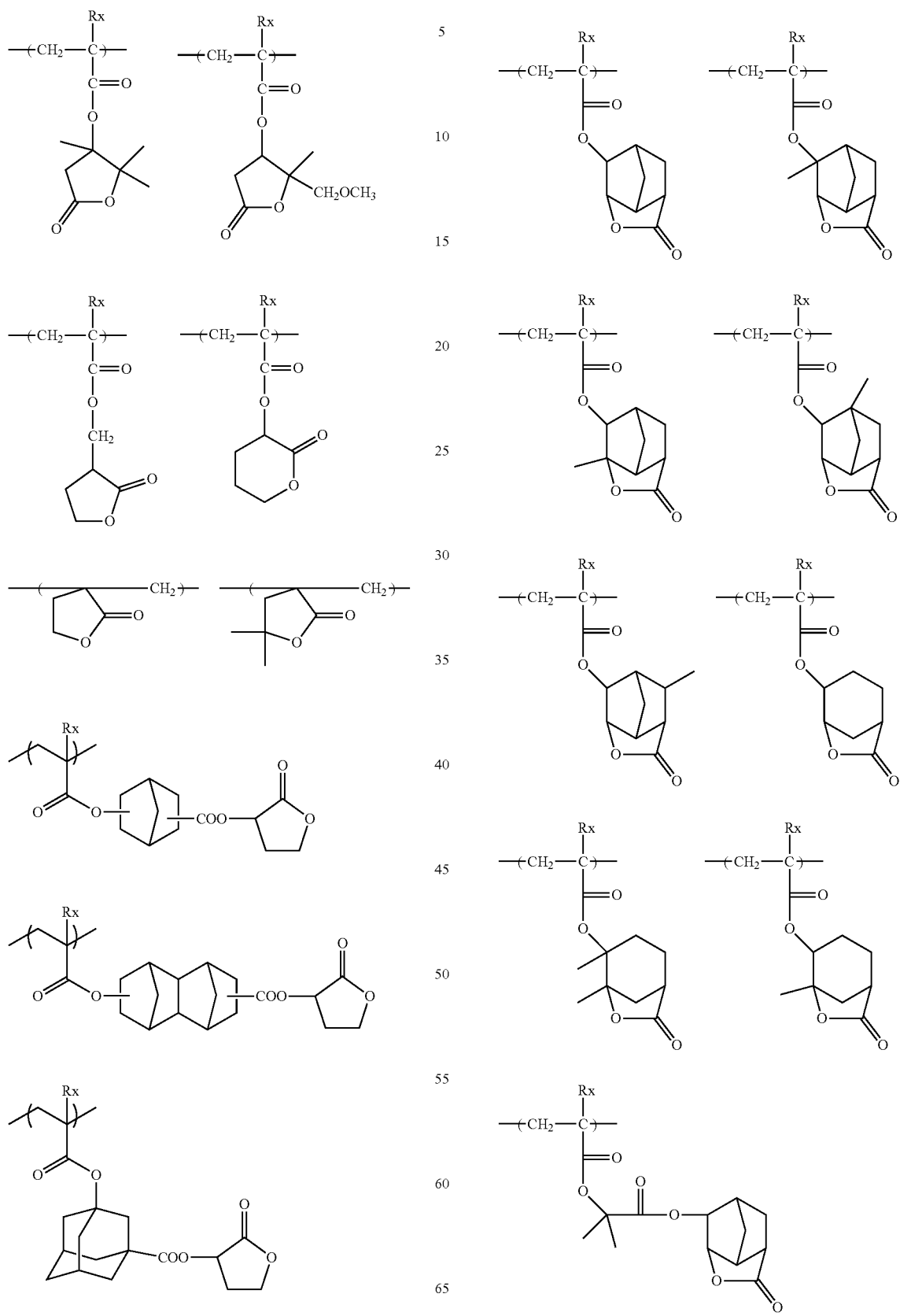
(in the formulae, Rx represents H, $CH_3$, $CH_2OH$, Or $CF_3$)

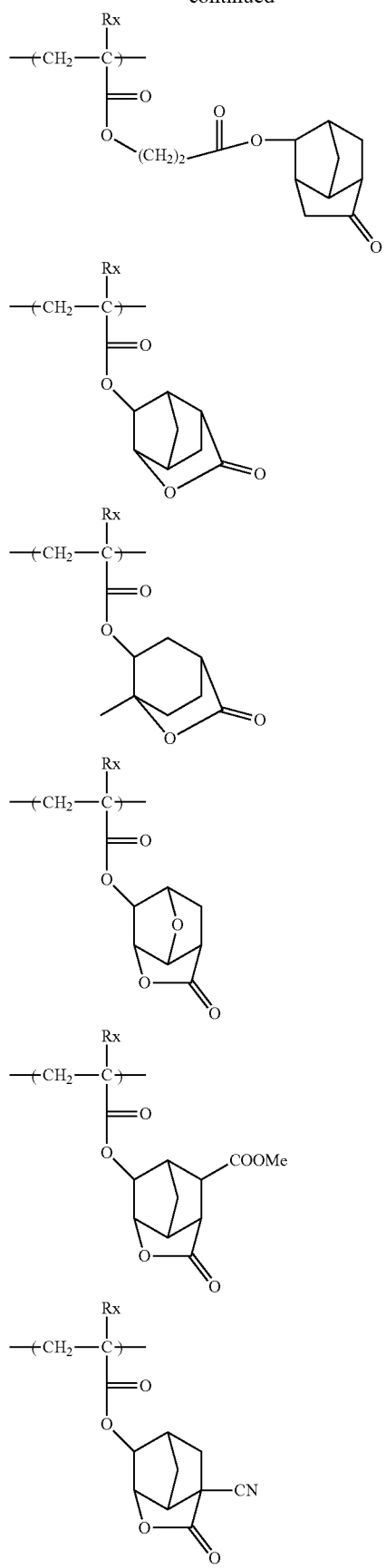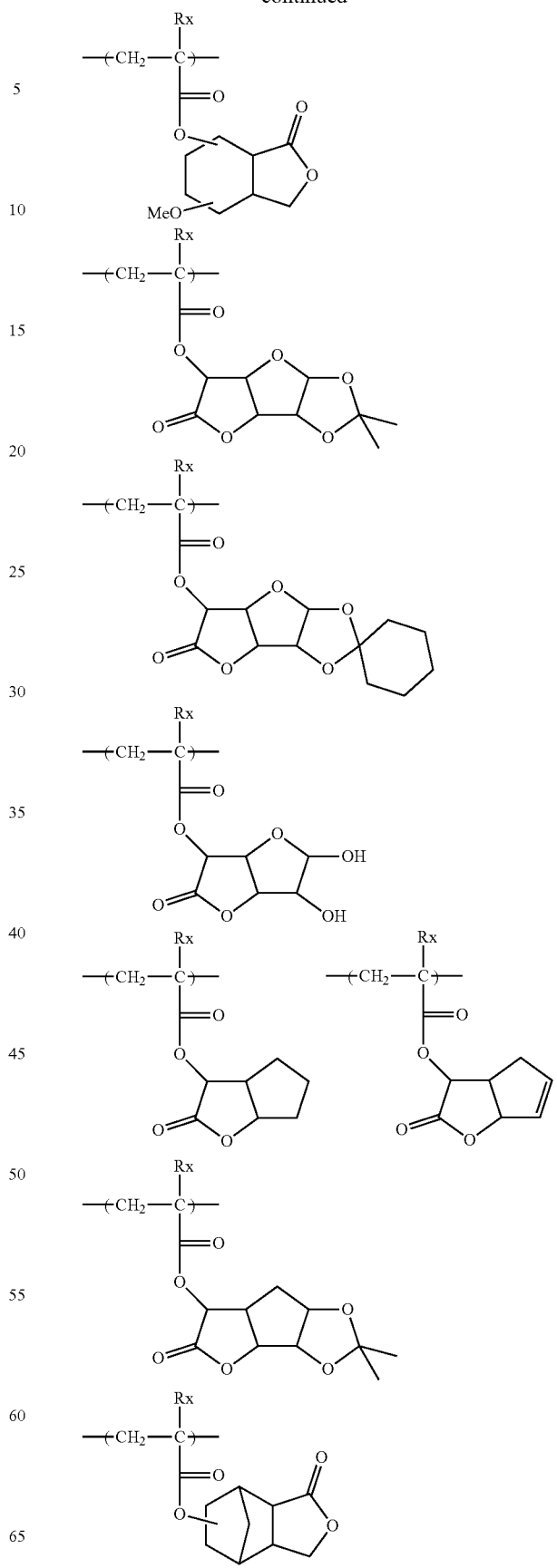

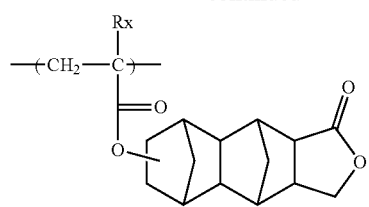

(in the formulae, Rx represents H, CH$_3$, CH$_2$OH, or CF$_3$)

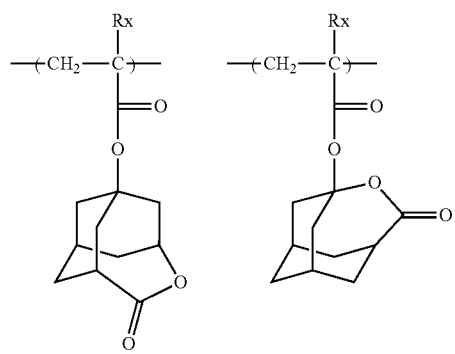

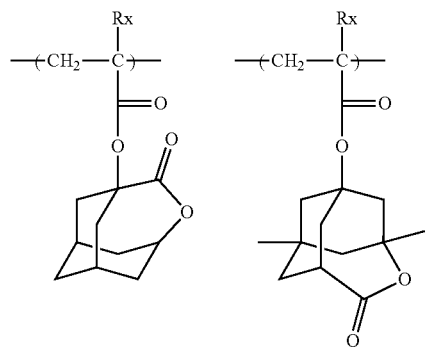

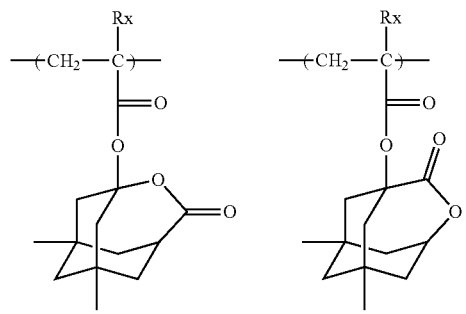

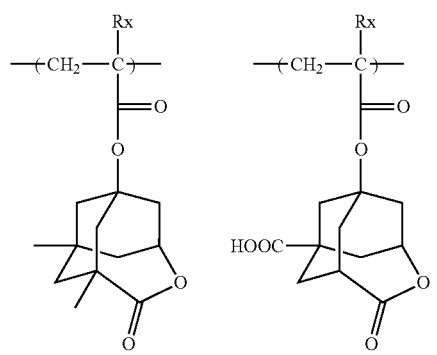

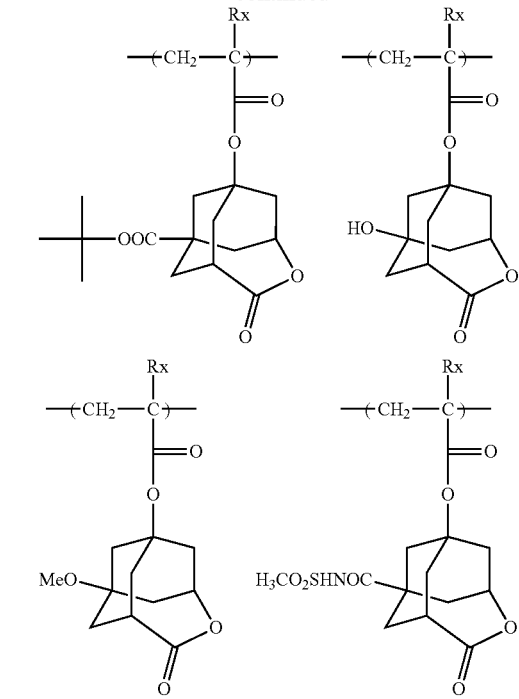

The alicyclic hydrocarbon-based acid-decomposable resin of the present invention may further have a repeating unit containing an organic group having a polar group, in particular, a repeating unit having an alicyclic hydrocarbon structure substituted with a polar group. Thus, the substrate adhesiveness and the developer affinity are improved. As the alicyclic hydrocarbon structure of the alicyclic hydrocarbon structure substituted with a polar group, an adamantyl group, a diamantyl group, or a norbornane group are preferable. As the polar group, a hydroxyl group or a cyano group is preferable.

As the alicyclic hydrocarbon structure substituted with a polar group, a partial structure represented by any one of the following General Formulae (VIIa) to (VIId) is preferable.

(VIIa)

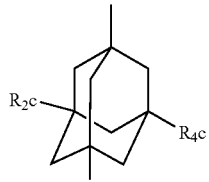

(VIIb)

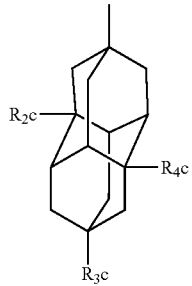

-continued

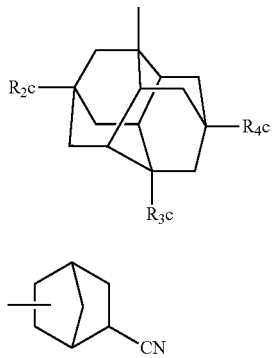
(VIIc)

(VIId)

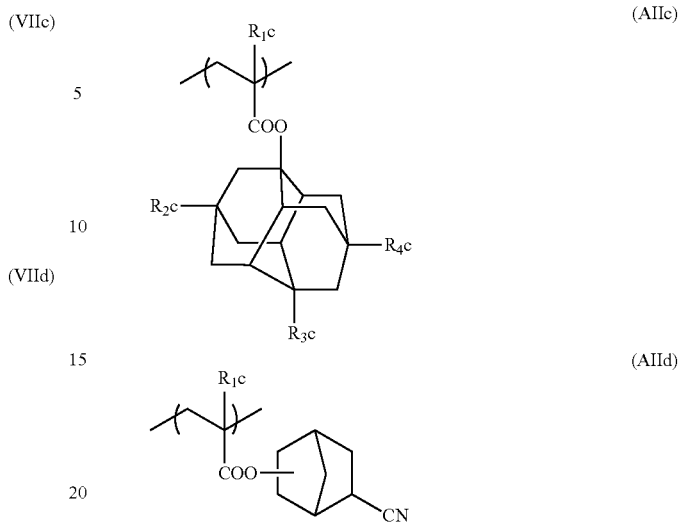
(AIIc)

(AIId)

In General Formulae (VIIa) to (VIIc), $R_{2c}$ to $R_{4c}$ each independently represent a hydrogen atom, a hydroxyl group, or a cyano group, provided that at least one of $R_{2c}$, . . . , or $R_{4c}$ represents a hydroxyl group or a cyano group. It is preferable that one or two of $R_{2c}$ to $R_{4c}$ are hydroxyl group(s) and the remainders are hydrogen atoms.

In General Formula (VIIa), it is more preferable that two of $R_{2c}$ to $R_{4c}$ are hydroxyl groups and the remainders are hydrogen atoms.

Examples of the repeating unit having a group represented by any one of General Formulae (VIIa) to (VIId) include those in which at least one of $R_{13}'$, . . . , or $R_{16}'$ in General Formula (II-AB1) or (II-AB2) has a group represented by any one of General Formula (VII) (for example, a group —$COOR_5$ in which $R_5$ is a group represented by any one of General Formulae (VIIa) to (VIId)), and repeating units represented by the following General Formulae (AIIa) to (AIId).

In General Formulae (AIIa) to (AIId), $R_{1c}$ represents a hydrogen atom, a methyl group, a trifluoromethyl group, or a hydroxymethyl group.

$R_{2c}$ to $R_{4c}$ have the same definitions as $R_{2c}$ to $R_{4c}$ in General Formulae (VIIa) to (VIIc).

Specific examples of the repeating unit having a structure represented by any one of General Formulae (AIIa) to (AIId) will be shown below, but the present invention is not limited thereto.

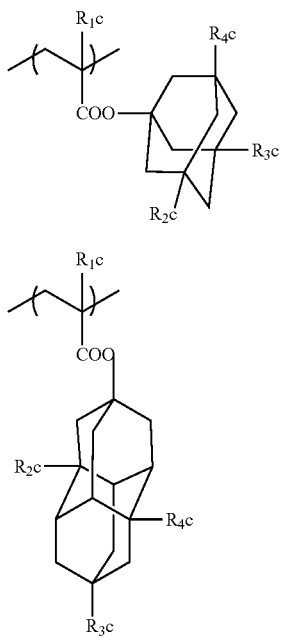
(AIIa)

(AIIb)

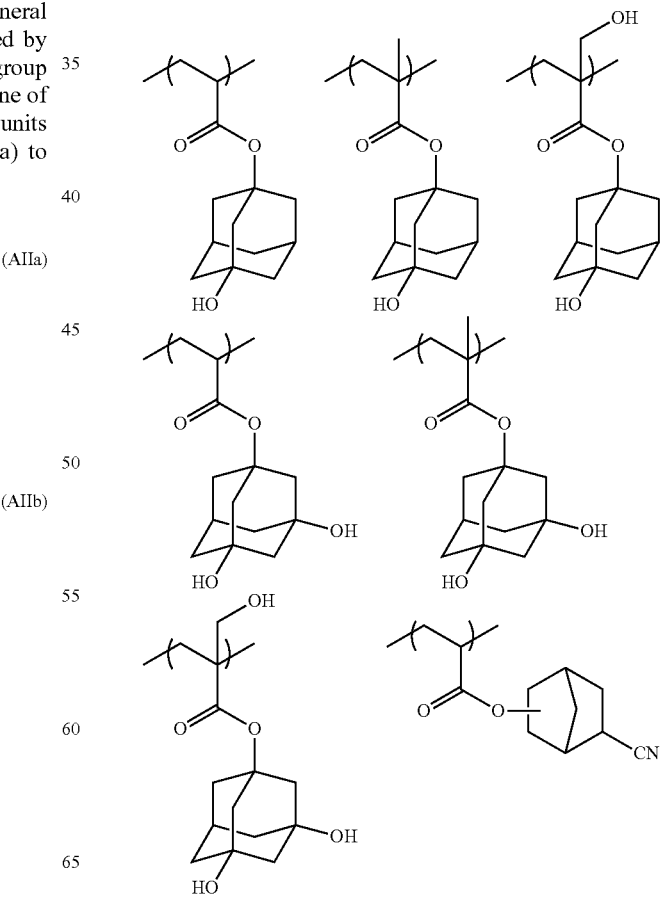

-continued

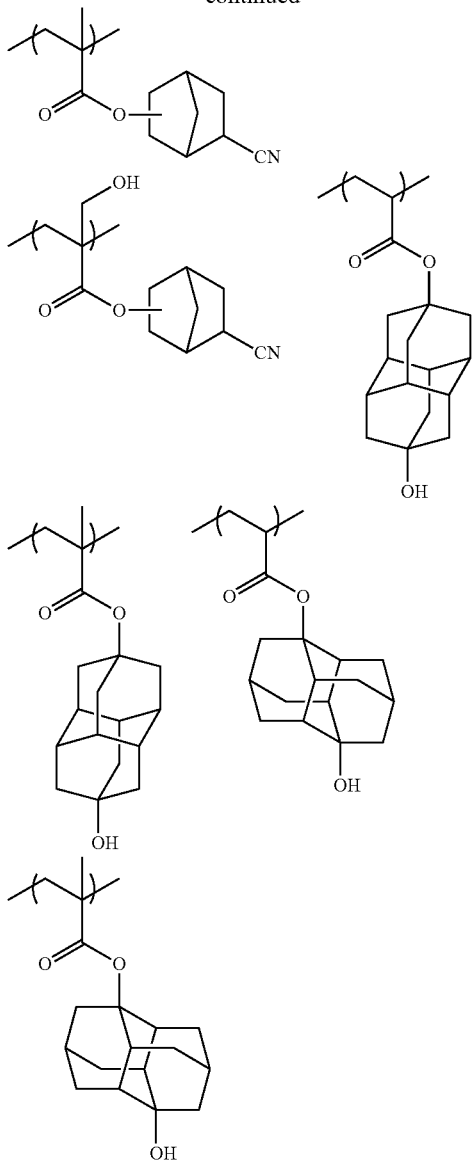

The alicyclic hydrocarbon-based acid-decomposable resin of the present invention may have a repeating unit represented by the following General Formula (VIII).

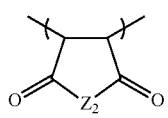
(VIII)

In General Formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group, or a camphor residue. The alkyl group of each of $R_{41}$ and $R_{42}$ may further be substituted with a halogen atom (preferably a fluorine atom) or the like.

Examples of the repeating unit represented by General Formula (VIII) include the following specific examples, but the present invention is not limited thereto.

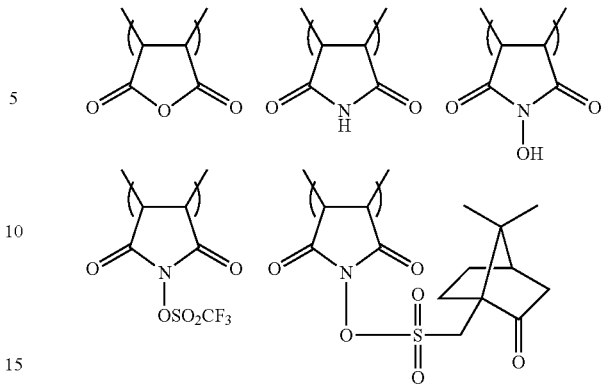

The alicyclic hydrocarbon-based acid-decomposable resin of the present invention preferably has a repeating unit having an alkali-soluble group, and more preferably has a repeating unit having a carboxyl group. By incorporation of such a repeating unit, the resolution increases in the applications in a contact hole. Preferred examples of the repeating unit having a carboxyl group include any one of a repeating unit in which a carboxyl group is directly attached to the main chain of a resin such as a repeating unit of acrylic acid or methacrylic acid, a repeating unit in which a carboxyl group is attached to the main chain of a resin via a linking group and a repeating unit carrying, at the terminal of a polymer chain, an alkali-soluble group having been introduced in the course of polymerization by using a polymerization initiator or a chain transfer agent having the alkali-soluble group. The linking group may have a monocyclic or polycyclic hydrocarbon structure. A repeating unit including acrylic acid or methacrylic acid is particularly preferable.

The alicyclic hydrocarbon-based acid-decomposable resin of the present invention may also have a repeating unit having 1 to 3 groups represented by General Formula (F1). Thus, the line edge roughness performance is further improved.

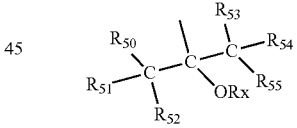
(F1)

In General Formula (F1), $R_{50}$ to $R_{55}$ each independently represent a hydrogen atom, a fluorine atom or an alkyl group, provided that at least one of $R_{50}$, . . . , or $R_{55}$ represents a fluorine atom or an alkyl group in which at least one hydrogen atom is substituted with a fluorine atom.

Rx represents a hydrogen atom or an organic group (preferably an acid-decomposable protecting group, an alkyl group, a cycloalkyl group, an acyl group, or an alkoxycarbonyl group).

The alkyl group of each of $R_{50}$ to $R_{55}$ may be substituted with a halogen atom such as a fluorine atom, a cyano group, or the like. Preferred examples thereof include an alkyl group having 1 to 3 carbon atoms, such as a methyl group and a trifluoromethyl group.

It is preferable that all of $R_{50}$ to $R_{55}$ are fluorine atoms.

As the organic group represented by Rx, an acid-decomposable protecting group, an alkyl group which may have a substituent, a cycloalkyl group, an acyl group, an alkylcarbonyl group, an alkoxycarbonyl group, an alkoxycarbonylmethyl group, an alkoxymethyl group, or a 1-alkoxyethyl group is preferable.

The repeating unit having a group represented by General Formula (F1) is preferably a repeating unit represented by the following General Formula (F2).

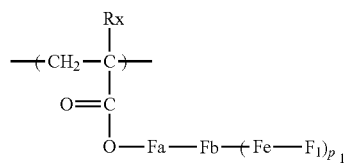

In General Formula (F2).

Rx represents a hydrogen atom, a halogen atom or an alkyl group having 1 to 4 carbon atoms. Preferred examples of a substituent which may be contained in the alkyl group of Rx include a hydroxyl group and a halogen atom.

Fa represents a single bond, or a linear or branched alkylene group (preferably a single bond).

Fb represents a monocyclic or polycyclic hydrocarbon group.

Fc represents a single bond, or a linear or branched alkylene group (and is preferably a single bond or a methylene group).

$F_1$ represents a group represented by General Formula (F1).

$p_1$ represents 1 to 3.

As the cyclic hydrocarbon group in Fb, a cyclopentylene group, a cyclohexylene group, or a norbornylene group is preferable.

Specific examples of the repeating unit having a group represented by General Formula (F1) are shown below, but the present invention is not limited thereto.

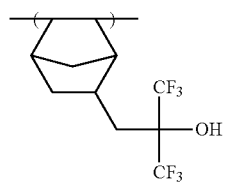

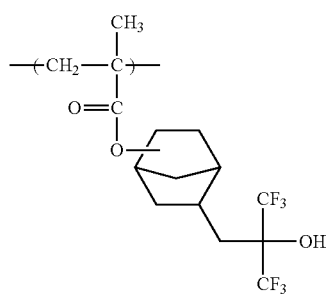

-continued

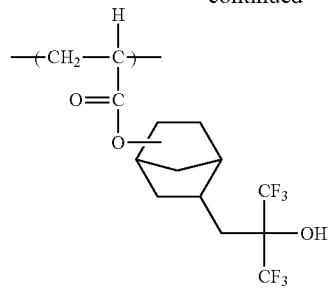

The alicyclic hydrocarbon-based acid-decomposable resin of the present invention may also have a repeating unit further having an alicyclic hydrocarbon structure and not exhibiting acid-decomposability. Thus, it is possible to reduce elution of the low molecular components from the actinic ray-sensitive or radiation-sensitive film to the immersion liquid upon liquid immersion exposure. Examples of such a repeating unit include 1-adamantyl (meth)acrylate, tricyclodecanyl (meth)acrylate, and cyclohexyl (meth)acrylate.

In addition to the repeating structural units, the alicyclic hydrocarbon-based acid-decomposable resin of the present invention can have a variety of repeating structural units for the purpose of adjusting dry etching resistance, suitability for a standard developer, adhesiveness to a substrate, and a resist profile, and in addition, resolving power, heat resistance, sensitivity, and the like, which are characteristics generally required for the resist.

Examples of such repeating structural units include, but are not limited to, repeating structural units corresponding to the following monomers.

Thus, it becomes possible to perform fine adjustments to performance required for the alicyclic hydrocarbon-based acid-decomposable resin, in particular.

(1) solubility in a coating solvent,
(2) film forming properties (glass transition temperature),
(3) solubility in a positive tone developer and a negative tone developer,
(4) film reduction (selection of hydrophilic, hydrophobic, or alkali-soluble groups),
(5) adhesiveness of an unexposed area to a substrate.
(6) dry etching resistance, and the like.

Examples of such a monomer include a compound having one addition-polymerizable unsaturated bond selected from acrylic acid esters, methacrylic acid esters, acrylamides, methacrylamides, allyl compounds, vinyl ethers, and vinyl esters.

In addition, addition-polymerizable unsaturated compounds which are copolymerizable with monomers corresponding to various repeating structural units above may be copolymerized.

In the alicyclic hydrocarbon-based acid-decomposable resin, the molar ratio of each repeating structural unit content is appropriately set in order to adjust dry etching resistance, suitability for a standard developer, adhesiveness to a substrate, and a resist profile of the resist, and in addition, resolving power, heat resistance, sensitivity, and the like, each of which is performance generally required for the resist.

Preferred embodiments of the alicyclic hydrocarbon-based acid-decomposable resin of present invention include the followings:

(1) a resin containing a repeating unit having an alicyclic hydrocarbon-containing partial structure represented by any one of General Formulae (pI) to (pV) (side chain type), preferably a resin containing a (meth)acrylate repeating unit having a structure of any one of General Formulae (pI) to (pV), and (2) a resin containing a repeating unit represented by General Formula (II-AB) (main chain type).

Here, the embodiment of (2) further includes the followings:

(3) a resin having a repeating unit represented by General Formula (II-AB), a maleic anhydride derivative, and a (meth)acrylate structure (hybrid type).

In the alicyclic hydrocarbon-based acid-decomposable resin, the content of the repeating unit having an acid-decomposable group is preferably 10% to 60% by mole, more preferably 20% to 50% by mole, and still more preferably 25% to 40% by mole, with respect to all the repeating structural units.

In the acid-decomposable resin, the content of the repeating unit having an acid-decomposable group is preferably 10% to 60% by mole, more preferably 20% to 50% by mole, and still more preferably 25% to 40% by mole, with respect to all the repeating structural units.

In the alicyclic hydrocarbon-based acid-decomposable resin, the content of the repeating unit having an alicyclic hydrocarbon-containing partial structure represented by any one of General Formulae (pI) to (pV) is preferably 20% to 70% by mole, more preferably 20% to 50% by mole, and still more preferably 25% to 4⁰% by mole, with respect to all the repeating structural units.

In the alicyclic hydrocarbon-based acid-decomposable resin, the content of the repeating unit represented by General Formula (II-AB) is preferably 10% to 60% by mole, more preferably 15% to 55% by mole, and still more preferably 20% to 50% by mole, with respect to all the repeating structural units.

In the acid-decomposable resin, the content of the repeating unit having a lactone ring is preferably 10% to 70% by mole, more preferably 20% to 60% by mole, and still more preferably 25% to 40% by mole, with respect to all the repeating structural units.

In the acid-decomposable resin, the content of the repeating unit having an organic group with a polar group is preferably 1% to 40% by mole, more preferably 5% to 30% by mole, and still more preferably 5% to 20% by mole, with respect to all the repeating structural units.

Moreover, the content in the resin of the repeating structural unit based on the monomer as the further copolymerization component can also be appropriately selected according to the desired resist performance, but the content thereof is preferably 99% by mole or less, more preferably 90% by mole or less, and still more preferably 80% by mole or less, with respect to the total molar number of the repeating structural unit having an alicyclic hydrocarbon-containing partial structure represented by any one of General Formulae (pI) to (pV) and the repeating unit represented by General Formula (II-AB).

When the actinic ray-sensitive or radiation-sensitive resin composition of the present invention is used for exposure with ArF, it is preferable that the resin has no aromatic group in view of transparency to ArF light.

The alicyclic hydrocarbon-based acid-decomposable resin for use in the present invention is preferably a resin in which all the repeating units are compose of (meth)acrylate-based repeating units. In this case, the repeating units that are all methacrylate-based repeating unit, acrylate-based repeating units, or a mixture of methacrylate-based repeating units/acrylate-based repeating units, but the content of the acrylate-based repeating units is preferably 50% by mole or less with respect to all the repeating units.

The alicyclic hydrocarbon-based acid-decomposable resin is preferably a copolymer including at least a (meth)acrylate-based repeating unit having a lactone ring, a (meth)acrylate-based repeating unit having an organic group substituted with at least one of a hydroxyl group and a cyano group, and three kinds of (meth)acrylate-based repeating units having an acid-decomposable group.

The alicyclic hydrocarbon-based acid-decomposable resin for use in the present invention is preferably a ternary copolymerization polymer including 20% to 50% by mole of the repeating unit having an alicyclic hydrocarbon-containing partial structure represented by any one of General Formulae (pI) to (pV), 20% to 50% by mole of the repeating unit having a lactone structure, and 5% to 30% by mole of the repeating unit having an alicyclic hydrocarbon structure substituted by a polar group, or a quaternary copolymerization polymer additionally including 0% to 20% by mole of the other repeating unit.

The resin is particularly preferably a ternary copolymerization polymer including 20% to 50% by mole of a repeating unit having an acid-decomposable group represented by any one of the following General Formulae (ARA-1) to (ARA-7), 20% to 50% by mole of a repeating unit having a lactone group represented by any one of General Formulae (ARL-1) to (ARL-7), and 5% to 30% by mole of a repeating unit having a polar group-substituted alicyclic hydrocarbon structure represented by any one of General Formulae (ARH-1) to (ARH-3), or a quaternary copolymerization polymer additionally including 5% to 20% by mole of a repeating unit having a carboxyl group or a group represented by General Formula (F1) or a repeating unit having an alicyclic hydrocarbon structure and not exhibiting acid decomposability.

(In the formulae, $R_{xy1}$ represents a hydrogen atom or a methyl group, $R_{xa1}$ and $R_{xb1}$ each independently represent a methyl group or an ethyl group, and $R_{xc1}$ represents a hydrogen atom or a methyl group.)

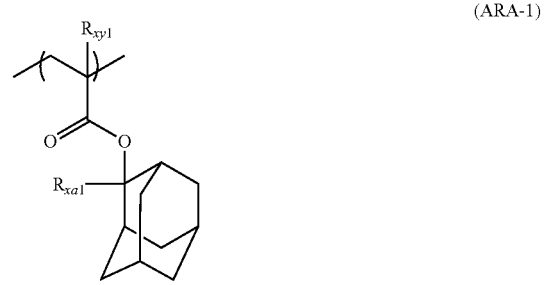

(ARA-1)

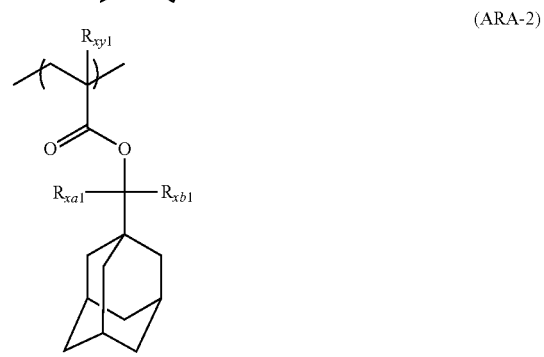

(ARA-2)

-continued
(ARA-3) 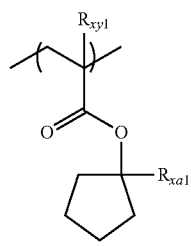
(ARA-4) 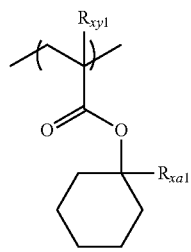
(ARA-5) 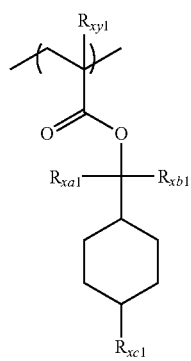
(ARA-6) 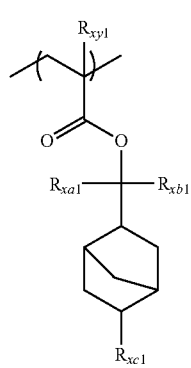
(ARA-7) 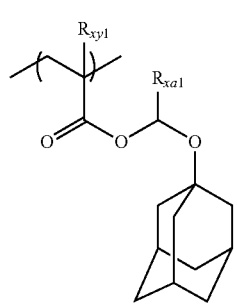
(ARL-1) 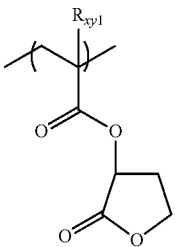
(ARL-2) 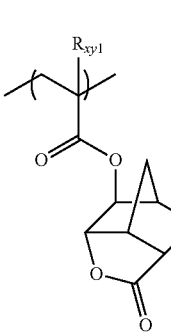
(ARL-3) 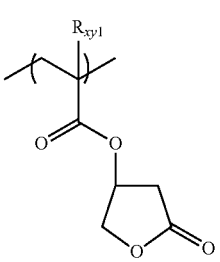
(ARL-4) 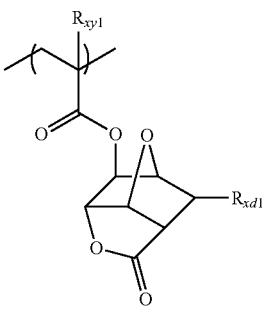
(ARL-5) 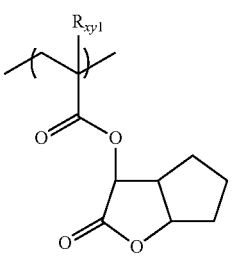
(In the formulae, $R_{xy1}$ represents a hydrogen atom or a methyl group, $R_{xd1}$ represents a hydrogen atom or a methyl group, and $R_{xe1}$ represents a trifluoromethyl group, a hydroxyl group, or a cyano group.)

-continued

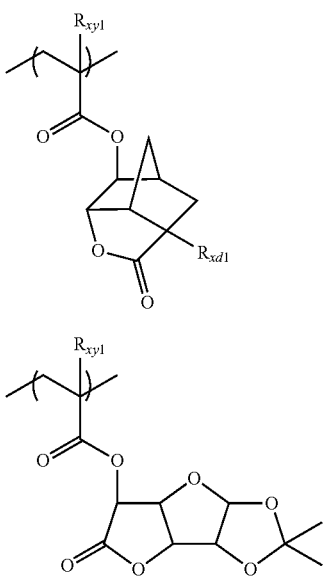

(ARL-6)

(ARL-7)

(In the formulae, $R_{xy1}$ represents a hydrogen atom or a methyl group.)

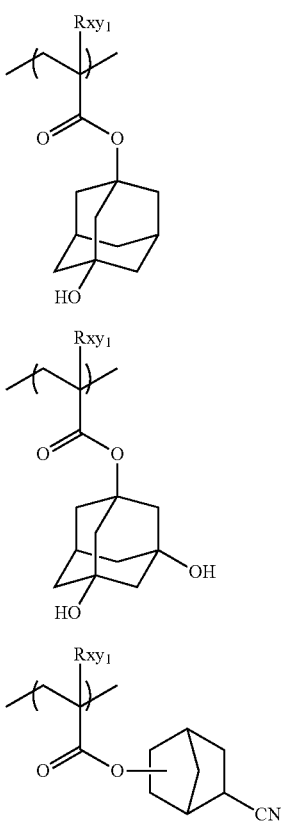

ARH-1

ARH-2

ARH-3

The alicyclic hydrocarbon-based acid-decomposable resin for use in the present invention can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the composition of the present invention, such as propylene glycol monomethyl ether acetate, propylene glycol monomethyl ether, and cyclohexanone. It is more preferable to carry out polymerization using the same solvent as the solvent used in the actinic ray-sensitive or radiation-sensitive resin composition of the present invention. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, the same method as for a resin (C) which will be described later can be used, and an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a re-precipitation method of dropwise adding a resin solution into a poor solvent to solidify the resin in the poor solvent, thereby removing the residual monomers and the like: and a purification method in a solid state, such as cleaning of a resin slurry with a poor solvent after separation of the slurry by filtration can be applied.

The weight-average molecular weight of the resin according to the present invention is a value in terms of polystyrene by means of a GPC method, and is preferably 1,000 to 200,000, more preferably 1,000 to 20,000, and still more preferably 1,000 to 15,000. By setting the weight-average molecular weight to 1,000 to 200,000, the heat resistance and the dry etching resistance can be prevented from being deteriorated, and the film forming properties can be prevented from being deteriorated due to deteriorated developability or increased viscosity.

The resin having a dispersity (molecular weight distribution) in a range of usually 1 to 5, preferably 1 to 3, more preferably 1.2 to 3.0, and particularly preferably 1.2 to 2.0 is used. As the dispersity is smaller, the resolution and the resist shape are excellent, the side wall of the resist pattern is smooth, and the roughness is excellent.

The blend amount of the acid-decomposable resin in the entire composition of the acid-decomposable resin in the actinic ray-sensitive or radiation-sensitive resin composition of the present invention is preferably 50% to 99.9% by mass, and more preferably 60% to 99.0% by mass, with respect to the total solid content.

Furthermore, in the present invention, the acid-decomposable resin may be used singly or in combination of plural kinds thereof.

It is preferable that the alicyclic hydrocarbon-based acid-decomposable resin of the present invention, and more preferably the actinic ray-sensitive or radiation-sensitive resin composition of the present invention contains neither a fluorine atom nor a silicon atom from the viewpoint of the compatibility with the composition for forming a protective film.

(B) Compound that Generates Acid Upon Irradiation with Actinic Ray or Radiation

The actinic ray-sensitive or radiation-sensitive resin composition of the present invention contains a compound that generates an acid upon irradiation with actinic ray or radiation (also referred to as a "photoacid generator" or a "compound (B)").

As such a photoacid generator, a compound may be appropriately selected from known compounds that generate an acid upon irradiation with actinic ray or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound that generates an acid upon irradiation with actinic ray or radiation is introduced into the main or side chain of the polymer, for example, the compounds described in U.S. Pat. No. 3,849,137, GE3914407A, JP1988-26653A (JP-S63-26653A), JP1980-164824A (JP55-164824A), JP1987-69263A (JP62-69263A), JP1988-146038A (JP63-146038A), JP1988-163452A (JP63-163452A), JP1987-153853A (JP62-153853A), JP1988-146029A (JP63-146029A), and the like can be used.

In addition, the compounds that generates an acid by light described in U.S. Pat. No. 3,779,778, EP126712B, and the like can also be used.

Among the preferred compounds that decomposes upon irradiation with actinic ray or radiation to generate an acid, there may be compounds represented by the following General Formulae (ZI), (ZII), and (ZIII).

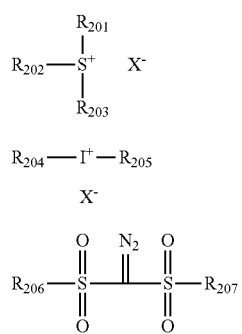

In General Formula (ZI), $R_{201}$, $R_{202}$, and $R_{203}$ each independently represent an organic group.

X⁻ represents a non-nucleophilic anion, and preferred examples thereof include a sulfonate anion, a carboxylate anion, a bis(alkylsulfonyl)amide anion, a tris(alkylsulfonyl)methide anion, $BF_4^-$, $PF_6^-$, and $SbF_6^-$, with an organic anion containing a carbon atom being preferable.

Preferred examples of the organic anion include organic anions represented by the following formulae.

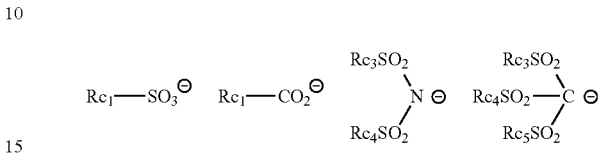

In the formulae, $Rc_1$ represents an organic group.

Examples of the organic group in $Rc_1$ include those having 1 to 30 carbon atoms, and preferably an alkyl group which may be substituted, an aryl group, or a group formed by linking these plural groups through a linking group such as a single bond, —O—, —CO$_2$—, —S—, —SO$_3$—, and —SO$_2$N(Rd$_1$)-. Rd$_1$ represents a hydrogen atom or an alkyl group.

$Rc_3$, $Rc_4$, and $Rc_5$ each independently represent an organic group. Preferred examples of the organic group in $Rc_3$, $Rc_4$, or $Rc_5$ include the same groups as the preferred organic groups in $Rc_1$, with a perfluoroalkyl group having 1 to 4 carbon atoms being most preferable.

$Rc_3$ and $Rc_4$ may be bonded to each other to form a ring. Examples of the group formed by the bonding of $Rc_3$ and $Rc_4$ include an alkylene group and an arylene group. A preferred example thereof is a perfluoroalkylene group having 2 to 4 carbon atoms.

The organic group of each of $Rc_1$, and $Rc_3$ to $Rc_5$ is particularly preferably an alkyl group having a fluorine atom or a fluoroalkyl group substituted at the 1-position, or a phenyl group substituted with a fluorine atom or a fluoroalkyl group. By having a fluorine atom or a fluoroalkyl group, the acidity of the generated acid generated upon irradiation with light increases, and thus, the sensitivity is improved. Further, by the bonding of $Rc_3$ and $Rc_4$ to form a ring, the acidity of the generated acid generated upon irradiation with light increases, and thus, the sensitivity is improved.

The number of carbon atoms of the organic group as each of $R_{201}$, $R_{202}$, and $R_{203}$ is generally 1 to 30, and preferably 1 to 20.

Furthermore, two members out of $R_{201}$ to $R_{203}$ may be bonded to each other to form a ring structure, and may include an oxygen atom, a sulfur atom, an ester bond, an amide bond, or a carbonyl group within the ring. Examples of the group formed by the bonding of two members out of $R_{201}$ to $R_{203}$ include alkylene groups (for example, a butylene group and a pentylene group).

Specific examples of the organic group as each of $R_{201}$, $R_{202}$, and $R_{203}$ include the corresponding groups in the compounds (ZI-1), (ZI-2), and (ZI-3) which will be described later.

Moreover, it may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of one compound represented by General Formula (ZI).

More preferred examples of the component (ZI) include the compounds (ZI-1), (ZI-2), and (ZI-3) which will be described later.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group and the remainders are an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an ayldicycloalkylsulfonium compound.

The aryl group of the arylsulfonium compound is preferably an aryl group such as a phenyl group and a naphthyl group, or a heteroaryl group such as an indole residue and a pyrrole residue, and is more preferably a phenyl group or an indole residue. In a case where the arylsulfonium compound has two or more aryl groups, two or more aryl groups that are present may be the same as or different from each other.

The alkyl group that the arylsulfonium compound may have, if desired, is preferably a linear or branched alkyl group having 1 to 15 carbon atoms, and examples thereof include a methyl group, an ethyl group, a propyl group, an n-butyl group, a sec-butyl group, and a t-butyl group.

The cycloalkyl group which the arylsulfonium compound may have, if desired, is preferably a cycloalkyl group having 3 to 15 carbon atoms, and examples thereof include a cyclopropyl group, a cyclobutyl group, and a cyclohexyl group.

The aryl group, the alkyl group, or the cycloalkyl group of each of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group. Preferred substituents are a linear or branched alkyl group having 1 to 12 carbon atoms, a cycloalkyl group having 3 to 12 carbon atoms, or a linear, branched, or cyclic alkoxy group having 1 to 12 carbon atoms, and particularly preferably an alkyl group having 1 to 4 carbon atoms or an alkoxy group having 1 to 4 carbon atoms. The substituent may be substituted with any one or all of three $R_{201}$ to $R_{203}$. Incidentally, in a case where $R_{201}$ to $R_{203}$ are each an aryl group, the substituent is preferably substituted at the p-position of the aryl group.

Next, the compound (ZI-2) will be described. The compound (ZI-2) is a compound in which $R_{201}$ to $R_{203}$ in Formula (ZI) each independently represent an organic group not containing an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear, branched, or cyclic 2-oxoalkyl group, or an alkoxycarbonylmethyl group, and particularly preferably a linear or branched 2-oxoalkyl group.

The alkyl group as each of $R_{201}$ to $R_{203}$ may be linear or branched, and preferred examples thereof include linear or branched alkyl groups having 1 to 10 carbon atoms (for example, a methyl group, an ethyl group, a propyl group, a butyl group, and a pentyl group). The alkyl group as each of $R_{201}$ to $R_{203}$ is a linear or branched 2-oxoalkyl group or an alkoxycarbonylmethyl group.

Preferred examples of the cycloalkyl group as each of $R_{201}$ to $R_{203}$ include cycloalkyl groups having 3 to 10 carbon atoms (a cyclopentyl group, a cyclohexyl group, and a norbornyl group). The cycloalkyl group as each of $R_{201}$ to $R_{203}$ is preferably a cyclic 2-oxoalkyl group.

Preferred examples of the linear, branched, or cyclic 2-oxoalkyl group as each of $R_{201}$ to $R_{203}$ include a group having >C=O at the 2-position of the alkyl group and the cycloalkyl group.

Preferred examples of the alkoxy group in the alkoxycarbonylmethyl group as each of $R_{201}$ to $R_{203}$ include an alkoxy group having 1 to 5 carbon atoms (a methoxy group, an ethoxy group, a propoxy group, a butoxy group, and a pentoxy group).

$R_{201}$ to $R_{203}$ may further be substituted with a halogen atom, an alkoxy group (for example, having 1 to 5 carbon atoms), a hydroxyl group, a cyano group, or a nitro group.

The compound (ZI-3) is a compound represented by the following General Formula (ZI-3), and is also a compound having a phenacylsulfonium salt structure.

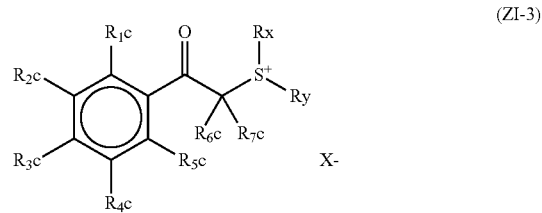

(ZI-3)

In General Formula (ZI-3), $R_1c$ to $R_5c$ each independently represent a hydrogen atom, an alkyl group, a cycloalkyl group, an alkoxy group, or a halogen atom.

$R_6c$ and $R_7c$ each independently represent a hydrogen atom, an alkyl group, or a cycloalkyl group.

Rx and Ry each independently represent an alkyl group, a cycloalkyl group, an allyl group, or a vinyl group.

Any two or more members out of $R_1c$ to $R_7c$, and Rx and Ry may be bonded to each other to form a ring structure, and these ring structures may include an oxygen atom, a sulfur atom, an ester bond, or an amide bond. The group formed by bonding of any two or more members out of $R_1c$ to $R_7c$, and Rx and Ry include a butylene group and a pentylene group.

$X^-$ represents a non-nucleophilic anion, and examples thereof include the same ones as the non-nucleophilic anion of $X^-$ in General Formula (ZI).

The alkyl group as each of $R_1c$ to $R_7c$ may be linear or branched, and preferred examples thereof include linear or branched alkyl groups having 1 to 20 carbon atoms, and preferably linear or branched alkyl groups having 1 to 12 carbon atoms (for example, a methyl group, an ethyl group, a linear or branched propyl group, a linear or branched butyl group, and a linear or branched pentyl group).

Preferred examples of the cycloalkyl group as each of $R_1c$ to $R_7c$ include cycloalkyl groups having 3 to 8 carbon atoms (a cyclopentyl group and a cyclohexyl group).

The alkoxy group as each of $R_1c$ to $R_5c$ may be linear, branched, or cyclic, and examples thereof include alkoxy groups having 1 to 10 carbon atoms, and preferably linear and branched alkoxy groups having 1 to 5 carbon atoms (for example, a methoxy group, an ethoxy group, a linear or branched propoxy group, a linear or branched butoxy group, and a linear or branched pentoxy group), and cyclic alkoxy groups having 3 to 8 carbon atoms (for example, a cyclopentyloxy group and a cyclohexyloxy group).

It is preferable that any one of $R_1c$ to $R_5c$ is a linear or branched alkyl group, a cycloalkyl group, or a linear, branched, or cyclic alkoxy group, and it is more preferable that the sum of the numbers of carbon atoms of $R_1c$ to $R_5c$ is 2 to 15. Thus, the solvent solubility is more improved, and the generation of the particles during storage is suppressed.

Examples of the alkyl group as each of Rx and Ry include the same groups as the alkyl group as each of $R_1c$ to $R_7c$. The alkyl group as each of Rx and Ry is preferably a linear or branched 2-oxoalkyl group or an alkoxycarbonylmethyl group.

Examples of the cycloalkyl group as each of Rx and Ry include the same groups as the cycloalkyl group as each of $R_1c$ to $R_7c$. The cycloalkyl group as each of Rx and Ry is preferably a cyclic 2-oxoalkyl group.

Examples of the linear, branched, or cyclic 2-oxoalkyl group include the alkyl group as each of $R_1c$ to $R_7c$, and a group having >C=O at the 2-position of the cycloalkyl group.

Examples of the alkoxy group in the alkoxycarbonylmethyl group include the same groups as the alkoxy groups as $R_1c$ to $R_5c$.

Rx and Ry are each preferably an alkyl group having 4 or more carbon atoms, more preferably an alkyl group having 6 or more carbon atoms, and still more preferably an alkyl group having 8 or more carbon atoms.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and a phenyl group is more preferable.

The alkyl group as each of $R_{204}$ to $R_{207}$ may be linear or branched, and preferred examples thereof include linear or branched alkyl groups having 1 to 10 carbon atoms (for example, a methyl group, an ethyl group, a propyl group, a butyl group, and a pentyl group).

Examples of the cycloalkyl group as each of $R_{204}$ to $R_{207}$ include cycloalkyl groups having 3 to 10 carbon atoms (for example, a cyclopentyl group, a cyclohexyl group, and a norbornyl group).

$R_{204}$ to $R_{207}$ may have a substituent. Examples of the substituent which may be included in $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$X^-$ represents a non-nucleophilic anion, and examples thereof include the same ones as the non-nucleophilic anion of $X^-$ in General Formula (ZI).

Preferred examples of the compound that generates an acid upon irradiation with actinic ray or radiation further include compounds represented by the following General Formulae (ZIV), (ZV), and (ZVI).

$$Ar_3\text{—}SO_2\text{—}SO_2\text{—}Ar_4 \quad \text{ZIV}$$

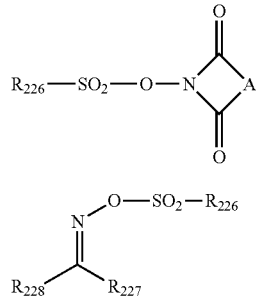

In General Formulae (ZIV) to (ZVI).

$Ar_3$ and $Ar_4$ each independently represent an aryl group.

$R_{226}$ represents an alkyl group or an aryl group.

$R_{227}$ and $R_{228}$ each independently represent an alkyl group, an aryl group, or an electron-withdrawing group. $R_{227}$ is preferably an aryl group.

$R_{228}$ is preferably an electron-withdrawing group, and more preferably a cyano group or a fluoroalkyl group.

A represents an alkylene group, an alkenylene group, or arylene group.

As the compound that generates an acid upon irradiation with actinic ray or radiation, compounds represented by General Formulae (ZI) to (ZIII) are preferable.

The compound (B) is preferably a compound that generates aliphatic sulfonic acid having a fluorine atom or benzenesulfonic acid having a fluorine atom upon irradiation with actinic ray or radiation.

The compound (B) preferably has a triphenylsulfonium structure.

The compound (B) is preferably a triphenylsulfonium salt compound having an alkyl group or cycloalkyl group, not having a cationic moiety substituted with fluorine.

Among the compounds that generate an acid upon irradiation with actinic ray or radiation, for example, the following ones are particularly preferable.

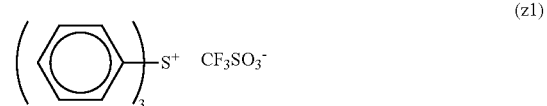

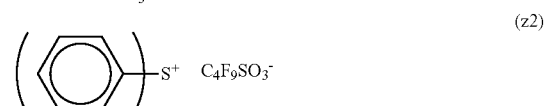

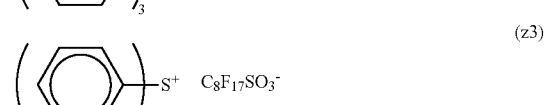

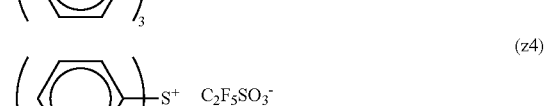

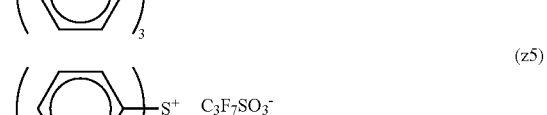

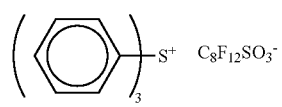 (z6)
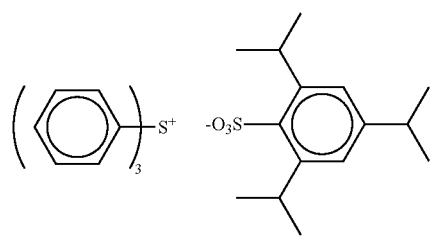 (z7)
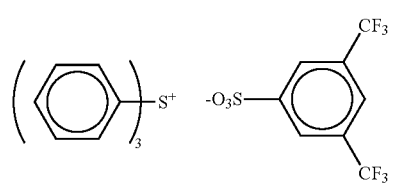 (z8)
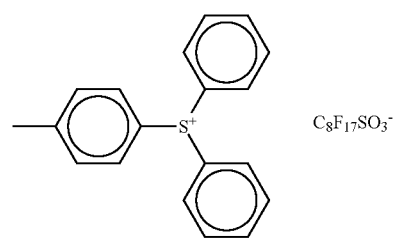 (z9)
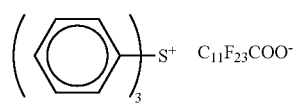 (z10)
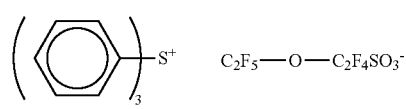 (z11)
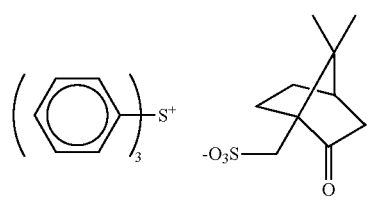 (z12)
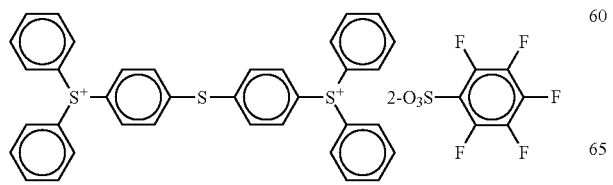 (z13)
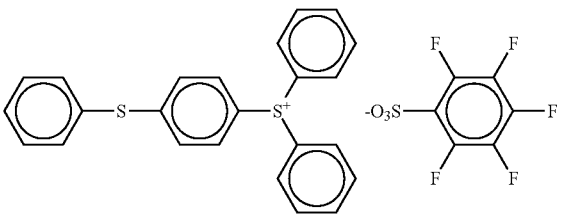 (z14)
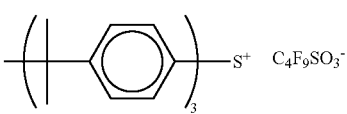 (z15)
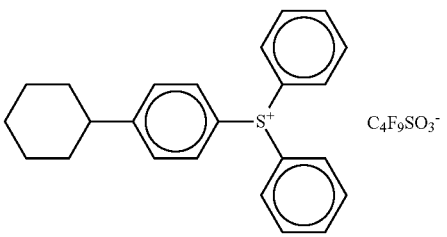 (z16)
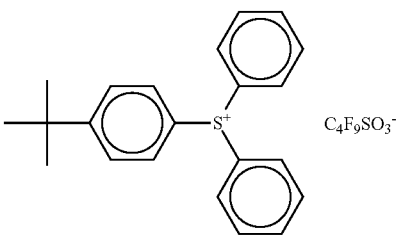 (z17)
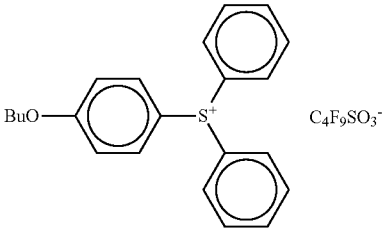 (z18)
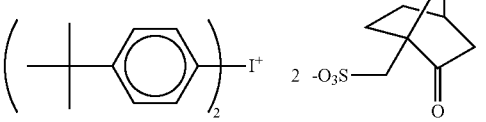 (z19)
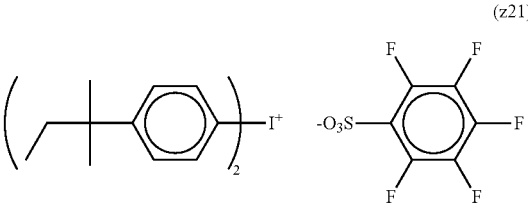 (z20)
(z21)

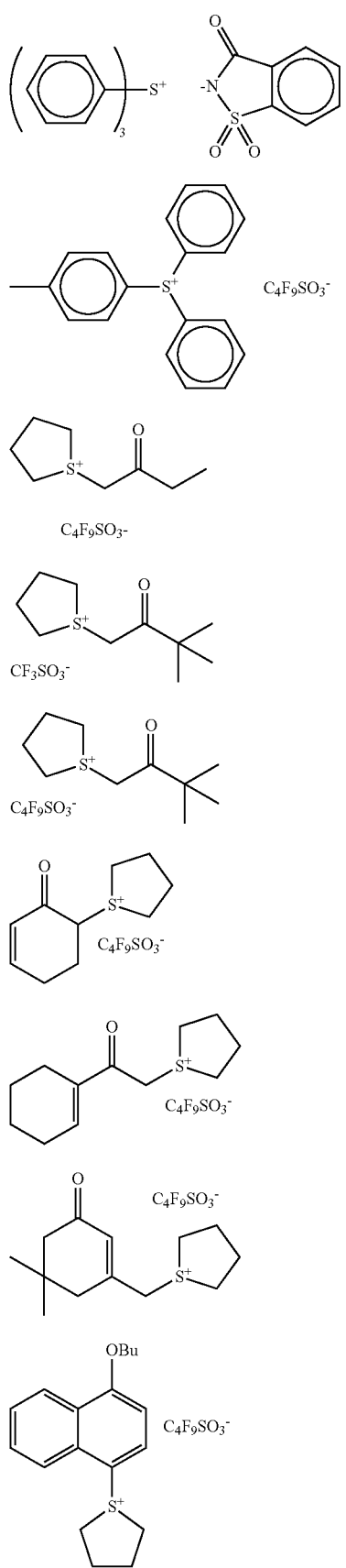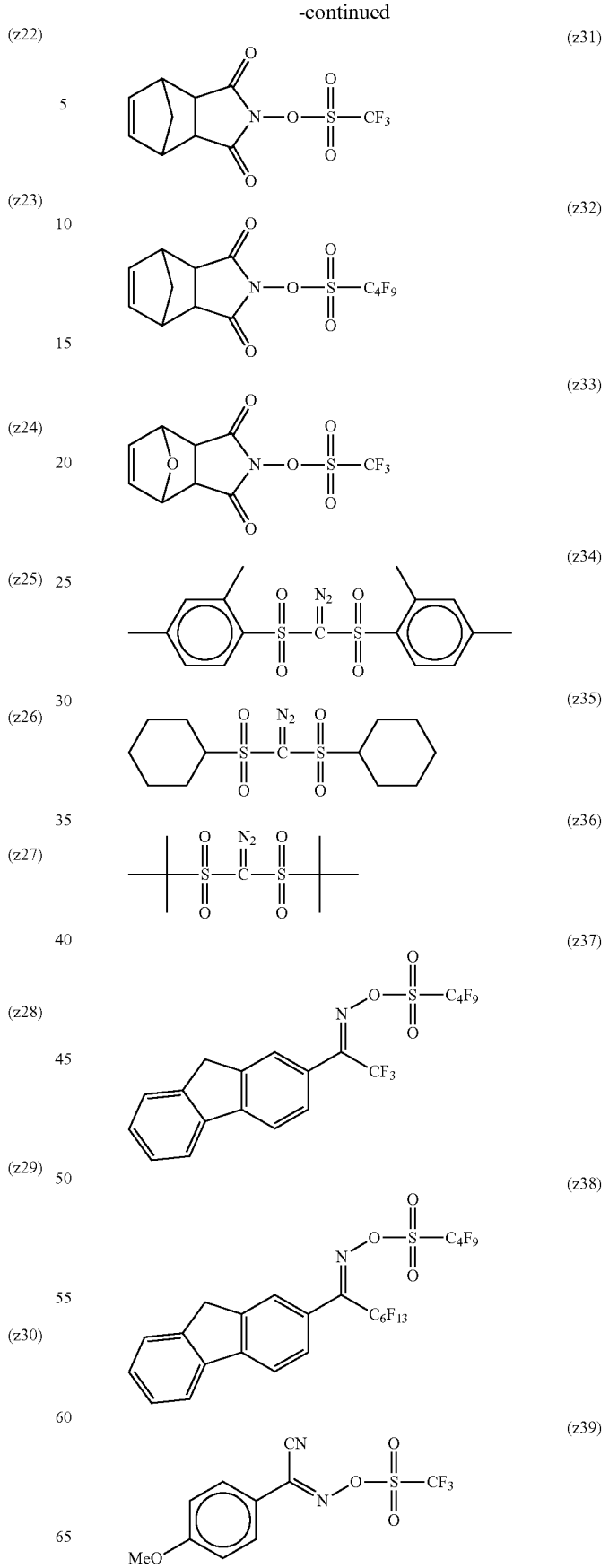

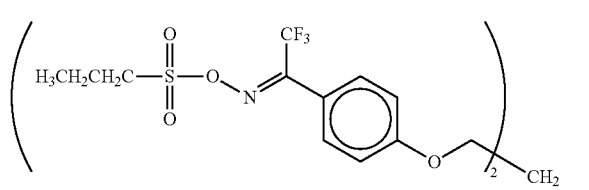
(z40)
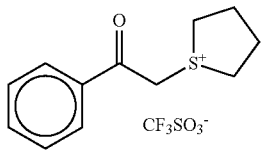
(z41)
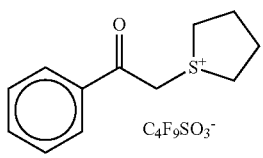
(z42)
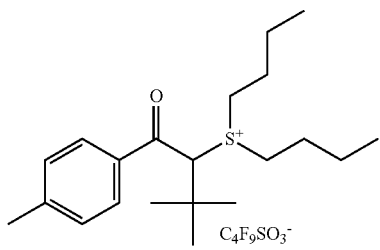
(z43)
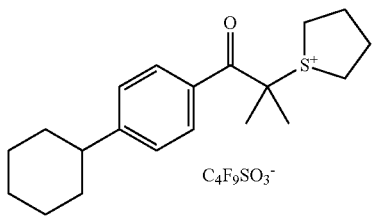
(z44)
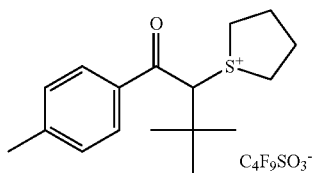
(z45)
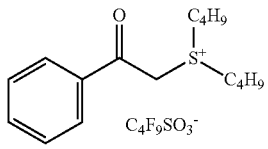
(z46)
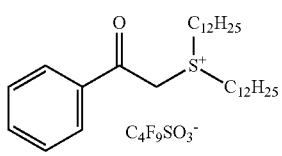
(z47)
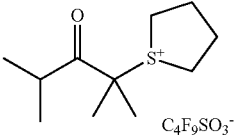
(z48)
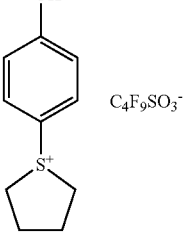
(z49)
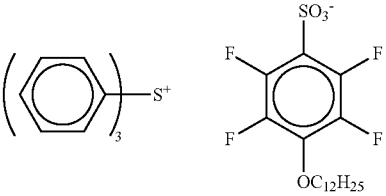
(z50)
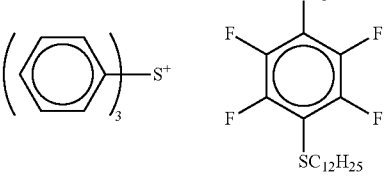
(z51)
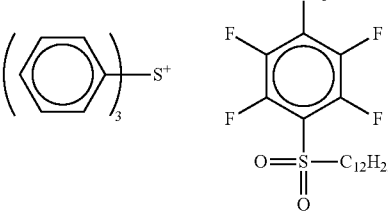
(z52)
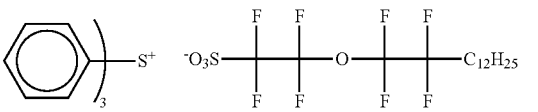
(z53)
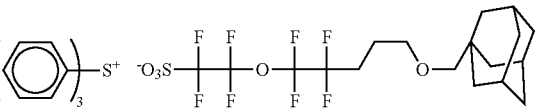
(z54)
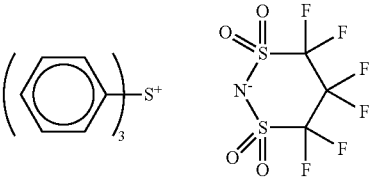
(z55)
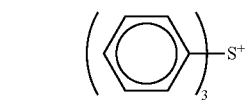

-continued
(z56) 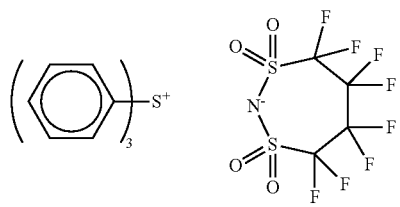
(z57) 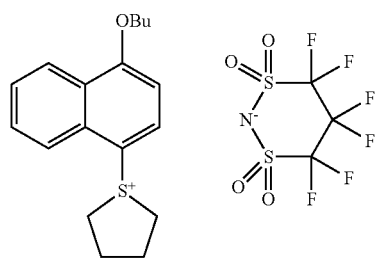
(z58) 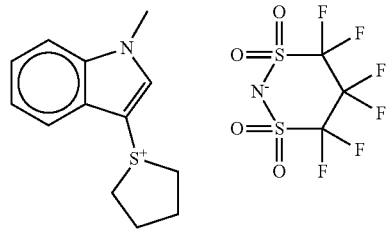
(z59) 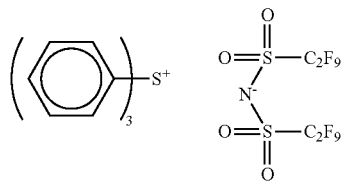
(z60) 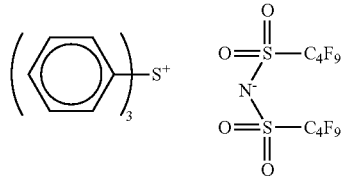
(z61) 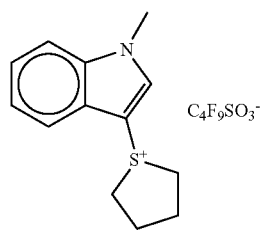
(z62) 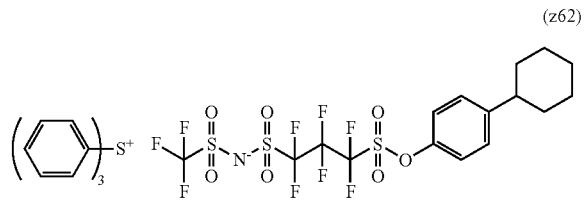
-continued
(z63) 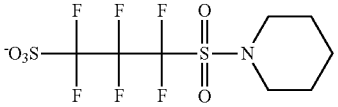
(z64) 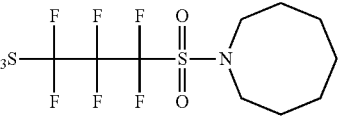
(z65) 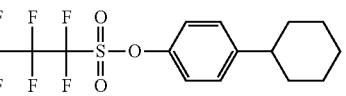
(z66) 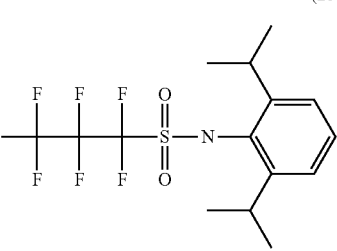
(z67) 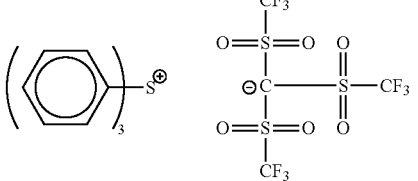
(z68) 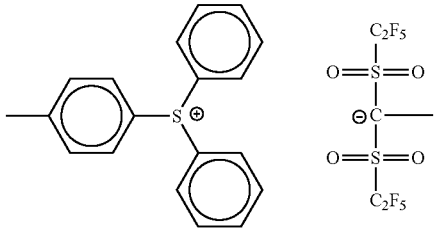
(z69) 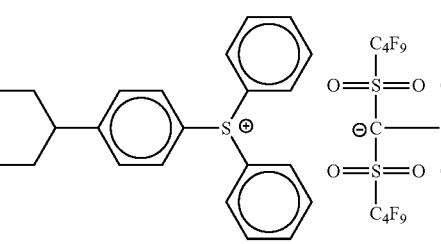

-continued (z70) 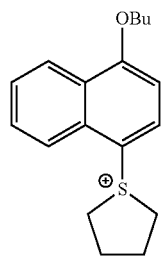 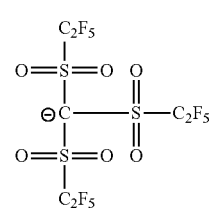

(z71) 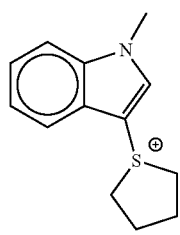 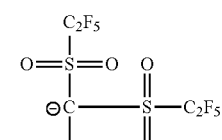

(z72) 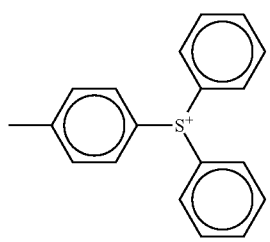

(z73) 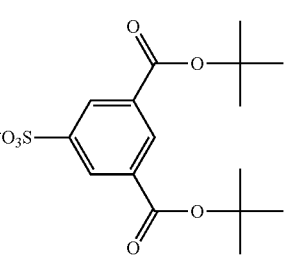

(z74) 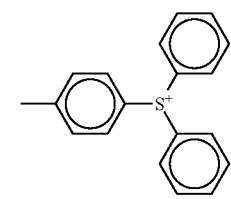 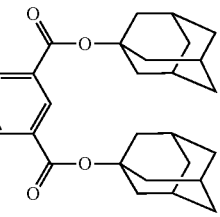

(z75) 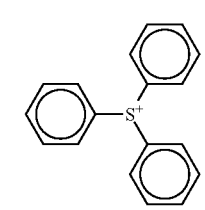 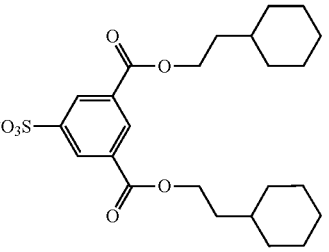

-continued (z76) 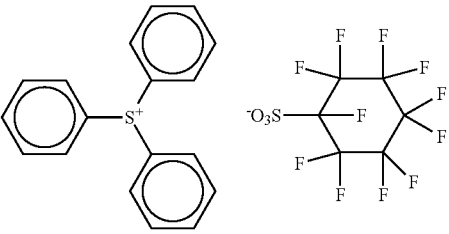

(z77) 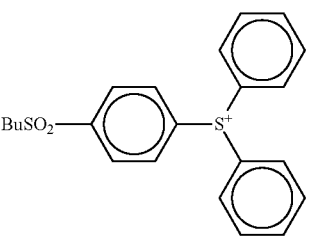

(z78) 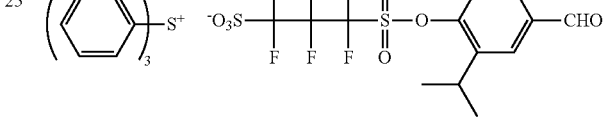

The photoacid generator can be used singly or in combination of two or more kinds thereof. When the photoacid generator is used in combination of two or more kinds thereof, it is preferable to combine compounds that generate two different kinds of organic acids having the total number of atoms excluding hydrogen atoms of 2 or more.

The content of the photoacid generator is preferably 0.1% to 20% by mass, more preferably 0.5% to 10% by mass, and still more preferably 1% to 7% by mass, with respect to the total solid content of the actinic ray-sensitive or radiation-sensitive resin composition. By setting the content of the photoacid generator to the range, the exposure latitude when a resist pattern is formed is improved, or the crosslinking reactivity of the crosslinking layer forming material is improved.

(C) Solvent

The actinic ray-sensitive or radiation-sensitive resin composition of the present invention may contain a solvent. Examples of the solvent which can be used when the respective components are dissolved to prepare an actinic ray-sensitive or radiation-sensitive resin composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate. Butyl butanoate, isoamyl acetate, or methyl 2-hydroxyisobutyrate may also be used as a solvent.

In the present invention, the solvents may be used singly or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (based on the mass) of the solvent containing a hydroxyl group to the solvent not containing a hydroxyl group is preferably 1/99 to 99/1, more preferably 10/90 to 90/10, and still more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Basic Compound

The actinic ray-sensitive or radiation-sensitive resin composition of the present invention preferably contains a basic compound (E) in order to reduce a change in performance over time from exposure to heating.

Preferred examples of the basic compound include compounds having structures represented by the following Formulae (A) to (E).

(A)

(B)

(C)

(D)

(E)

In General Formulae (A) to (E), $R^{200}$, $R^{201}$, and $R^{202}$ may be the same as or different from each other, represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure: an alkylamine derivative having a hydroxyl group and/or an ether bond: and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

These basic compounds may be used singly or in combination of two or more kinds thereof.

The amount of the basic compound to be used is usually 0.001% to 10% by mass, and preferably 0.01% to 5% by mass, with respect to the solid content of the actinic ray-sensitive or radiation-sensitive resin composition.

The ratio between the acid generator to the basic compound to be used in the composition is preferably the acid generator/basic compound (molar ratio)=2.5 to 300. That is, the molar ratio is preferably 2.5 or more in view of sensitivity and resolving power, and is preferably 300 or less in view of suppressing the reduction in resolution due to thickening of the resist pattern with aging after exposure until the heat treatment. The acid generator/basic compound (molar ratio) is more preferably 5.0 to 200, and still more preferably 7.0 to 150.

(E) Hydrophobic Resin

The actinic ray-sensitive or radiation-sensitive resin composition of the present invention may further contain a hydrophobic resin. As the hydrophobic resin, those having any one or more kinds of a fluorine atom, a silicon atom, and a $CH_3$ partial structure contained in the side chain moiety of the resin. Specifically, the same resin as the resin (X) contained in the above-mentioned composition for forming a protective film can be used.

(F) Surfactant

The actinic ray-sensitive or radiation-sensitive resin composition of the present invention preferably further contains a surfactant (F), and more preferably contains either one or two or more of fluorine- and/or silicon-based surfactants (a fluorine-based surfactant, a silicon-based surfactant, or a surfactant containing both a fluorine atom and a silicon atom).

By incorporating the surfactant (F) into the actinic ray-sensitive or radiation-sensitive resin composition of the present invention, it becomes possible to form a resist pattern which is improved in adhesiveness and decreased in development defects with good sensitivity and resolution at a time of using an exposure light source of 250 nm or less, and particularly 220 nm or less.

Examples of the fluorine-based and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP997-5988A (JP-H09-5988A), JP2002-277862A, U.S. Pat. Nos. 5,405,720, 5,360,692, 5,529,881, 5,296,330, 5,436,098, 5,576,143, 5,294,511, and 5,824,451, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.): FLORAD FC430, 431, and 4430 (manufactured by Sumitomo 3M Inc.); MEGAFACE F171, F173, F176, F189, F113, F110, F177, F120, and $R_{08}$ (manufactured by DIC Corp.); SURFLON S-382, SC101, 102, 103, 104, 105, and 106 (manufactured by Asahi Glass Co. Ltd.): TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.): EFTOP EF121, EF122A, EF122B. RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G 208G 218G 230G 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991 A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly (oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxyethylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFACE F178, F-470, F-473, F-475, F-476, and F-472 (manufactured by DIC Corp.): a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine-based and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The content of the surfactant (F) to be used is preferably 0.01% to 10% by mass, and more preferably 0.1% to 5° % by mass, with respect to the total amount (excluding the solvent) of the actinic ray-sensitive or radiation-sensitive resin composition.

(G) Onium Carboxylate Salt

The actinic ray-sensitive or radiation-sensitive resin composition in the present invention may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium carboxylate salt and a sulfonium carboxylate salt are particularly preferable. Further, it is preferable that the carboxylate residue of the onium carboxylate salt (H) does not contain an aromatic group and a carbon-carbon double bond. As the anionic moiety, a linear, branched, monocyclic, or polycyclic alkylcarboxylate anion having 1 to 30 carbon atoms is preferable. Further, a carboxylate anion in which a part or all of the alkyl groups are substituted with fluorine is more preferable. An oxygen atom may be contained in the alkyl chain, by which the transparency to the lights of 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid, and the like.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the composition.

(H) Other Additives

The actinic ray-sensitive or radiation-sensitive resin composition of the present invention can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

In the organic solvent developer, the alkali developer, and/or the rinsing liquid which can be used in the present invention, the content of various fine particles or impurities such as metal element is preferably small. In order to obtain such a chemical solution with few impurities, it is preferable to reduce the impurities, for example, by producing the chemical solution in a clean room or carrying out filtration through various filters such as a Teflon (registered trademark) filer, a polyolefin-based filter, and an ion exchange filter. As for the metal element, any of metal element concentrations of Na, K. Ca, Fe, Cu, Mg, Mn, Li, Al, Cr, Ni, and Zn is preferably 10 ppm or less, and more preferably 5 ppm or less.

Furthermore, the container for storing the developer or rinsing liquid is not particularly limited, and a container made of a polyethylene resin, a polypropylene resin, a polyethylene-polypropylene resin or the like, which is used in the application of electronic materials, may be used, but in order to reduce impurities dissolved out from the container, it is also preferred to select a container that is less likely to cause elution of a component from the inner wall of the container to the chemical solution. Such a container includes a container where the inner wall of the container is formed of a perfluororesin (for example, a FluoroPure PFA composite drum (inner surface coming into contact with liquid: PFA resin lining) manufactured by Entegris, and a steel-made drum (inner surface coming into contact with liquid: zinc phosphate coat) manufactured by JFE), and the like.

It is preferable that various materials (for example, a developer, a rinsing liquid, a composition for forming an antireflection film, and a composition for forming a topcoat) used in the actinic ray-sensitive or radiation-sensitive resin composition of the present invention, and the pattern forming method of the present invention do not include impurities such as a metal. The content of the metal components included in these materials is preferably 10 ppm or less, more preferably 5 ppm or less, still more preferably 1 ppm or less, and particularly preferably substantially not metal components (no higher that the detection limit of a measurement device).

Examples of the method for removing impurities such as a metal from various materials include filtration using a filter. As for the filter pore diameter, the pore size is preferably 50 nm or less, more preferably 10 nm or less, and still more preferably 5 nm or less. As the material of the filter, a polytetrafluoroethylene-made filter, a polyethylene-made filter, or a nylon-made filter is preferable. In the step of filtration using a filter, plural kinds of filters may be connected in series or in parallel, and used. In a case of using plural kinds of filters, a combination of filters having different pore diameters and/or materials may also be used. In addition, the composition may be filtrated plural times, and the step for filtering the composition plural times may be a cyclic filtering step.

Moreover, examples of the method for reducing the impurities such as metals included in the various materials include a method of selecting raw materials having a small content of metals as raw materials constituting various materials, subjecting raw materials constituting various materials to filtration using a filter. In the preferred conditions for filtration using a filter, performed for raw materials constituting various materials are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

An electrically conductive compound may be added to the organic treatment liquid (a developer, a rinsing liquid, or the like) of the present invention in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint of maintaining preferred development characteristics, it is preferably 10%/o by mass or less, and more preferably 5% by mass or less. For members of the chemical solution pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or fluorine resin (a polytetrafluoroethylene or perfluoroalkoxy resin, or the like) that has been subjected to an antistatic treatment can be used.

The pattern formed by the method of the present invention is typically used as a mask in an etching step for manufacture of a semiconductor, but may also be used in other applications. Examples of such other applications include guide pattern formation (see, for example, ACS Nano Vol. 4 No. 8 Pages 4815 to 4823) in Directed Self-Assembly (DSA), a use as a core of a so-called spacer process (see, for example, JP1991-270227A (JP-H03-270227A) and JP2013-164509A).

Moreover, the present invention also relates to a method for manufacturing an electronic device, including the pattern forming method of the present invention as described above, and an electronic device manufactured by this manufacturing method.

The electronic device of the present invention is suitably mounted in electrical or electronic equipments (household electronic appliance, Office Automation (OA)/media-related equipment, optical equipment, telecommunication equipment, and the like).

EXAMPLES

Hereinafter, the present invention will be described with reference to Examples, but the contents of the present invention are not limited thereto.

<Synthesis of Acid-Decomposable Resin>

Synthesis Example 1

Synthesis of Resin (1)

102.3 parts by mass of cyclohexanone was heated at 80° C. under a nitrogen stream. While stirring this liquid, a mixed solution of 22.2 parts by mass of a monomer represented by the following Structural Formula M-1, 22.8 parts by mass of a monomer represented by the following Structural Formula M-2, 6.6 parts by mass of a monomer represented by the following Structural Formula M-3, 189.9 parts by mass of cyclohexanone, and 2.40 parts by mass of dimethyl 2,2'-azobisisobutyrate [V-601, manufactured by Wako Pure Chemical Industries, Ltd.] was added dropwise to the liquid for 5 hours. After completion of the dropwise addition, the mixture was further stirred at 80° C. for 2 hours. After being left to be cooled, the reaction liquid was reprecipitated with a large amount of hexane/ethyl acetate (mass ratio of 9:1) and filtered, and the obtained solid was dried in vacuum to obtain 41.1 parts by mass of a resin (1).

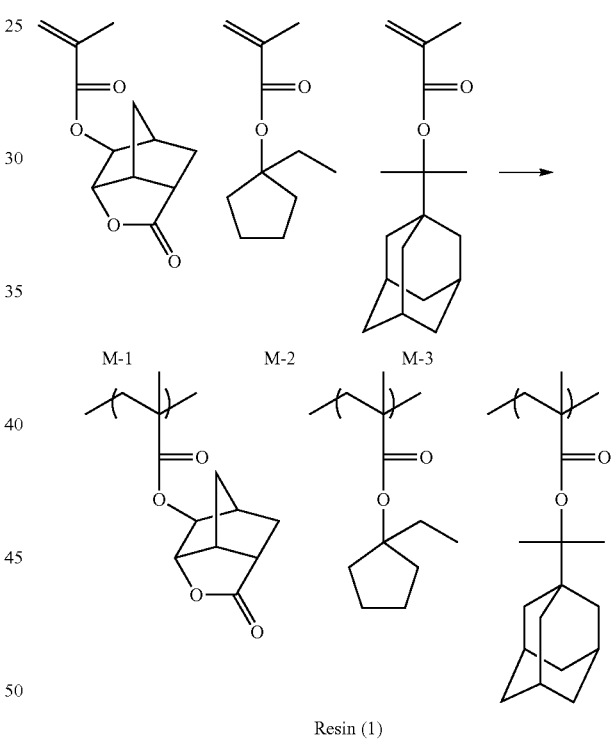

Resin (1)

The weight-average molecular weight (Mw: in terms of polystyrene) of the obtained resin (1), as determined by GPC (carrier: tetrahydrofuran (THF)) was Mw=9,500, and the dispersity was Mw/Mn=1.62. The compositional ratio measured by $^{13}$C-NMR was 40/50/10 in terms of a molar ratio.

By carrying out the same operation as in Synthesis Example 1, the resins (2) to (12) described below were synthesized as an acid-decomposable resin.

[Preparation of Resist Composition]

The components shown in Table 1 were dissolved in solvents to prepare solutions each having a concentration of the solid content of 3.5% by mass, and the solutions were filtered through a polyethylene filter having a pore size of 0.03 μm to prepare resist compositions.

TABLE 1

(Resist Composition)

| | Acid-decomposable resin (10 g) | Photoacid generator (g) | Basic compound (g) | Hydrophobic resin (0.05 g) | Solvent (mass ratio) | Surfactant (10 mg) |
|---|---|---|---|---|---|---|
| Re-1 | Resin (1) | B1 (1.5) | D-2 (0.61) | 1b | A1 | W-1 |
| Re-2 | Resin (2) | B2 (1.6) | D-5 (0.31) | 2b | A1/A2 = 70/30 | — |
| Re-3 | Resin (3) | B3 (1.6) | D-3 (0.30) | 3b | A1/B1 = 80/20 | — |
| Re-4 | Resin (4) | B4 (1.6) | D-4 (0.30) | 4b | A1 | W-3 |
| Re-5 | Resin (5) | B5 (1.8) | D-1 (0.70) | 4b | A1 | — |
| Re-6 | Resin (6) | B6 (1.7) | D-6 (0.30) | 1b | A1/B1 = 80/20 | — |
| Re-7 | Resin (7) | B7 (2.1) | D-4 (0.30) | 1b | A1/B1 = 90/10 | W-2 |
| Re-8 | Resin (8) | B8 (2.0) | D-8 (0.30) | 3b | A1 | — |
| Re-9 | Resin (9) | B9 (2.2) | D-7 (0.30) | 3b | A1/A2 = 80/20 | — |
| Re-10 | Resin (10) | B10 (1.9) | D-5 (0.31) | 1b | A1/B1 = 90/10 | — |
| Re-11 | Resin (11) | B11 (2.0) | D-5 (0.31) | 4b | A1 | — |
| Re-12 | Resin (12) | B12 (1.8} | D-8 (0.30) | 1b/5b (0.02 g/0.03 g) | A1/A3 = 95/5 | W-1 |
| Re-13 | Resin (2) | B1/B13 (1.1/1.3) | D-2 (0.61) | 4b | A1/A2 = 70/30 | W-1 |

The abbreviations to be used in the tables are as follows.
<Acid-Decomposable Resin>

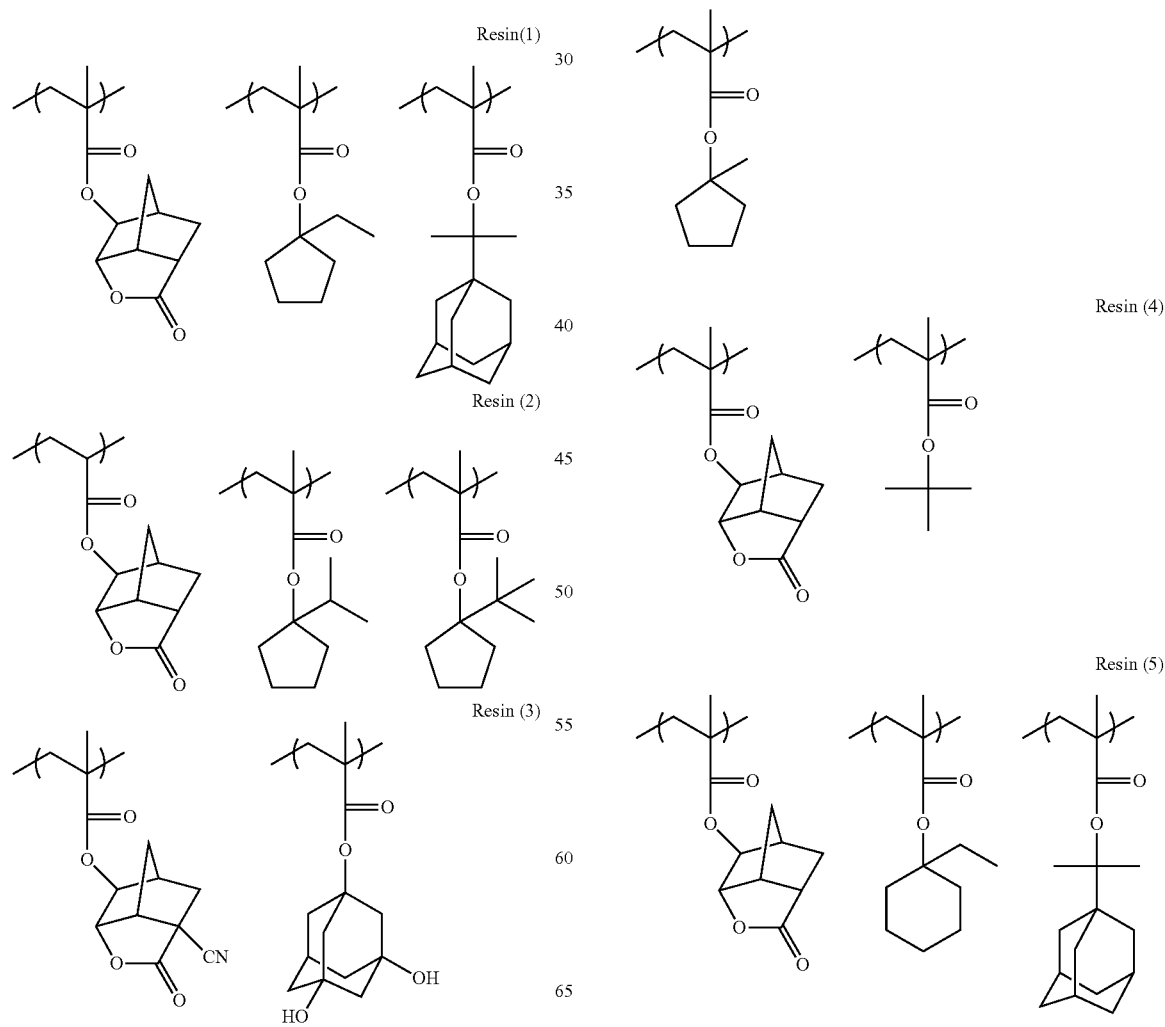

Resin (6)
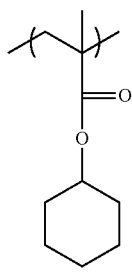
Resin (7)
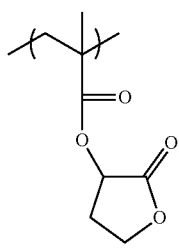 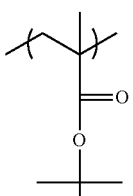 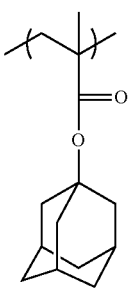
Resin(8)
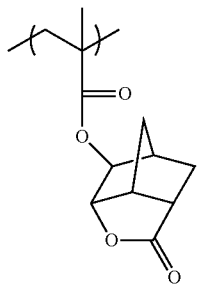 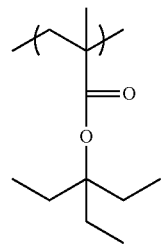 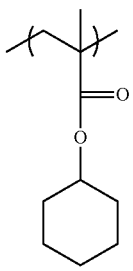
Resin (9)
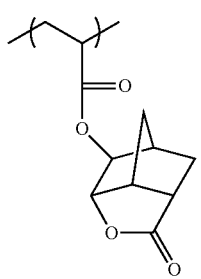 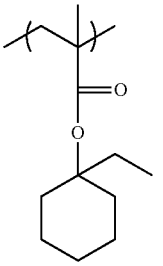 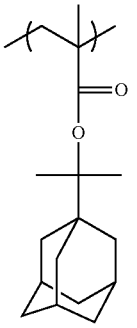
Resin (10)
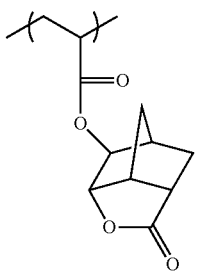 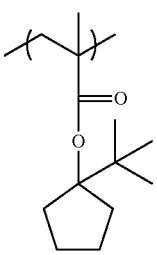
Resin (11)
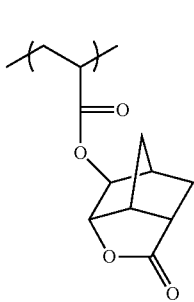 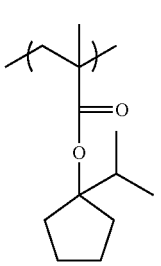 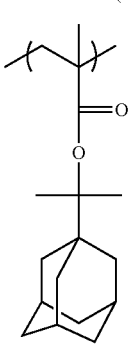
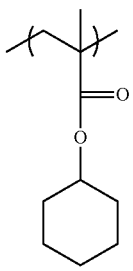
Resin (12)
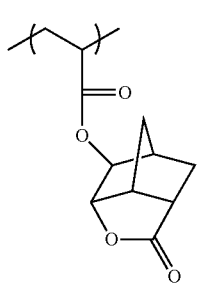 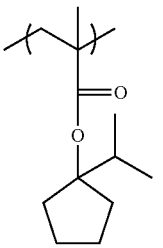 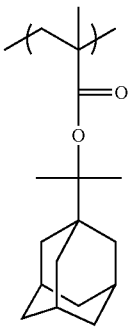
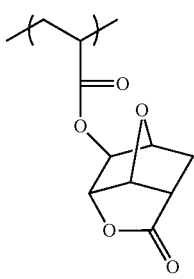
The compositional ratios (molar ratios; corresponding to the repeating units in order from the left side), the weight-average molecular weights (Mw), and the dispersities (Mw/Mn) of the respective repeating units are shown in Table 2. These were determined by the same methods as for the resin (1) as described above.

TABLE 2
| Acid-decomposable resin | Compositional ratio (% by mole) | | | | Mw | Mw/Mn |
|---|---|---|---|---|---|---|
| Resin (1) | 40 | 50 | 10 | — | 9,500 | 1.62 |
| Resin (2) | 40 | 40 | 20 | — | 17,000 | 1.70 |
| Resin (3) | 45 | 5 | 50 | — | 11,000 | 1.63 |
| Resin (4) | 40 | 60 | — | — | 15,000 | 1.66 |
| Resin (5) | 40 | 40 | 10 | 10 | 10,500 | 1.62 |
| Resin (6) | 40 | 50 | 10 | — | 15,500 | 1.68 |
| Resin (7) | 40 | 60 | — | — | 11,000 | 1.65 |
| Resin (8) | 40 | 40 | 20 | — | 10,000 | 1.64 |
| Resin (9) | 40 | 50 | 10 | — | 9,000 | 1.60 |
| Resin (10) | 40 | 60 | — | — | 10,000 | 1.61 |
| Resin (11) | 40 | 40 | 10 | 10 | 8,500 | 1.60 |
| Resin (12) | 40 | 40 | 20 | — | 9,500 | 1.61 |
<Photoacid Generator>
B1
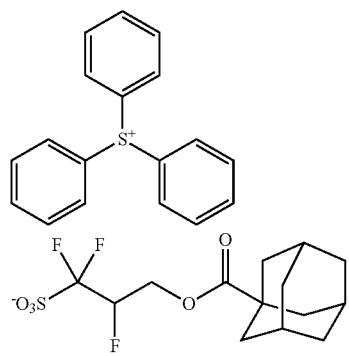
B2
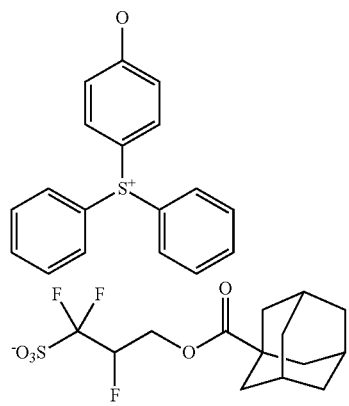
B3
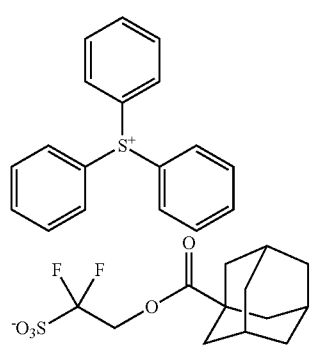
B4
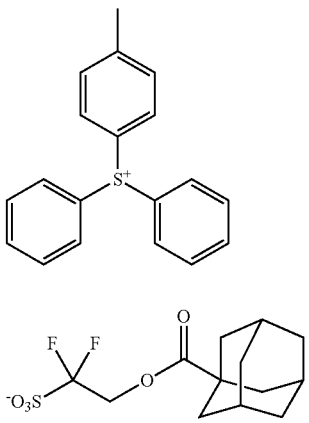
B5
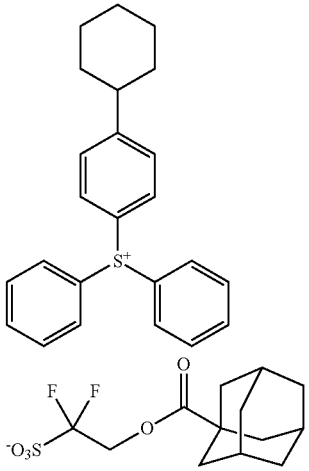
B6
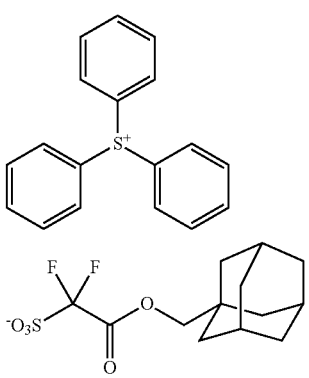
B7
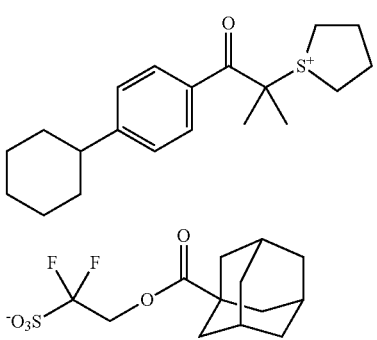

-continued
B8
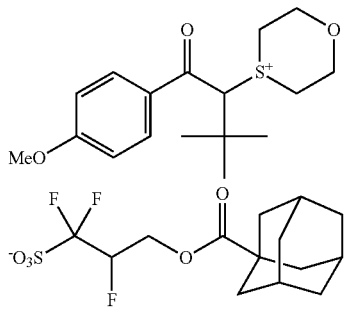
B9
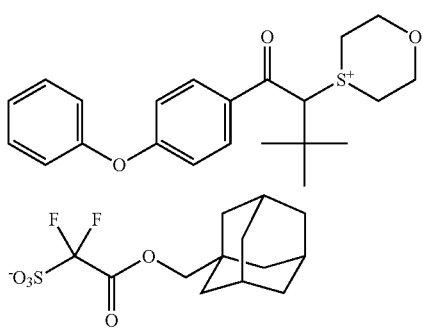
B10
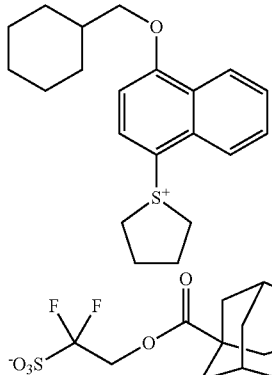
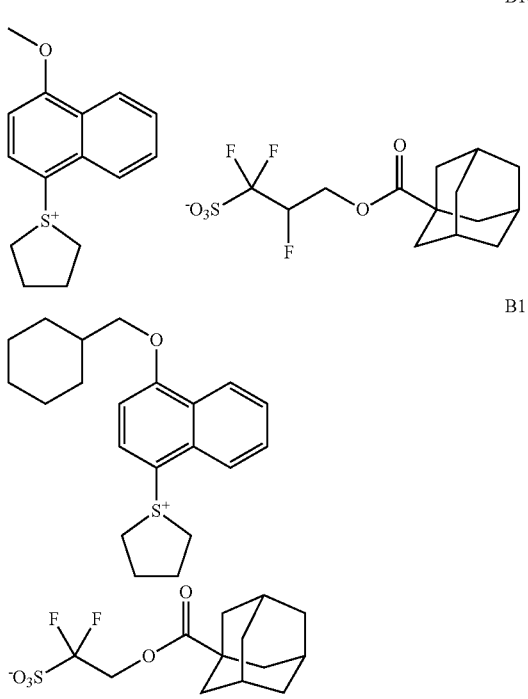
B11
B12
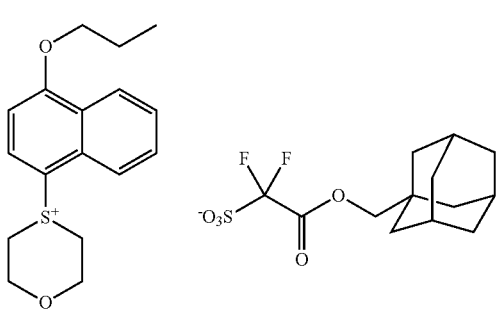
-continued
B13
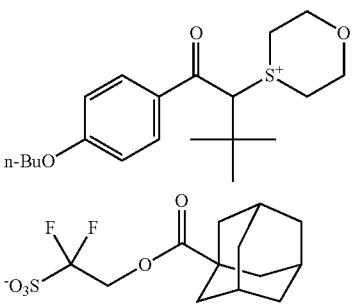
<Basic Compound>
As the acid diffusion control agent, the following compounds were used.
D-1
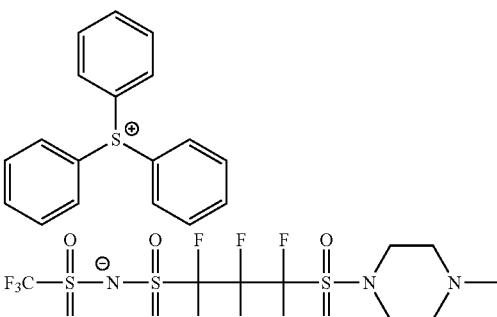
D-2
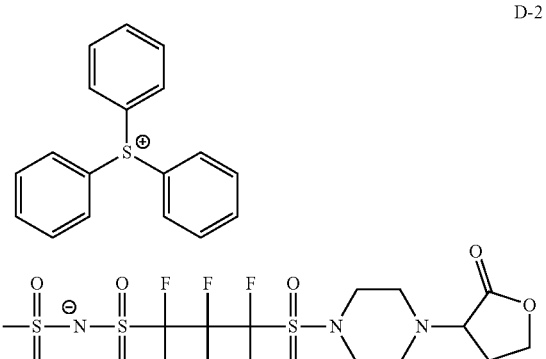
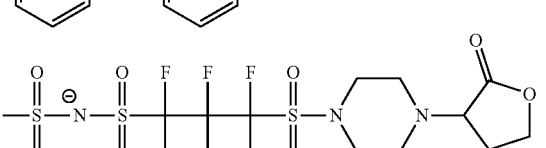
D-3
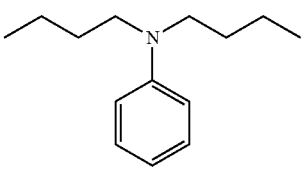
D-4
D-5
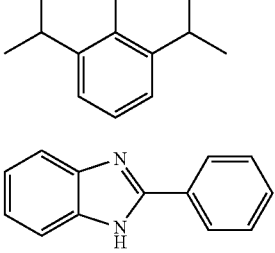

D-6

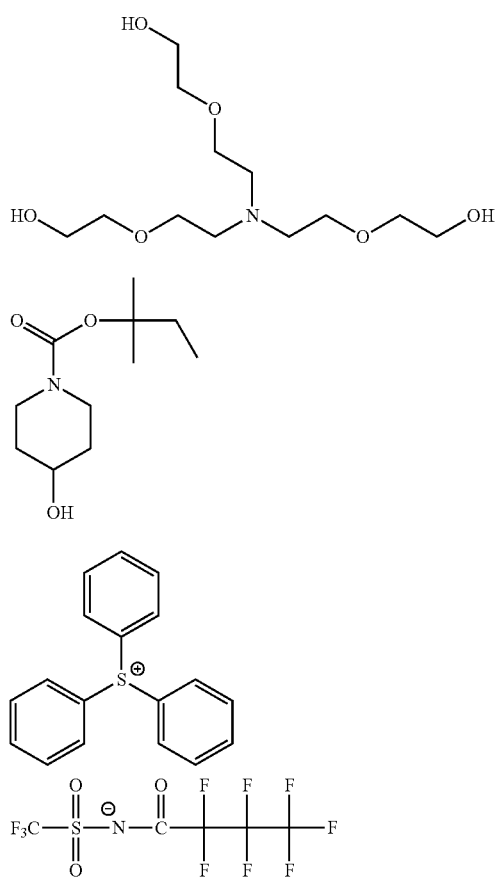

D-7

D-8

<Hydrophobic Resin>
As the hydrophobic resin, the following resins were used.

(1b)

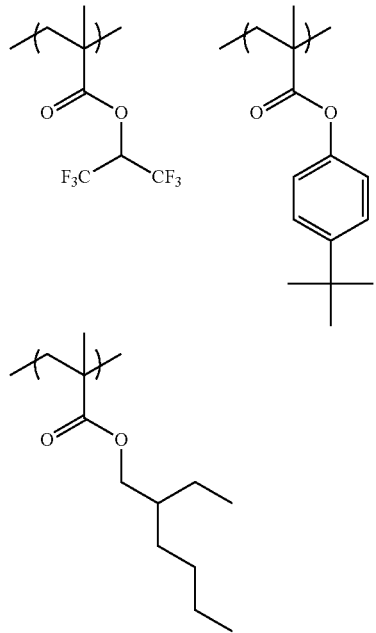

(2b)

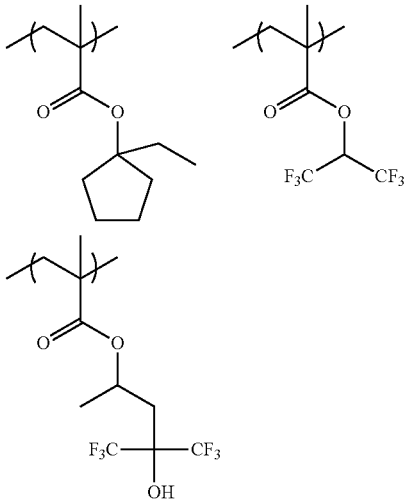

(3b)

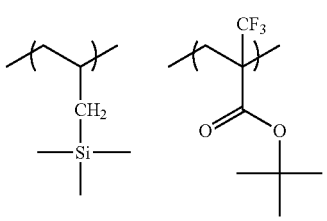

(4b)

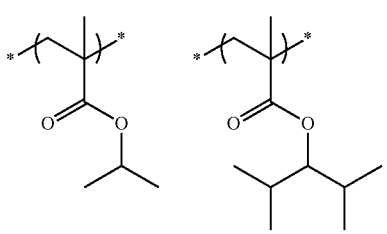

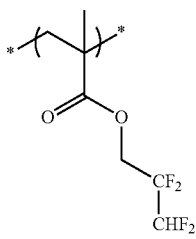

(5b)

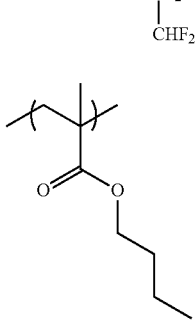

The compositional ratios (molar ratios: corresponding to the repeating units in order from the left side), the weight-average molecular weights (Mw), and the dispersities (Mw/Mn) of the respective repeating units are shown in Table 3. These were determined by the same methods as for the resin (1) as described above.

TABLE 3

| Hydrophobic resin | Compositional ratio (% by mole) | | | | Mw | Mw/Mn |
|---|---|---|---|---|---|---|
| Resin (1b) | 50 | 45 | 5 | — | 7,000 | 1.30 |
| Resin (2b) | 40 | 40 | 20 | — | 18,600 | 1.57 |
| Resin (3b) | 50 | 50 | — | — | 25,400 | 1.63 |
| Resin (4b) | 30 | 65 | 5 | — | 28,000 | 1.70 |
| Resin (5b) | 100 | — | — | — | 12,500 | 1.65 |

<Surfactant>

W-1: MEGAFACE F176 (manufactured by DIC, Inc.; fluorine-based)

W-2: MEGAFACE R08 (manufactured by DIC, Inc.; fluorine- and silicon-based)

W-3: PF6320 (manufactured by OMNOVA Solutions Inc.; fluorine-based)

<Solvent>

A1: Propylene glycol monomethyl ether acetate (PGMEA)

A2: Cyclohexanone

A3: γ-Butyrolactone

B1: Propylene glycol monomethyl ether (PGME)

[Preparation of Composition for Forming Protective Film]

The components shown in Table 4 were dissolved in the solvents shown in the same table to prepare solutions, each having a concentration of the solid content of 2.7% by mass, and the solutions were filtered through a polyethylene filter having a pore size of 0.03 μm in the same manner as for the resist to obtain compositions for forming a protective film. In the composition A-23, X23 and X1 were mixed at a mixing ratio of 7:3 (based on the mass) and used as the resin (X).

TABLE 4

(Composition for forming a protective film)

| Composition | Resin (X) | Repeating unit | | | Compositional ratio (% by mole) | Mw | Mw/Mn | Compound (A) (content/% by mass) | | Solvent |
|---|---|---|---|---|---|---|---|---|---|---|
| A-1 | X1 | TM-1 | — | — | 100 | 15,000 | 1.7 | TQ-2 | 2% | 4-Methyl-2-pentanol |
| A-2 | X2 | TM-1 | TM-6 | — | 60/40 | 18,000 | 1.8 | TQ-1 | 5% | 1-Pentanol |
| A-3 | X3 | TM-1 | TM-6 | — | 60/40 | 14,500 | 1.6 | TQ-1 | 6% | 3-Octanol |
| A-4 | X4 | TM-3 | — | — | 100 | 20,000 | 1.9 | TQ-8 | 3% | 3-Methyl-1-butanol |
| A-5 | X5 | TM-4 | — | — | 100 | 19,500 | 1.6 | TQ-10 | 4% | 3-Methyl-1-butanol |
| A-6 | X6 | TM-5 | TM-9 | TM-12 | 60/20/20 | 16,000 | 1.8 | TQ-13 | 8% | 4-Octanol |
| A-7 | X7 | TM-9 | — | — | 100 | 17,000 | 1.9 | TQ-21 | 6% | 4-Methyl-1-pentanol |
| A-8 | X8 | TM-1 | TM-5 | — | 50/50 | 16,500 | 1.5 | TQ-12 | 7% | 4-Methyl-2-pentanol |
| A-9 | X9 | TM-8 | TM-6 | — | 70/30 | 20,500 | 1.5 | TQ-9 | 2% | 4-Methyl-2-pentanol |
| A-10 | X10 | TM-1 | TM-5 | TM-11 | 60/30/10 | 19,000 | 1.7 | TQ-7 | 1% | 4-Methyl-2-pentanol |
| A-11 | X11 | TM-1 | TM-10 | — | 60/40 | 15,000 | 1.5 | TQ-18 | 4% | 4-Methyl-2-pentanol |
| A-12 | X12 | TM-1 | TM-2 | — | 60/40 | 16,000 | 1.9 | TQ-15 | 5% | 4-Methyl-2-pentanol |
| A-13 | X13 | TM-2 | TM-3 | — | 60/40 | 14,000 | 1.6 | TQ-2 | 6% | 4-Methyl-2-pentanol |
| A-14 | X14 | TM-1 | TM-5 | TM-7 | 50/25/25 | 15,000 | 1.5 | TQ-1 | 3% | 4-Methyl-2-pentanol |
| A-15 | X15 | TM-2 | TM-8 | — | 80/20 | 20,500 | 1.7 | TQ-5 | 4% | 4-Methyl-2-pentanol |
| A-16 | X16 | TM-3 | TM-7 | — | 80/20 | 16,000 | 1.5 | TQ-19 | 8% | 4-Methyl-2-pentanol |
| A-17 | X17 | TM-1 | TM-12 | — | 80/20 | 13,000 | 1.5 | TQ-16 | 6% | 4-Methyl-2-pentanol |
| A-18 | X18 | TM-9 | — | — | 100 | 18,500 | 1.6 | TQ-14 | 7% | 3-Octanol |
| A-19 | X19 | TM-1 | TM-10 | — | 90/10 | 14,000 | 1.5 | TQ-4 | 2% | 3-Methyl-1-butanol |
| A-20 | X20 | TM-3 | TM-6 | — | 80/20 | 15,000 | 2.0 | TQ-20 | 1% | 4-Methyl-2-pentanol |
| A-21 | X21 | TM-1 | TM-8 | — | 80/20 | 16,500 | 2.2 | TQ-6/TQ-7 | 2%/3% | 4-Methyl-1-pentanol |
| A-22 | X22 | TM-6 | TM-9 | — | 80/20 | 16,000 | 1.9 | TQ-1 | 6% | 3-Methylcyclopentanone |
| A-23 | X23 | TM-2 | TM-6 | TM-13 | 60/30/10 | 17,000 | 1.6 | TQ-11 | 3% | 4-Methyl-2-pentanol |
|  | X1 | TM-1 |  |  | 100 | 15,000 | 1.7 |  |  |  |
| A-24 | X24 | TM-5 | TM-11 | TM-12 | 60/30/10 | 17,500 | 1.6 | TQ-3/TQ-17 | 2%/2% | 4-Methyl-2-pentanol |
| A-25 | X25 | TM-5 | TM-9 | TM-13 | 60/20/20 | 17,500 | 1.8 | TQ-1 | 8% | 4-Methyl-2-pentanol |
| A-26 | X26 | TM-1 | TM-6 | TM-9 | 60/20/20 | 16,000 | 1.7 | TQ-19/TQ-3 | 3%/3% | 4-Methyl-2-pentanol |
| A-27 | X27 | TM-1 | TM-3 | — | 60/40 | 15,000 | 1.8 | TQ-15 | 7% | 4-Methyl-2-pentanol |
| A-28 | X10 | TM-1 | TM-5 | TM-11 | 60/30/10 | 19,000 | 1.7 | TQ-7 | 25% | 4-Methyl-2-pentanol |
| A-29 | X10 | TM-1 | TM-5 | TM-11 | 60/30/10 | 19,000 | 1.7 | TQ-7 | 20% | 4-Methyl-2-pentanol |
| A-30 | X10 | TM-1 | TM-5 | TM-11 | 60/30/10 | 19,000 | 1.7 | TQ-7 | 15% | 4-Methyl-2-pentanol |
| A-31 | X10 | TM-1 | TM-5 | TM-11 | 40/40/20 | 8,000 | 1.6 | TQ-7/TQ-22 | 12%/2% | 4-Methyl-2-pentanol/dibutyl ethyl (70/30) |

TABLE 4-continued

| | | | | | (Composition for forming a protective film) | | | | | |
|---|---|---|---|---|---|---|---|---|---|---|
| A-32 | X10 | TM-1 | TM-5 | TM-11 | 40/40/20 | 8,000 | 1.8 | TQ-7/<br>TQ-23 | 12%/<br>1% | 4-Methyl-<br>2-pentanol/<br>n-decane<br>(90/10) |
| A-33 | X10 | TM-1 | TM-5 | TM-11 | 40/40/20 | 9,000 | 1.7 | TQ-7/<br>TQ-24 | 12%/<br>1% | 4-Methyl-<br>2-pentanol/<br>n-decane<br>(90/10) |
| A-34 | X10 | TM-1 | TM-5 | TM-11 | 40/40/20 | 8,000 | 1.7 | TQ-7/<br>TQ-25 | 12%/<br>1% | 4-Methyl-<br>2-pentanol/<br>n-decane<br>(90/10) |
| A-35 | X10 | TM-1 | TM-5 | TM-11 | 40/40/20 | 17,000 | 1.5 | TQ-2/<br>TQ-22 | 8%/<br>3% | 4-Methyl-<br>2-pentanol/<br>dibutyl<br>ethyl<br>(80/20) |
| A-36 | X10 | TM-1 | TM-5 | TM-11 | 40/40/20 | 6,000 | 1.7 | TQ-17/<br>TQ-13 | 6%/<br>6% | 4-Methyl-<br>2-pentanol |
| A-37 | X2 | TM-1 | TM-6 | — | 60/40 | 18,000 | 1.8 | — | — | 4-Methyl-<br>2-pentanol |
| A-38 | X2 | TM-1 | TM-6 | — | 60/40 | 18,000 | 1.8 | TQ-22 | 6% | 4-Methyl-<br>2-pentanol |

The abbreviations to be used in the tables are as follows.
<Compound (A)>
As the compound (A), the following compounds TQ-1 to TQ-25 were used. Further, the compound TQ-22 was a comparative compound.

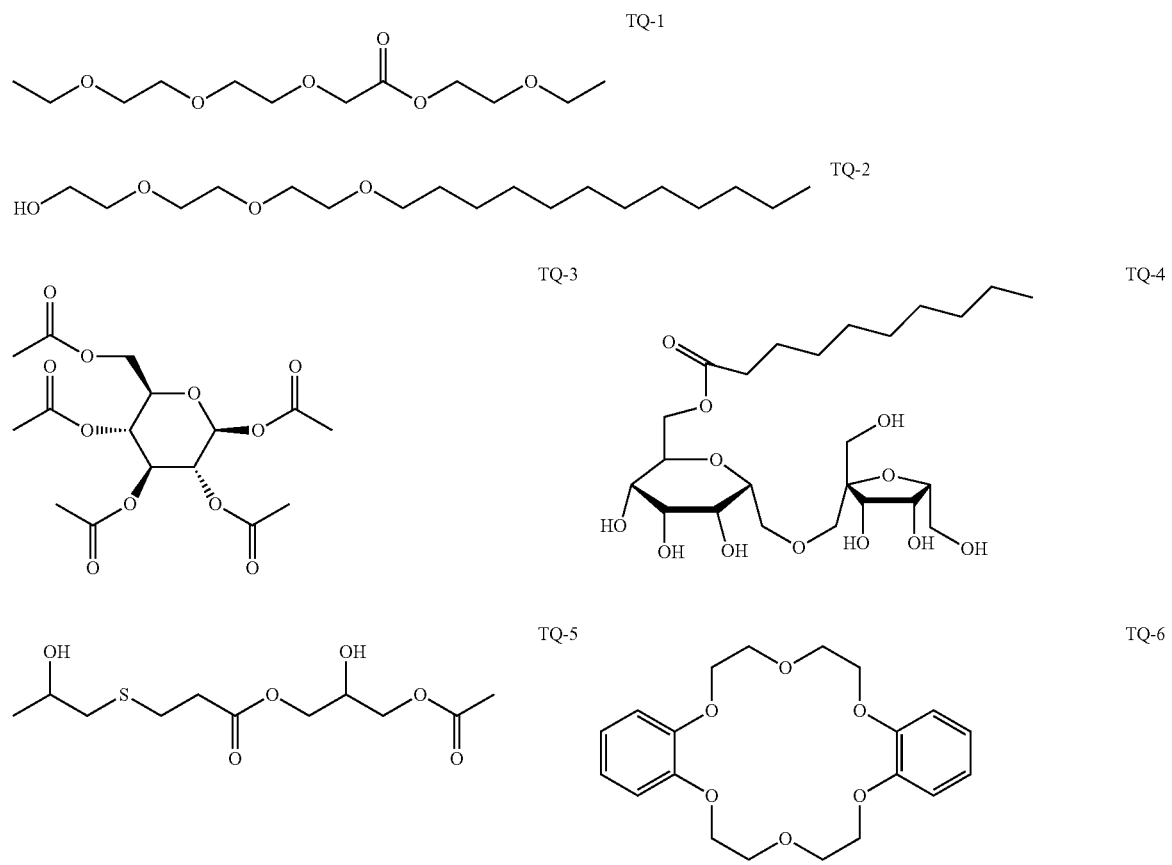

-continued
TQ-7
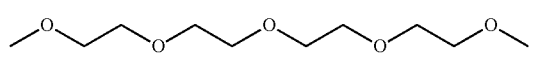
TQ-8
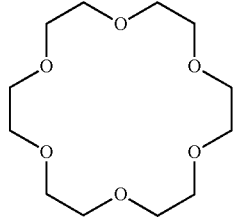
TQ-9
TQ-10
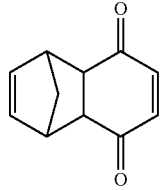
TQ-11
TQ-12
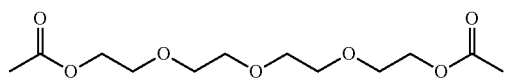
TQ-13
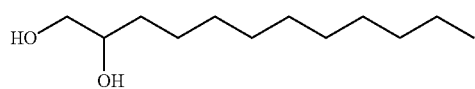
TQ-14
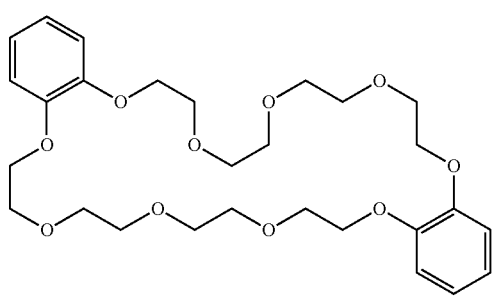
TQ-15
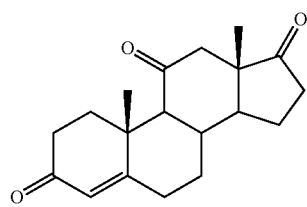
TQ-16
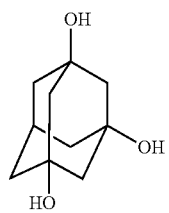
TQ-17
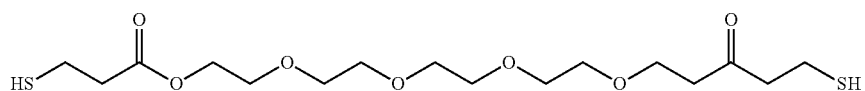
TQ-18
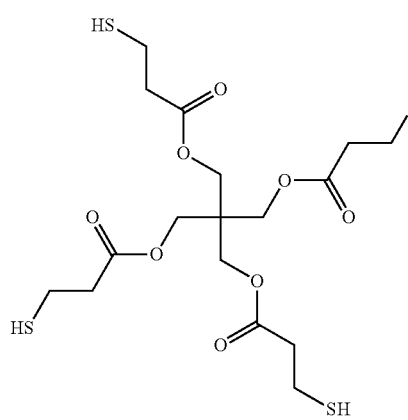
TQ-19
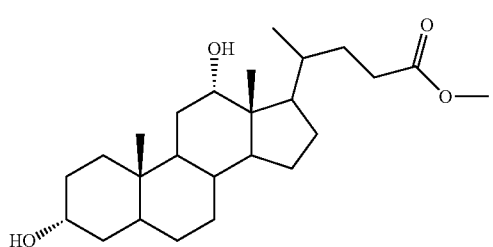

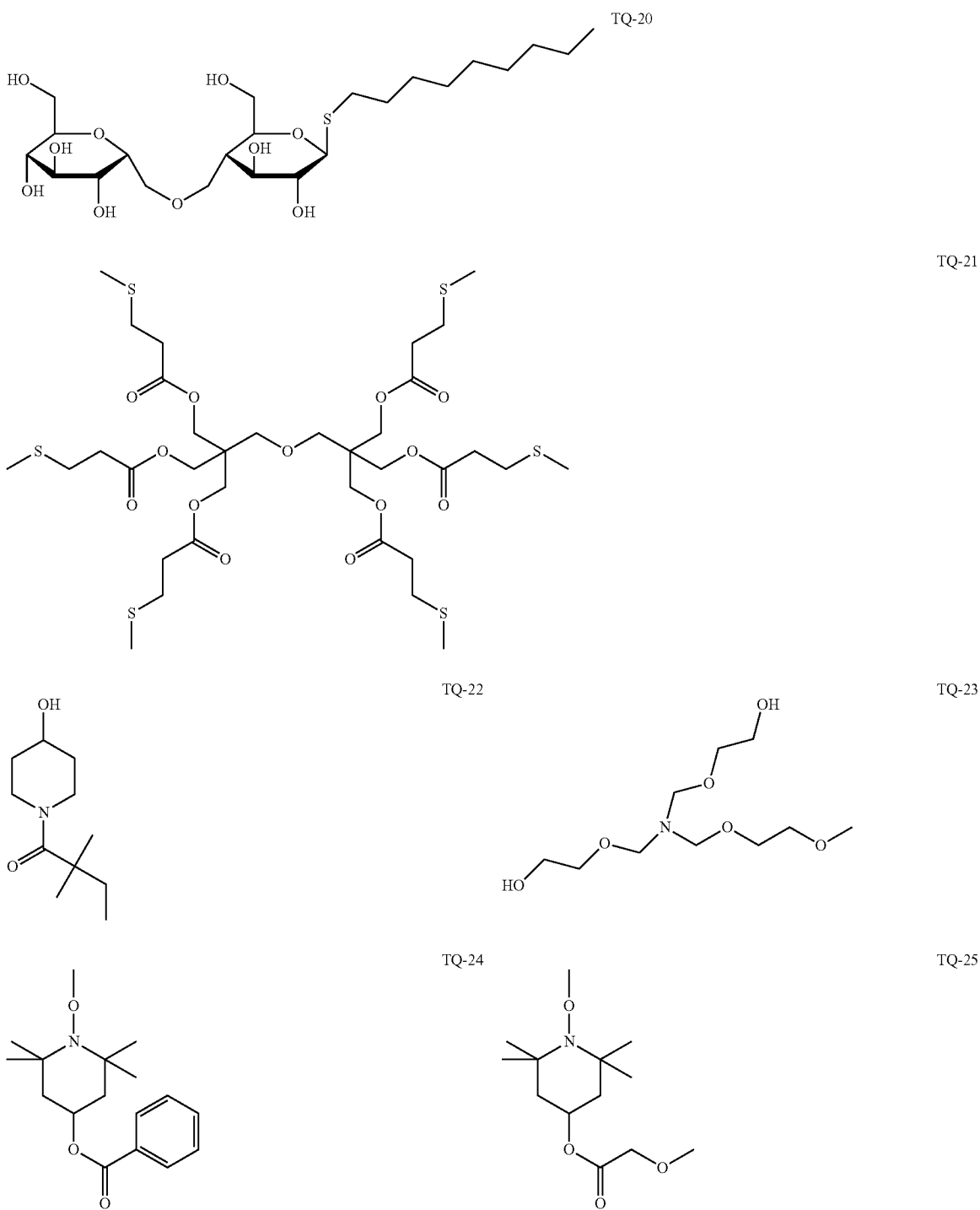
<Resin (X)>
The respective repeating units included in the resins X1 to X27 are as follows. Further, the compositional ratios (molar ratios), the weight-average molecular weights (Mw), and the dispersities (Mw/Mn) of the respective repeating units in the resins X1 to X27 were determined by the same methods as for the resin (I) as described above.

(TM-2) 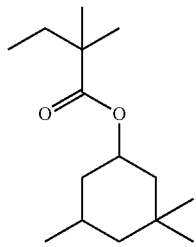
(TM-3) 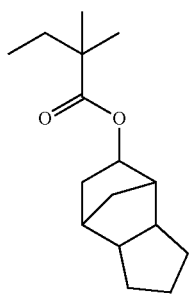
(TM-4) 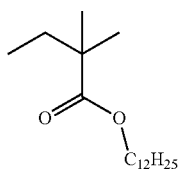
(TM-5) 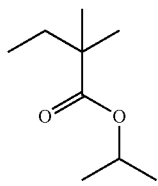
(TM-6) 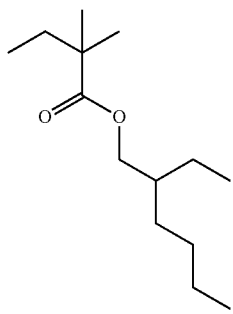
(TM-7) 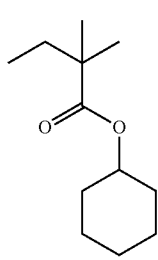
(TM-8) 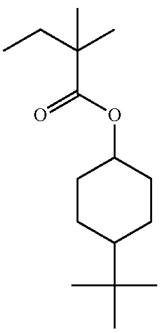
(TM-9) 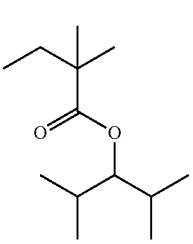
(TM-10) 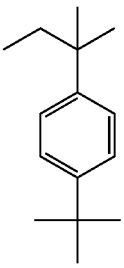
(TM-11) 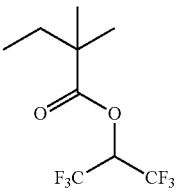
(TM-12) 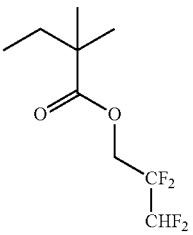
(TM-13) 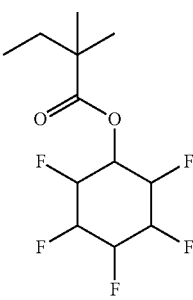

[Formation of Hole Pattern]

ARC29SR (manufactured by Brewer Science, Inc.) for forming an organic antireflection film was coated on a silicon wafer, and baking was carried out at 205° C. for 60 seconds to form an antireflection film having a film thickness of 86 nm. An actinic ray-sensitive or radiation-sensitive resin composition was coated thereon, and baking (Prebake: PB) was carried out at 100° C. for 60 seconds to form a resist film having a film thickness described in Table 5. Furthermore, the composition for forming a protective film was coated thereon, and baking was carried out at the temperature described in Table 5 for 60 seconds to form a protective film having the film thickness described in Table 5.

The obtained wafer was subjected to pattern exposure via a squarely arrayed halftone mask with hole portions of 65 nm and pitches between holes of 100 nm, using an ArF excimer laser liquid immersion scanner (manufactured by ASML; XT1700i, NA1.20, C-Quad, outer sigma 0.730, inner sigma 0.630, and XY inclination). Ultrapure water was used as the immersion liquid. Thereafter, heating (Post Exposure Bake: PEB) was carried out at 105° C. for 60 seconds. Then, development was carried out by paddling for 30 seconds using a butyl acetate developer, and rinsing was carried out by paddling for 30 seconds using a rinsing liquid of 4-methyl-2-pentanol (methyl isobutyl carbinol: MIBC) (provided that for Example 13, the rinsing step was not carried out). Subsequently, a hole pattern with a hole diameter of 50 nm was obtained by rotating the wafer at a rotation speed of 2,000 rpm for 30 seconds.

[Formation of Line-and-Space Pattern]

ARC29SR (manufactured by Brewer Science, Inc.) for forming an organic antireflection film was coated on a silicon wafer, and baking was carried out at 205° C. for 60 seconds to form an antireflection film having a film thickness of 86 nm. An actinic ray-sensitive or radiation-sensitive resin composition was coated thereon, and baking (Prebake: PB) was carried out at 100° C. for 60 seconds to form a resist film having a film thickness described in Table 5. Furthermore, the composition for forming a protective film was coated thereon, and baking was carried out at the temperature described in Table 5 for 60 seconds to form a protective film having the film thickness described in Table 5.

The obtained wafer was subjected to pattern exposure via a halftone mask with space portions of 55 nm and pitches between holes of 110 nm, using an ArF excimer laser liquid immersion scanner (manufactured by ASML; XT1700i, NA1.20, Dipole, outer sigma 0.800, inner sigma 0.564, and Y inclination). Ultrapure water was used as the immersion liquid. Thereafter, heating (Post Exposure Bake: PEB) was carried out at 105° C. for 60 seconds. Then, development was carried out by paddling for 30 seconds using a butyl acetate developer, and rinsing was carried out by paddling for 30 seconds using a rinsing liquid of MIBC (provided that for Example 13, the rinsing step was not carried out). Subsequently, a line-and-space pattern with a line width of 50 nm was obtained by rotating the wafer at a rotation speed of 2,000 rpm for 30 seconds.

[Evaluation]

<Depth of Focus (DOF)>

In the exposure dose for forming a hole pattern with a hole diameter of 50 nm under the exposure and development conditions in "Formation of Hole Pattern" above, exposure and development were carried out by changing the conditions of the exposure focus at a unit of 20 nm in the focus direction. The hole diameter (Critical Dimension: CD) of each of the obtained patterns was measured using a line-width critical dimension scanning electron microscope SEM (S-9380, Hitachi, Ltd.), and the minimum value or the maximum value in a curve obtained by plotting the respective CDs was defined as a best focus. When the focus was changed at a center of the best focus, a variation width of the focus with which a line width of 50 nm±10% was available, that is, depth of focus (DOF) (nm) was calculated. The evaluation results are shown in Table 5.

<Method for Evaluating Line Edge Roughness (LER)>

At an exposure dose for forming a line pattern having a line width of 50 nm under the exposure and development conditions in "Formation of Line-and-Space Pattern" above, the 50 nm line pattern was observed for the measurement of line edge roughness, using a critical dimension scanning electron microscope (SEM), and the line width was measured at 50 points in the range of an edge of 5 μm in the longitudinal direction of the line pattern by a critical dimension SEM, and the standard deviation for the measured deviation was determined to calculate 3a (nm). A smaller value thereof indicates better performance. The evaluation results are shown in Table 5.

<Exposure Latitude (EL)>

At an exposure dose for forming a space pattern having a pitch of 200 nm and a space width of 50 nm, under the exposure and development conditions in [Formation of Line-and-Space Pattern], exposure and development were carried out by changing the exposure dose. The space line width (Critical Dimension: CD) of each of the obtained patterns was measured using a line-width critical dimension scanning electron microscope SEM (S-9380, Hitachi, Ltd.), and the minimum value or the maximum value in a curve obtained by plotting the respective CDs was defined as an optimal exposure dose. When the exposure dose focus was changed at a center of the optimal exposure dose, a variation width of the exposure dose with which a line width of 50 nm±10% was available was determined and expressed in a percentage. A higher value thereof indicates a smaller change in performance due to a change in the optimal exposure dose and the exposure latitude is better.

TABLE 5

| | Resist composition | Resist film thickness (nm) | Composition for forming protective film | Film thickness (nm) of protective film | PB temperature (° C.) after forming protective film | DOF (nm) | LER (nm) | EL (%) |
| --- | --- | --- | --- | --- | --- | --- | --- | --- |
| Example 1 | Re-1 | 90 | A-1 | 90 | 120 | 120 | 2.4 | 19.2 |
| Example 2 | Re-2 | 90 | A-2 | 60 | 120 | 120 | 2.4 | 19.4 |
| Example 3 | Re-3 | 90 | A-3 | 70 | 120 | 100 | 2.4 | 19.5 |
| Example 4 | Re-4 | 90 | A-4 | 30 | 120 | 100 | 2.3 | 19.6 |
| Example 5 | Re-5 | 90 | A-5 | 60 | 120 | 80 | 2.4 | 19.4 |
| Example 6 | Re-6 | 90 | A-6 | 50 | 120 | 100 | 2.3 | 19.5 |
| Example 7 | Re-7 | 90 | A-7 | 70 | 120 | 100 | 2.4 | 19.6 |
| Example 8 | Re-8 | 90 | A-8 | 50 | 120 | 100 | 2.4 | 19.5 |
| Example 9 | Re-9 | 90 | A-9 | 100 | 120 | 120 | 2.3 | 19.1 |

TABLE 5-continued

| | Resist composition | Resist film thickness (nm) | Composition for forming protective film | Film thickness (nm) of protective film | PB temperature (° C.) after forming protective film | DOF (nm) | LER (nm) | EL (%) |
|---|---|---|---|---|---|---|---|---|
| Example 10 | Re-10 | 90 | A-10 | 90 | 120 | 120 | 2.4 | 19.2 |
| Example 11 | Re-11 | 90 | A-11 | 60 | 120 | 100 | 2.4 | 19.6 |
| Example 12 | Re-12 | 90 | A-12 | 70 | 120 | 120 | 2.3 | 19.7 |
| Example 13 | Re-13 | 90 | A-13 | 30 | 120 | 100 | 2.4 | 19.4 |
| Example 14 | Re-1 | 90 | A-14 | 60 | 120 | 100 | 2.4 | 19.6 |
| Example 15 | Re-2 | 90 | A-15 | 50 | 120 | 120 | 2.4 | 19.6 |
| Example 16 | Re-3 | 85 | A-16 | 70 | 120 | 100 | 2.4 | 19.4 |
| Example 17 | Re-4 | 70 | A-17 | 50 | 120 | 80 | 2.3 | 19.5 |
| Example 18 | Re-5 | 75 | A-18 | 100 | 120 | 100 | 2.4 | 19.6 |
| Example 19 | Re-6 | 100 | A-19 | 90 | 120 | 80 | 2.4 | 19.5 |
| Example 20 | Re-7 | 90 | A-20 | 60 | 120 | 120 | 2.3 | 19.1 |
| Example 21 | Re-8 | 90 | A-21 | 70 | 120 | 100 | 2.4 | 19.6 |
| Example 22 | Re-9 | 90 | A-22 | 30 | 120 | 120 | 2.3 | 19.4 |
| Example 23 | Re-10 | 90 | A-23 | 60 | 120 | 100 | 2.4 | 19.5 |
| Example 24 | Re-11 | 90 | A-24 | 50 | 120 | 100 | 2.4 | 19.6 |
| Example 25 | Re-12 | 90 | A-25 | 70 | 120 | 120 | 2.4 | 19.5 |
| Example 26 | Re-13 | 90 | A-26 | 50 | 120 | 100 | 2.4 | 19.1 |
| Example 27 | Re-1 | 90 | A-27 | 100 | 120 | 100 | 2.4 | 19.1 |
| Example 28 | Re-1 | 90 | A-28 | 90 | 120 | 120 | 2.3 | 19.5 |
| Example 29 | Re-1 | 90 | A-29 | 60 | 120 | 100 | 2.4 | 19.6 |
| Example 30 | Re-1 | 90 | A-30 | 70 | 120 | 120 | 2.4 | 19.5 |
| Example 31 | Re-2 | 90 | A-2 | 60 | 90 | 80 | 2.5 | 18.9 |
| Example 32 | Re-2 | 90 | A-2 | 60 | 100 | 90 | 2.5 | 19.2 |
| Example 33 | Re-2 | 90 | A-2 | 60 | 110 | 100 | 2.4 | 19.3 |
| Example 34 | Re-2 | 90 | A-31 | 30 | 120 | 100 | 2.4 | 19.6 |
| Example 35 | Re-2 | 90 | A-32 | 60 | 120 | 120 | 2.3 | 19.7 |
| Example 36 | Re-2 | 90 | A-33 | 90 | 120 | 100 | 2.4 | 19.4 |
| Example 37 | Re-2 | 90 | A-34 | 90 | 120 | 120 | 2.4 | 19.7 |
| Example 38 | Re-2 | 90 | A-35 | 90 | 120 | 120 | 2.4 | 19.6 |
| Example 39 | Re-2 | 90 | A-36 | 90 | 120 | 100 | 2.4 | 19.4 |
| Example 40 | Re-2 | 90 | A-36 | 30 | 120 | 100 | 2.3 | 19.5 |
| Comparative Example 1 | Re-1 | 90 | A-37 | 70 | 120 | 60 | 2.7 | 17.4 |
| Comparative Example 2 | Re-1 | 90 | A-38 | 50 | 120 | 70 | 2.7 | 18.3 |

From the results shown in Table 5 above, it could be seen that the patterns obtained by the pattern forming method of the present invention, the depth of focus (DOF) and the exposure latitude (EL) are excellent, and further, the line edge roughness (LER) is suppressed.

What is claimed is:

1. A pattern forming method comprising:
   (a) coating an actinic ray-sensitive or radiation-sensitive resin composition onto a substrate to form an actinic ray-sensitive or radiation-sensitive film;
   (b) coating a composition for forming a protective film onto the actinic ray-sensitive or radiation-sensitive film to form a protective film;
   (c) exposing the actinic ray-sensitive or radiation-sensitive film covered with the protective film; and
   (d) developing the exposed actinic ray-sensitive or radiation-sensitive film using a developer containing an organic solvent,
   wherein the protective film contains a compound (A) including at least one group or bond selected from the group consisting of an ether bond, a thioether bond, a hydroxyl group, a thiol group, a carbonyl bond, and an ester bond, and a resin (X), provided that the compound (A) is not any one of a chained amide, a cyclic amide, an aromatic amine, a chained aliphatic amine, and a cyclic aliphatic amine, and the resin (X) does not have a group that decomposes by the action of an acid to generate a polar group.

2. The pattern forming method according to claim 1, wherein the molecular weight of the compound (A) is 3,000 or less.

3. The pattern forming method according to claim 1, wherein the compound (A) contains 8 or more carbon atoms.

4. The pattern forming method according to claim 1, wherein the content of the compound (A) with respect to the total solid content in the protective film is 0.1% to 30% by mass.

5. The pattern forming method according to claim 1, wherein the film thickness of the protective film is 10 to 300 nm.

6. The pattern forming method according to claim 1, wherein the compound (A) is a compound having at least one ether bond.

7. The pattern forming method according to claim 6, wherein the compound (A) is a compound having a structure represented by the following General Formula (1),

in the formula, $R_{11}$ represents an alkylene group which may have a substituent, n represents an integer of 2 or more, and

* represents a direct bond.

8. The pattern forming method according to claim 1, wherein the resin (X) has a content of fluorine atoms of 20% by mass or less.

9. The pattern forming method according to claim 1, further comprising heating the substrate covered with the actinic ray-sensitive or radiation-sensitive film and the protective film at 100° C. or higher after (b) forming a protective film and before (c) exposing the film.

10. The pattern forming method according to claim 1, wherein the compound (A) is a compound represented by the following General Formula (1-1),

 (1-1)

in the formula, $R_{11}$ represents an alkylene group which may have a substituent, $R_{12}$ and $R_{13}$ each independently represents an alkyl group, and m represents an integer of 1 or more.

11. The pattern forming method according to claim 1, wherein the compound (A) includes at least one group or bond selected from the group consisting of a thioether bond and a thiol group.

12. The pattern forming method according to claim 1, wherein the resin (X) has a content of fluorine atoms of 0% by mass.

13. A composition for forming a protective film, used for forming a protective film that covers an actinic ray-sensitive or radiation-sensitive film, which comprises a compound (A) having a structure represented by the following General Formula (1), and a resin (X), provided that the compound (A) is not any one of a chained amide, a cyclic amide, an aromatic amine, a chained aliphatic amine, and a cyclic aliphatic amine, and the resin (X) does not have a group that decomposes by the action of an acid to generate a polar group, wherein the resin (X) has a content of fluorine atoms of 0% by mass,

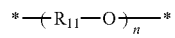 (1)

in the formula, $R_{11}$ represents an alkylene group which may have a substituent, n represents an integer of 2 or more, and

* represents a direct bond.

14. The composition for forming a protective film according to claim 13, wherein the compound (A) is a compound represented by the following General Formula (1-1),

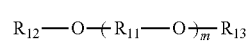 (1-1)

in the formula, $R_{11}$ represents an alkylene group which may have a substituent, $R_{12}$ and $R_{13}$ each independently represents an alkyl group, and m represents an integer of 1 or more.

15. A method for manufacturing an electronic device, comprising:

forming a pattern on a substrate by the pattern forming method according to claim 1; and etching the substrate by using the pattern as a mask.

* * * * *